United States Patent [19]
Yamauchi et al.

[11] Patent Number: 5,708,395
[45] Date of Patent: Jan. 13, 1998

[54] FREQUENCY MULTIPLYING DEVICE AND DIGITALLY-CONTROLLED OSCILLATOR

[75] Inventors: Shigenori Yamauchi, Nisshin; Takamoto Watanabe, Nagoya; Tadashi Shibata, Toyokawa; Yoshinori Fujihashi, Nukata-gun, all of Japan

[73] Assignee: Nippondenso Co., Ltd., Kariya, Japan

[21] Appl. No.: 800,236

[22] Filed: Feb. 12, 1997

Related U.S. Application Data

[63] Continuation of Ser. No. 621,607, Mar. 22, 1996.

[30] Foreign Application Priority Data

Mar. 23, 1995 [JP] Japan ......... 7-64252

[51] Int. Cl.$^6$ ......... H03L 7/085
[52] U.S. Cl. ......... 331/1 A; 331/25; 331/57; 327/107; 327/159
[58] Field of Search ......... 331/1 A, 14, 17, 331/25, 57; 327/105, 107, 155–159

[56] References Cited

U.S. PATENT DOCUMENTS

| | | | |
|---|---|---|---|
| 5,045,811 | 9/1991 | Lewis | 331/1 A |
| 5,128,624 | 7/1992 | Hoshino et al. | 328/133 |
| 5,331,294 | 7/1994 | Watanabe et al. | 331/57 |
| 5,416,444 | 5/1995 | Yamauchi et al. | 331/45 |
| 5,477,196 | 12/1995 | Yamauchi | 331/60 |
| 5,517,155 | 5/1996 | Yamauchi et al. | 331/57 X |
| 5,525,939 | 6/1996 | Yamauchi | 331/57 |

FOREIGN PATENT DOCUMENTS

| | | |
|---|---|---|
| 4-72816 | 3/1992 | Japan . |
| 6-061848 | 3/1994 | Japan . |

*Primary Examiner*—David Mis
*Attorney, Agent, or Firm*—Cushman, Darby & Cushman IP Group of Pillsbury, Madison & Sutro LLP

[57] ABSTRACT

A frequency multiplying device which multiplies the frequency of an externally-supplied reference signal PREF includes a digitally-controlled oscillation circuit, which includes a ring oscillator formed of thirty-two inverting circuits in a ring configuration which are adapted to generate sixteen clock signals having a period that is thirty-two times the inversion time of each inverting circuit and a phase interval that is twice the inverting circuit inversion time, and produces an output signal POUT having a period that corresponds to frequency control data CD at a resolution of the phase difference time of the clock signals, a counter/data-latch circuit which counts the clock signal RCK released by the ring oscillator within one period of the reference signal PREF and delivers the frequency control data CD of the count value to the digital oscillation circuit, and a control circuit which controls the operation of the circuits so that the oscillation output signal POUT having the frequency of the reference signal PREF multiplied by sixteen (32/2) is generated by the digital oscillation circuit.

10 Claims, 40 Drawing Sheets

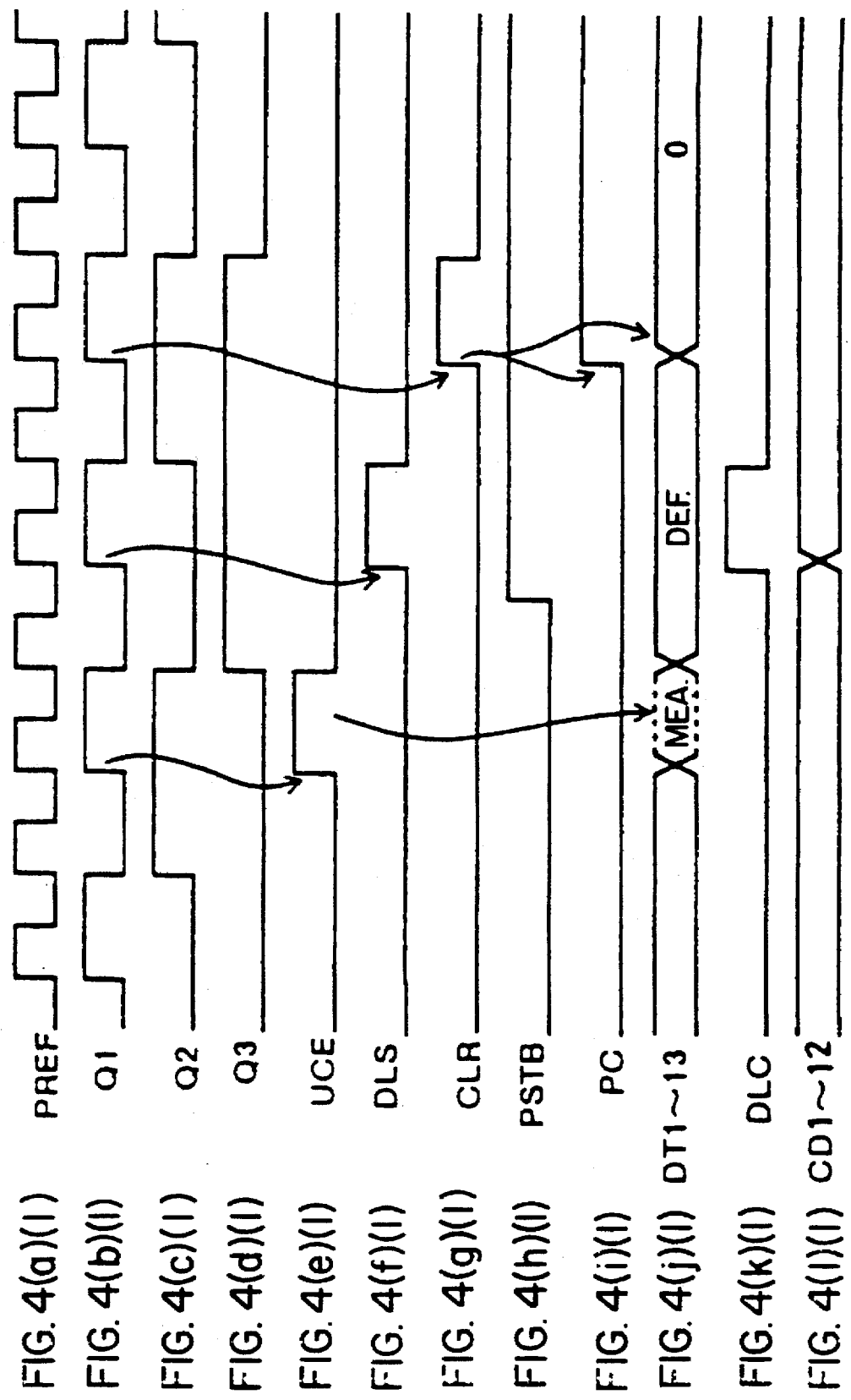

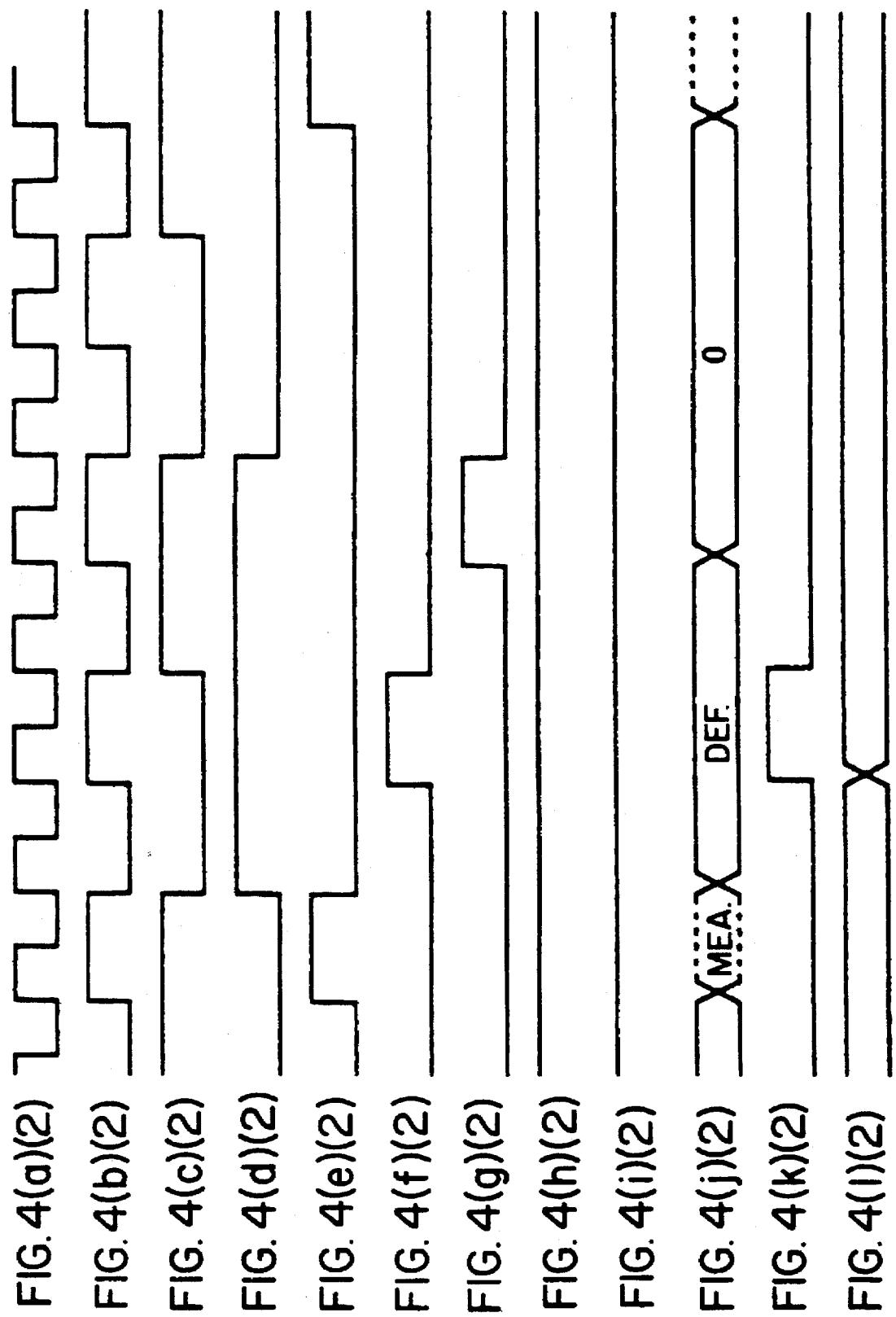

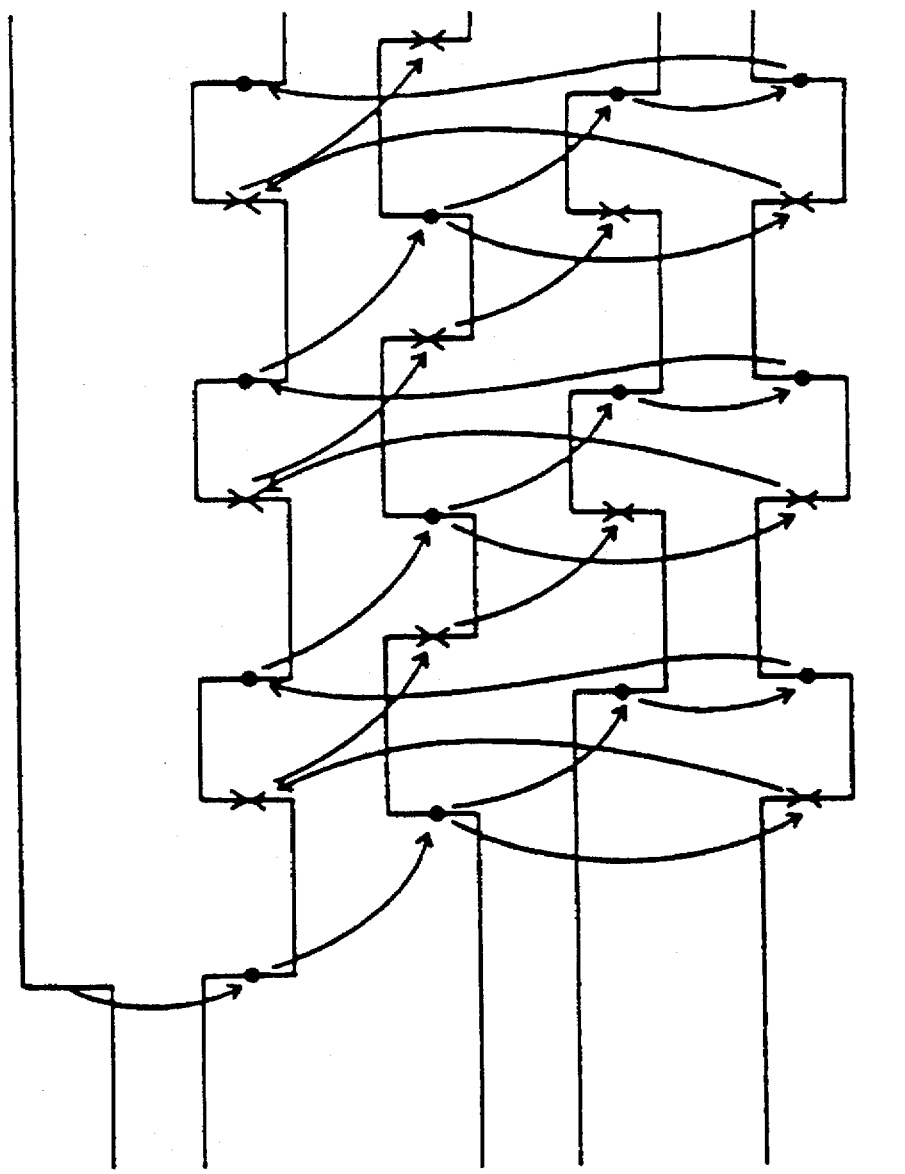
FIG. 7(a) PA
FIG. 7(b) P01
FIG. 7(c) P18 (R9)
FIG. 7(d) P31
FIG. 7(e) P32 (R16)

P1(R1~R8)

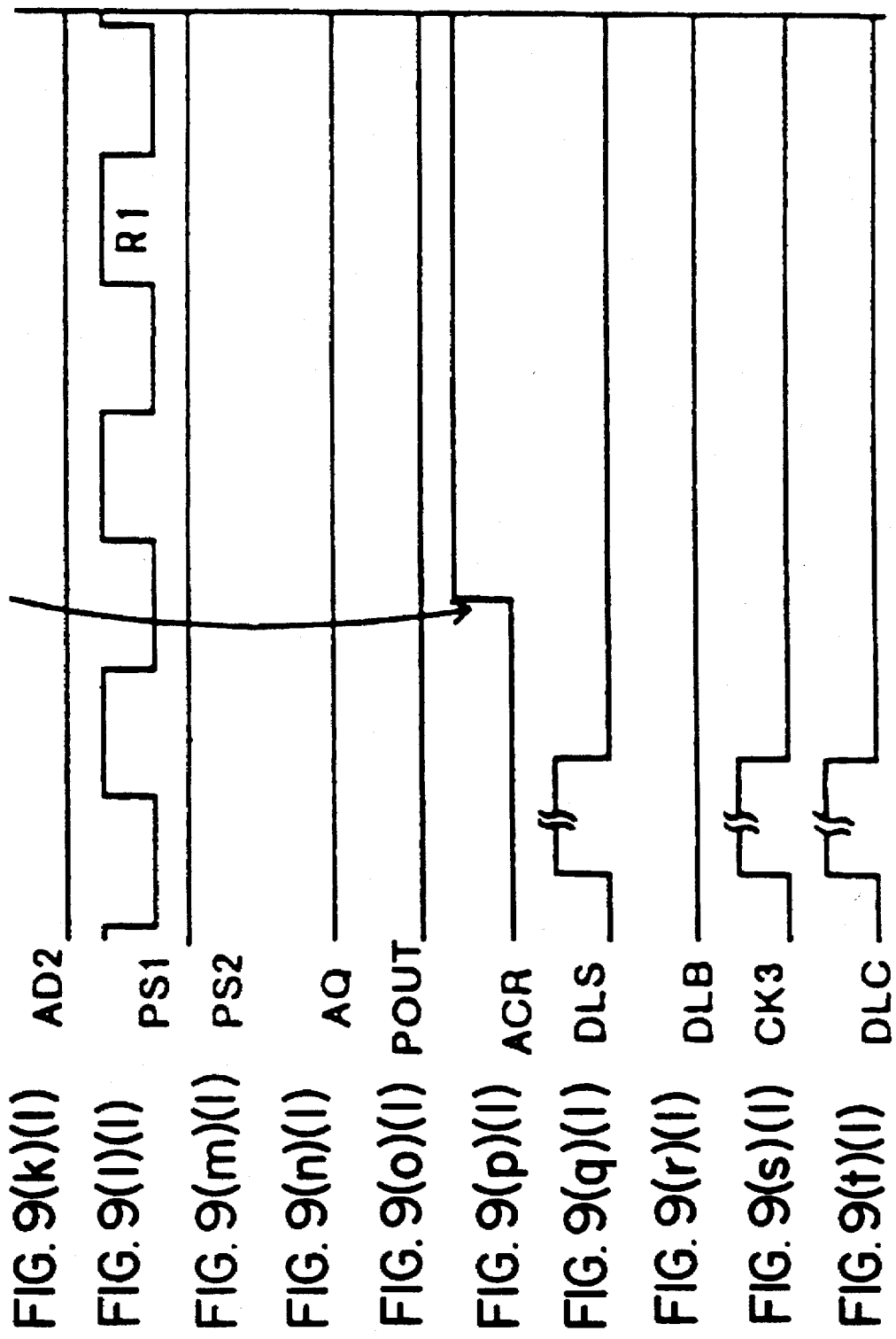

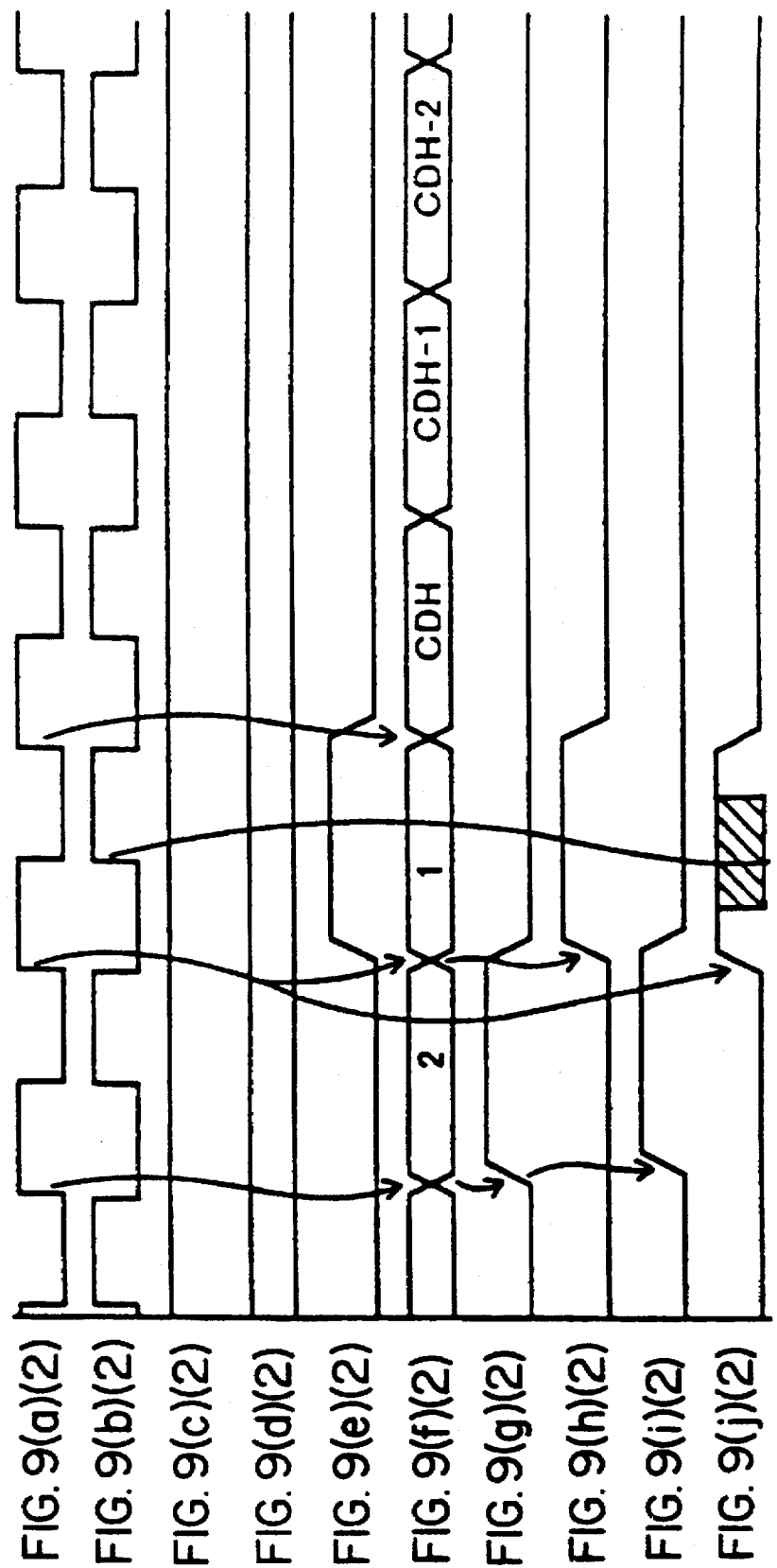

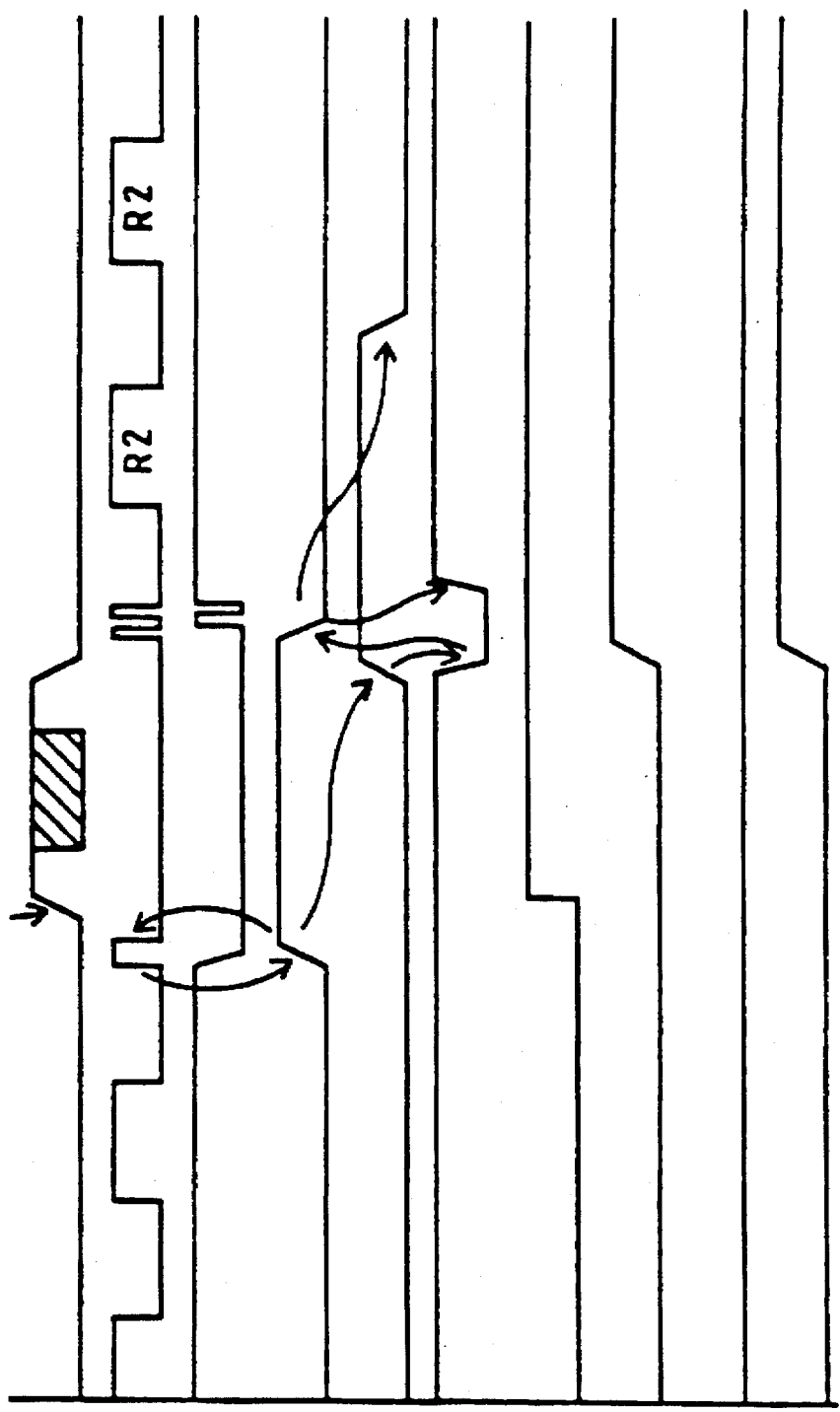

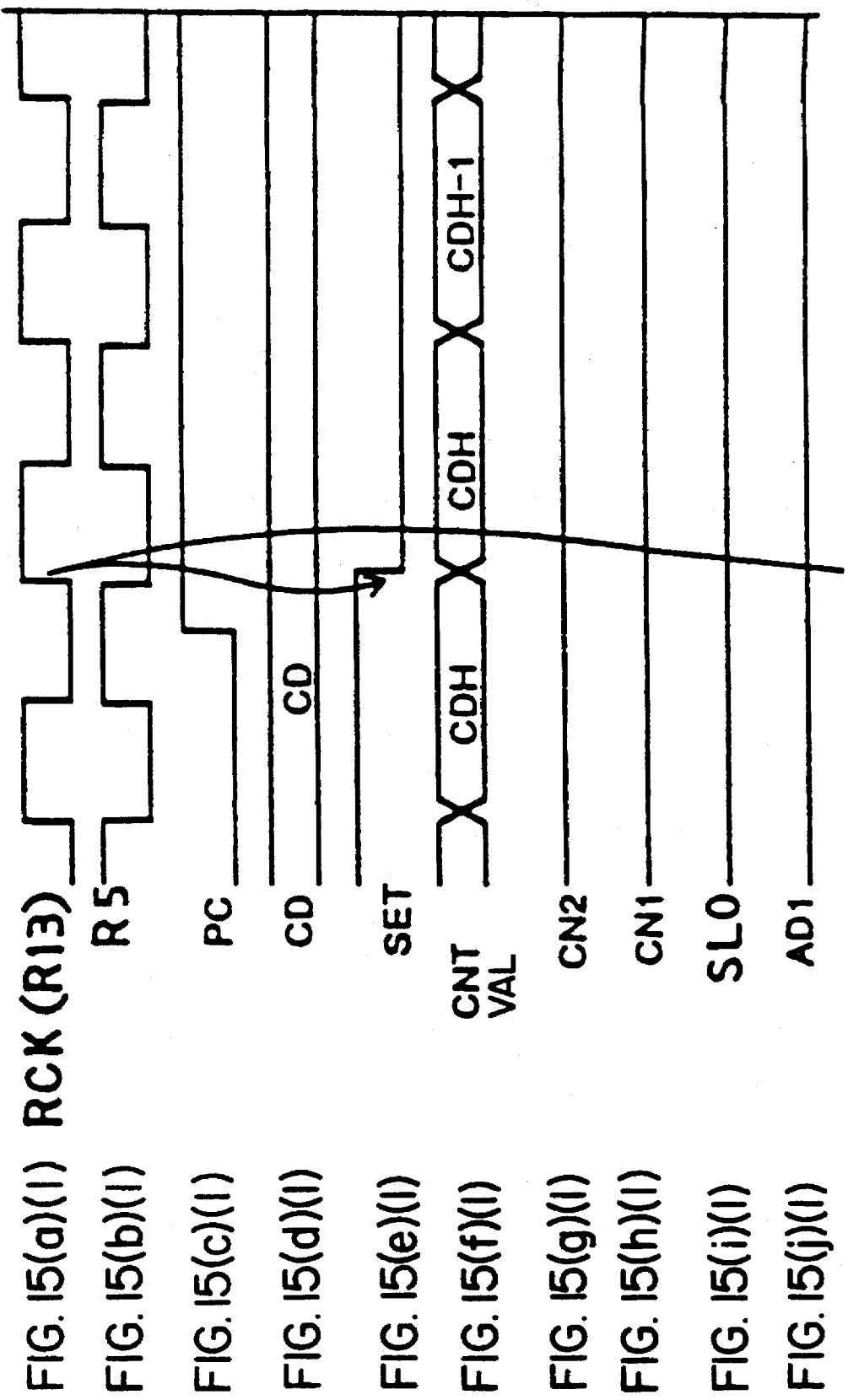

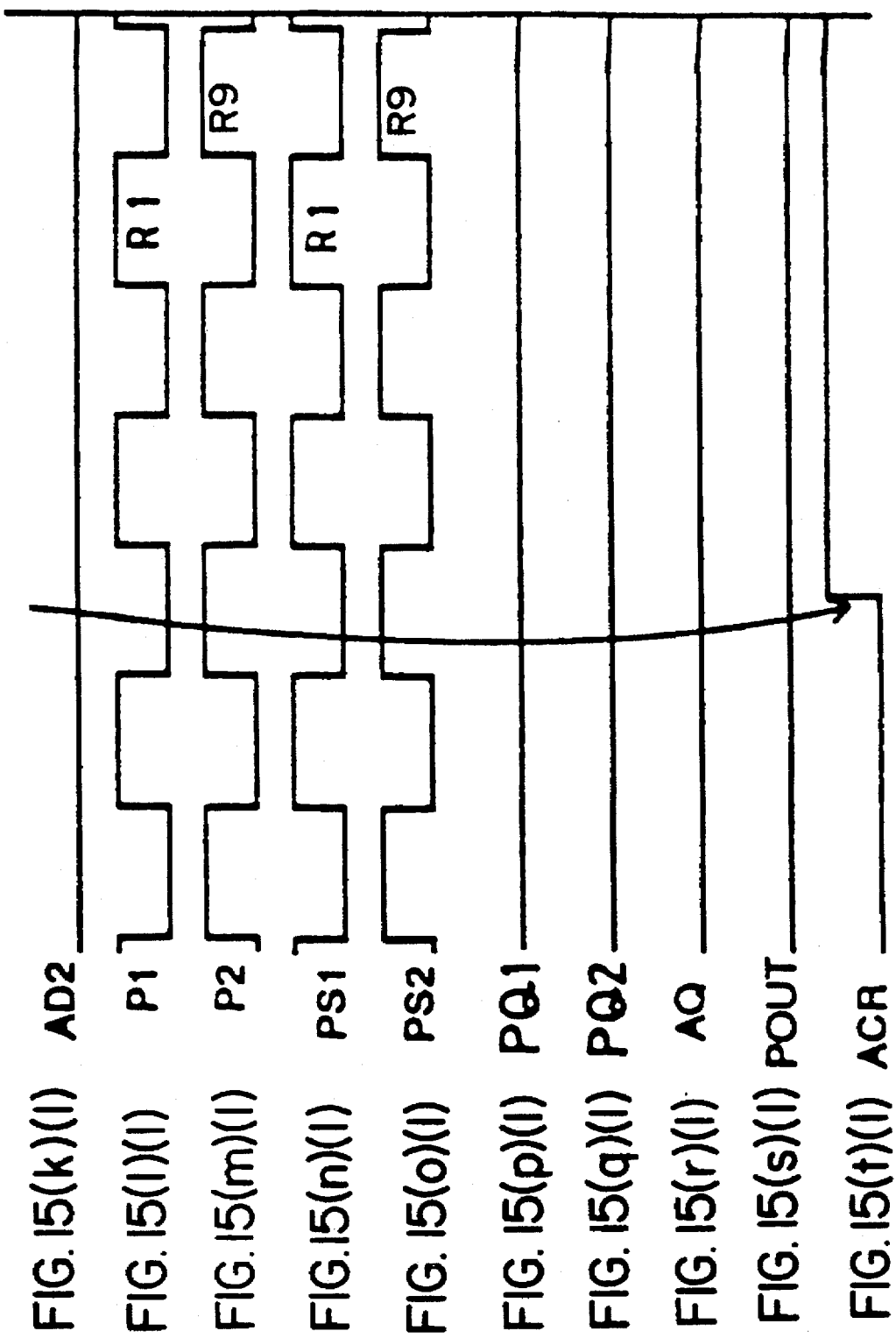

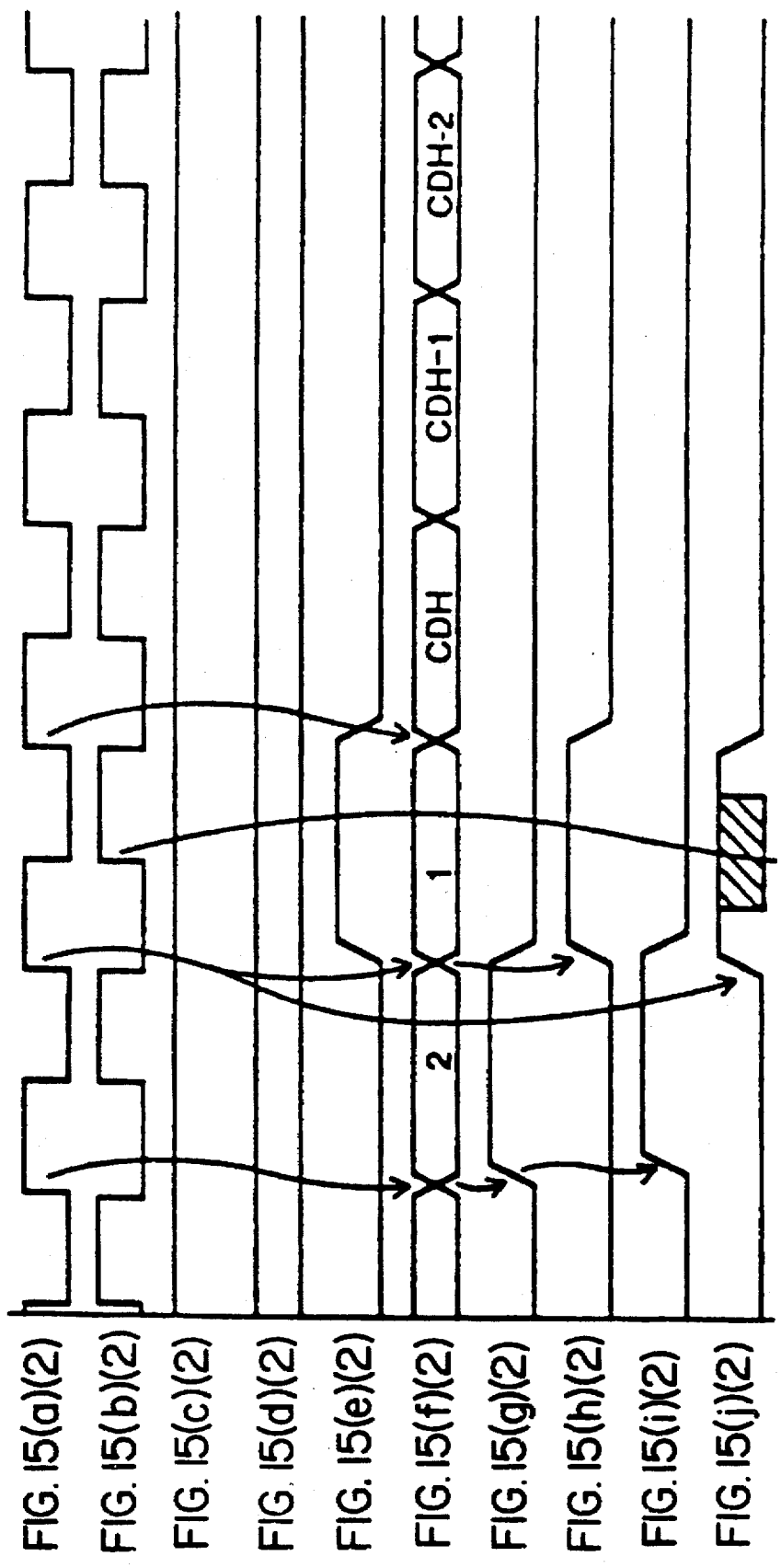

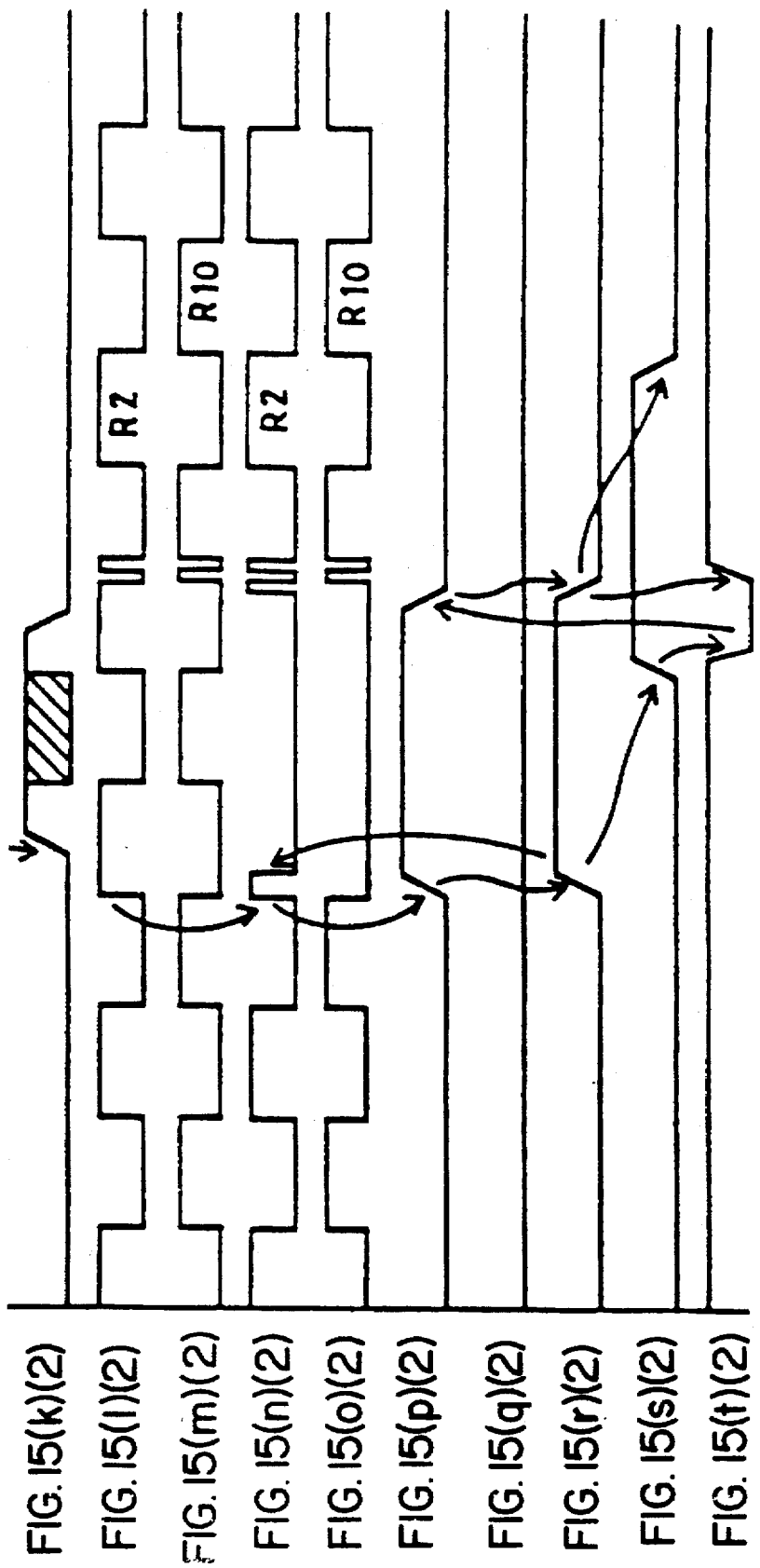

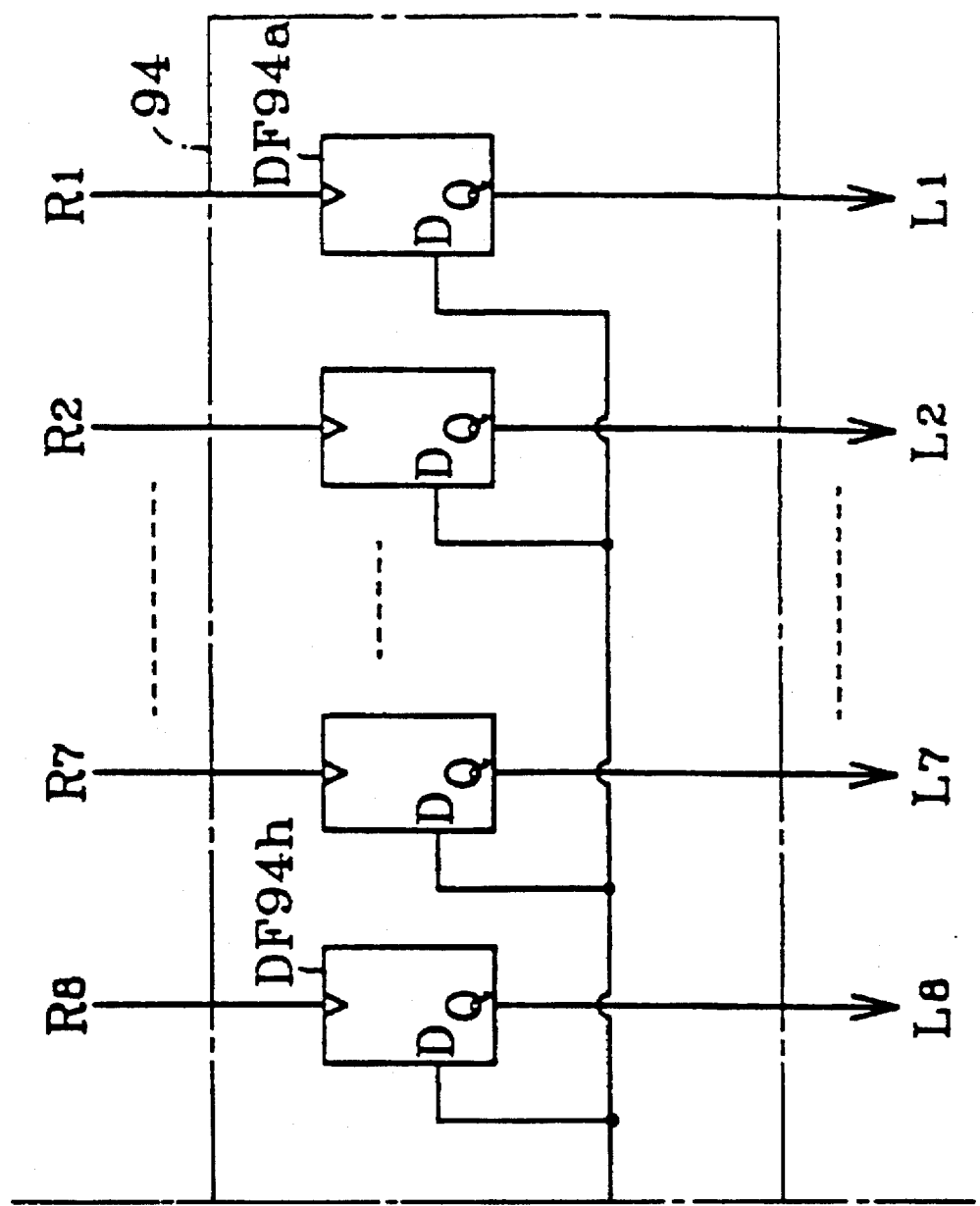

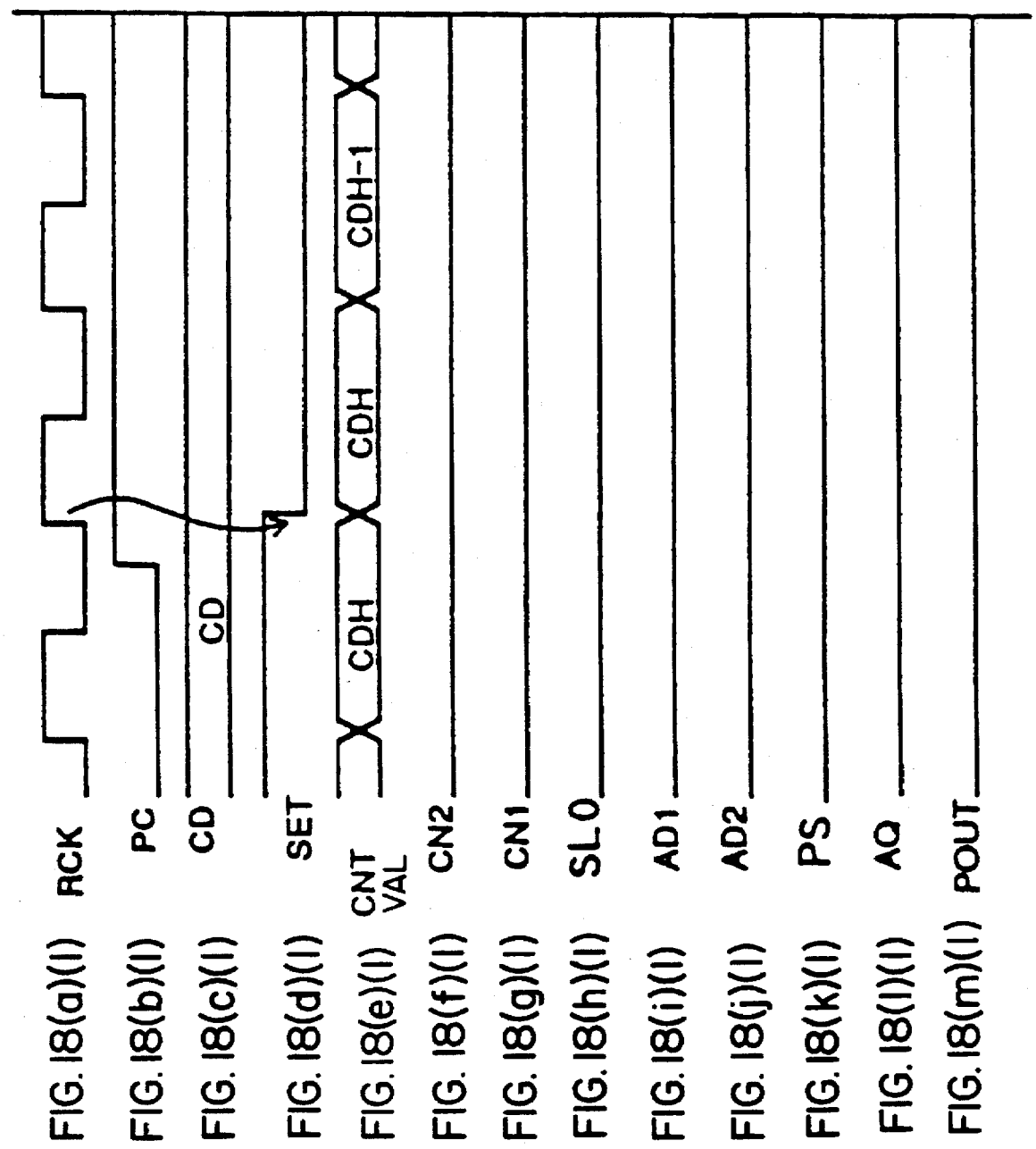

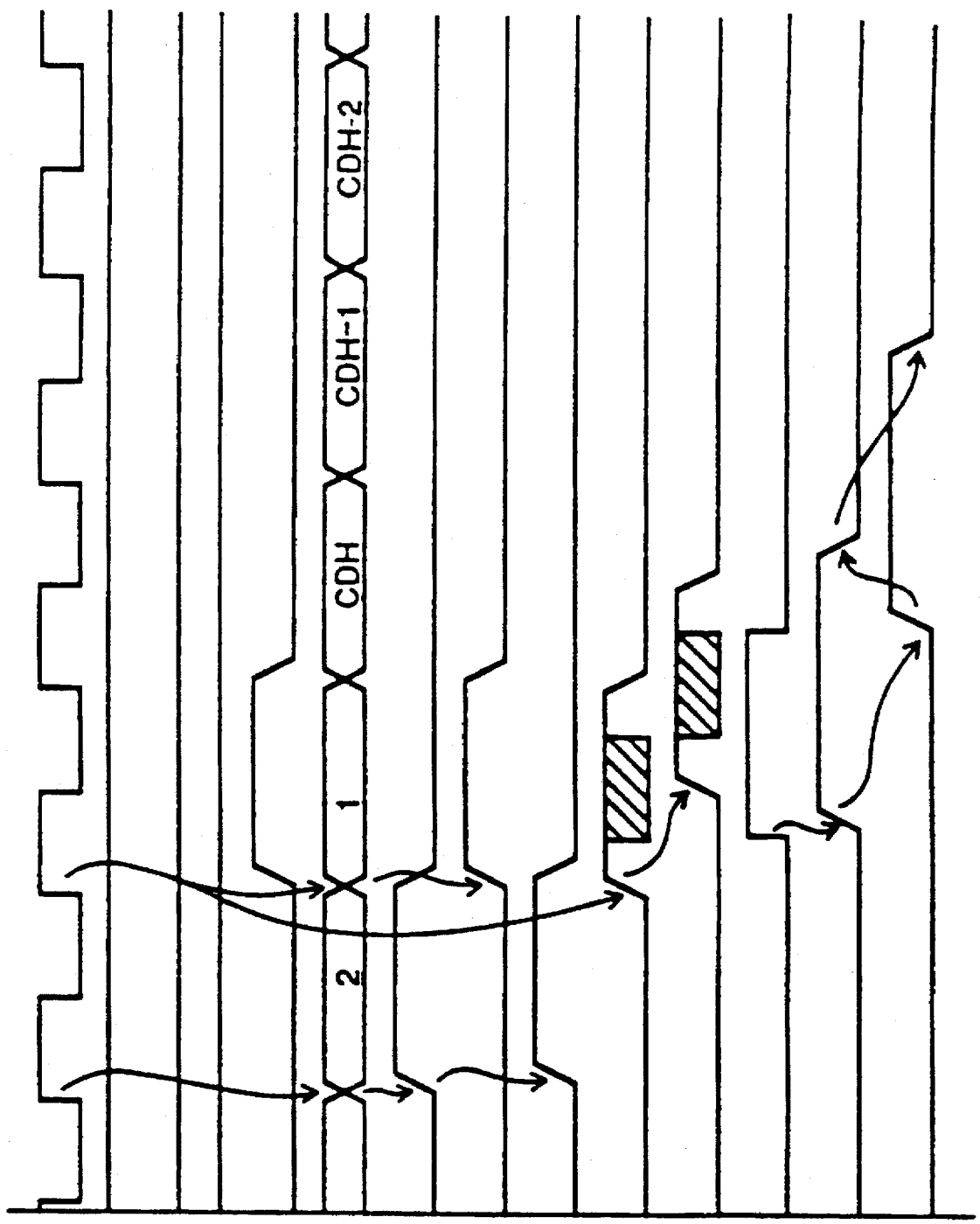

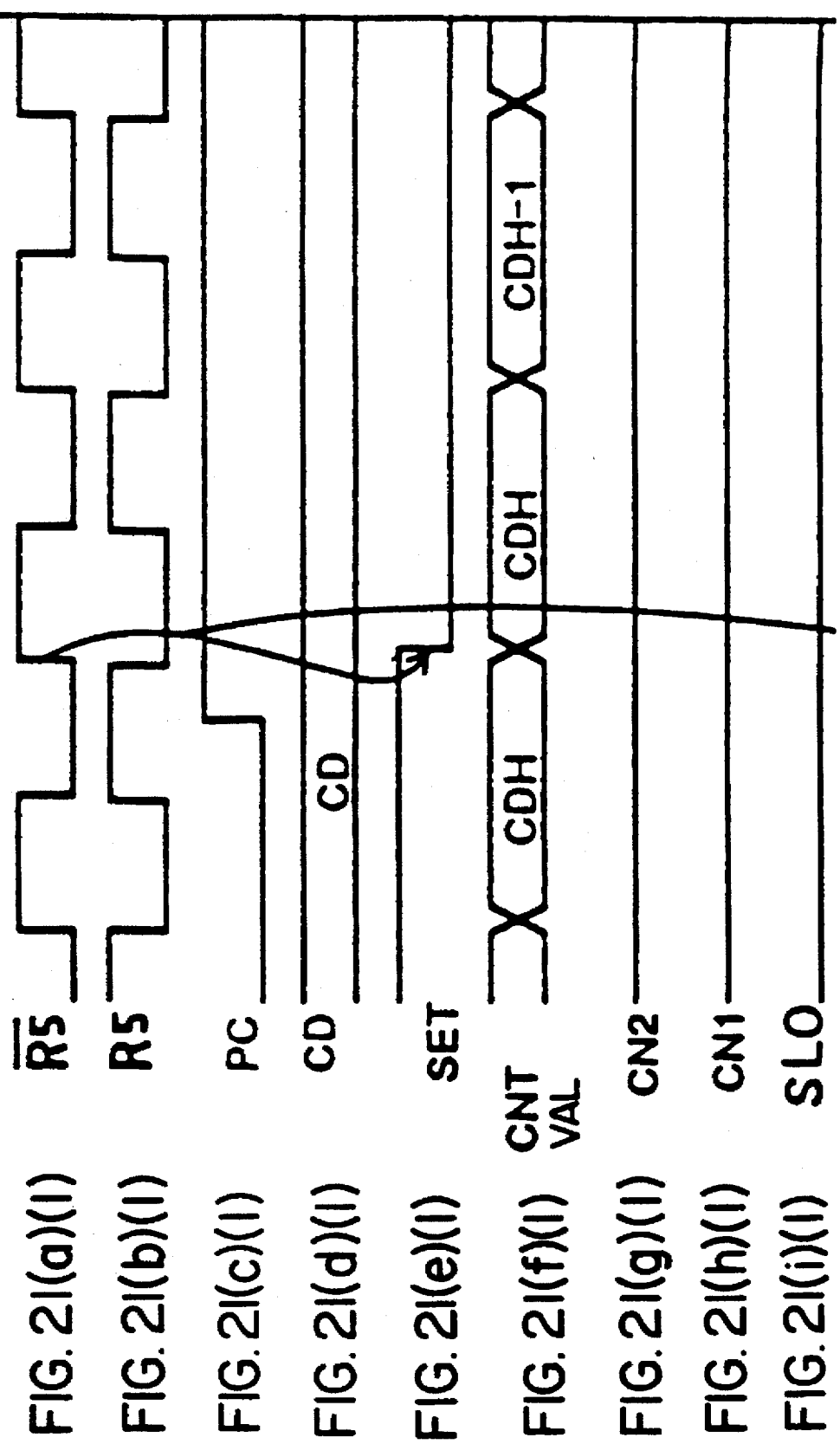

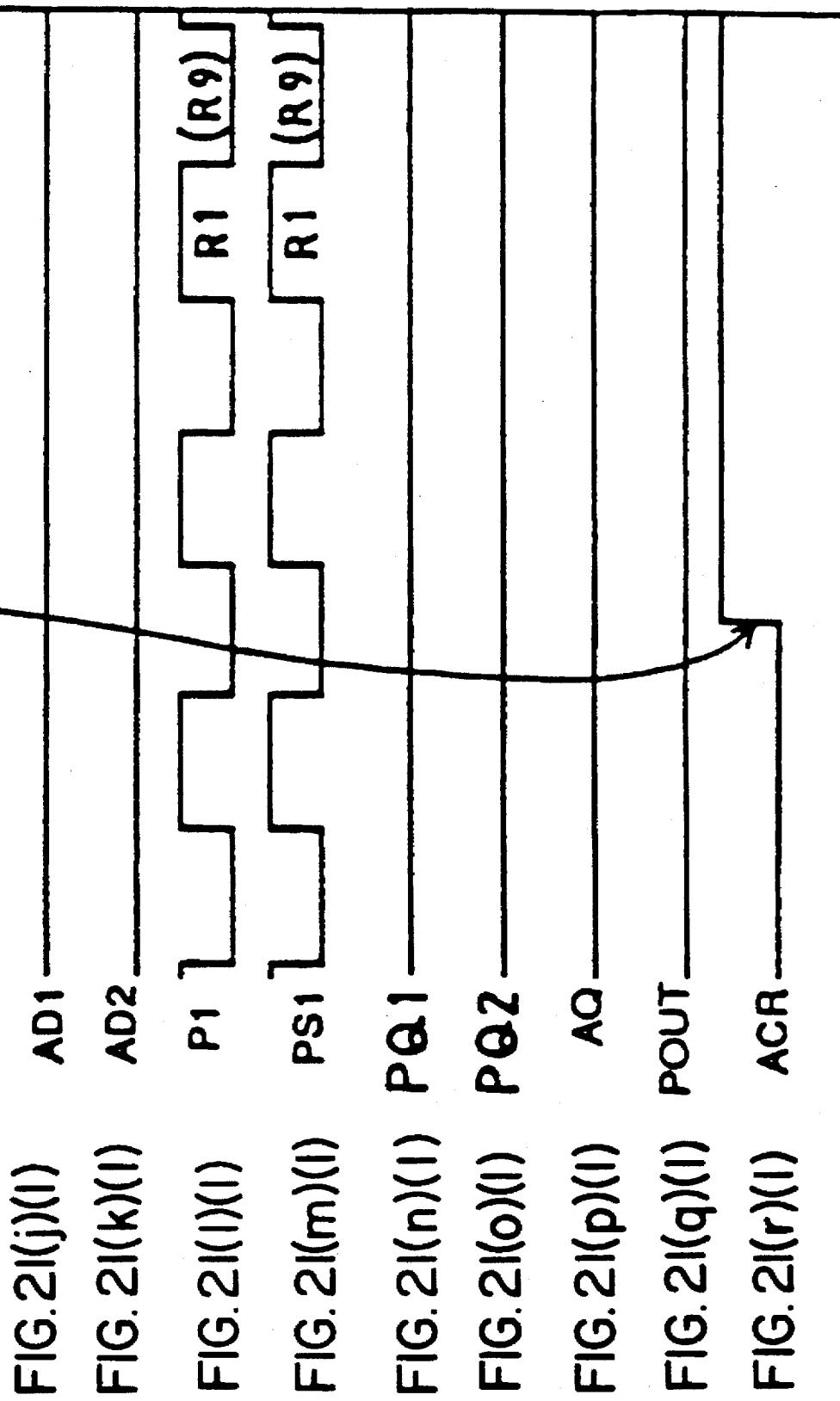

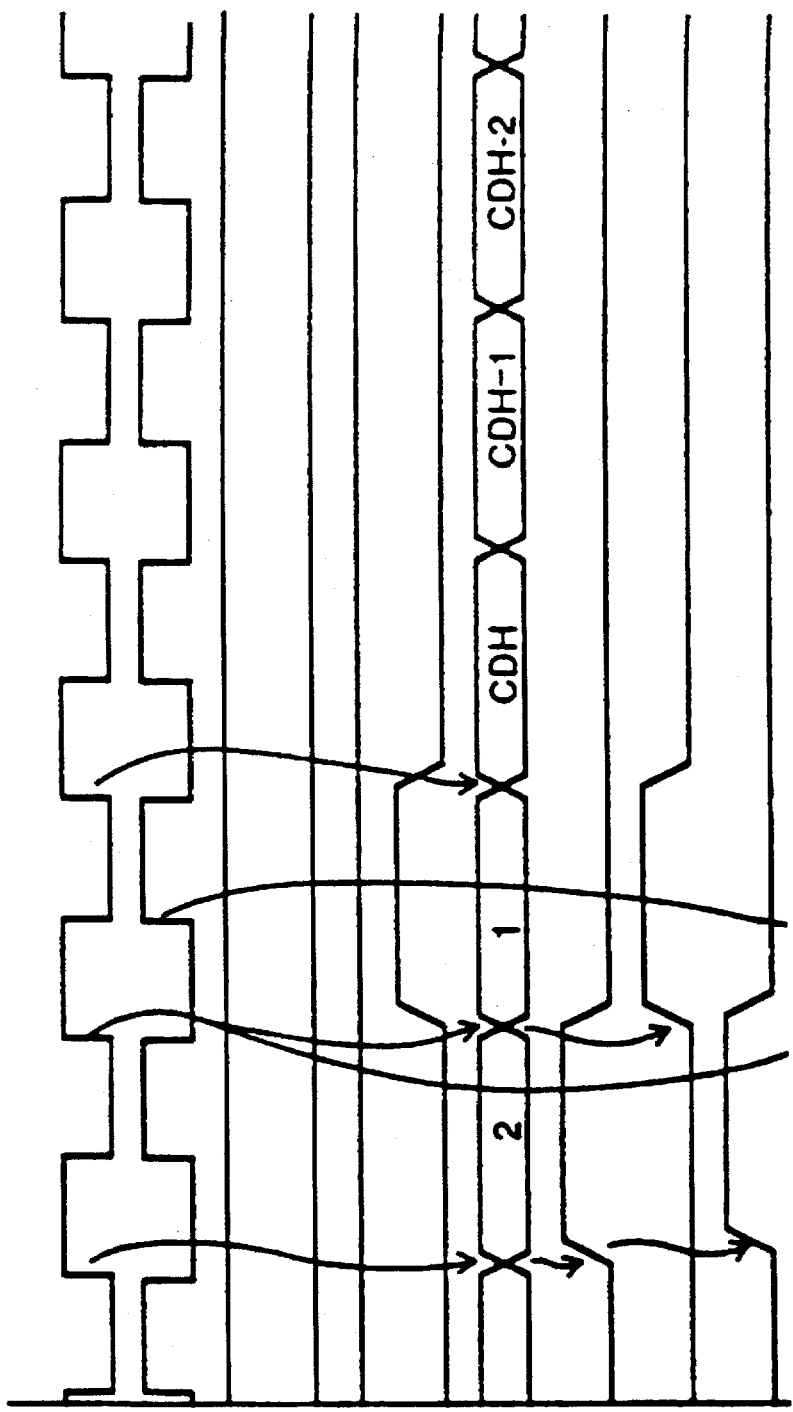

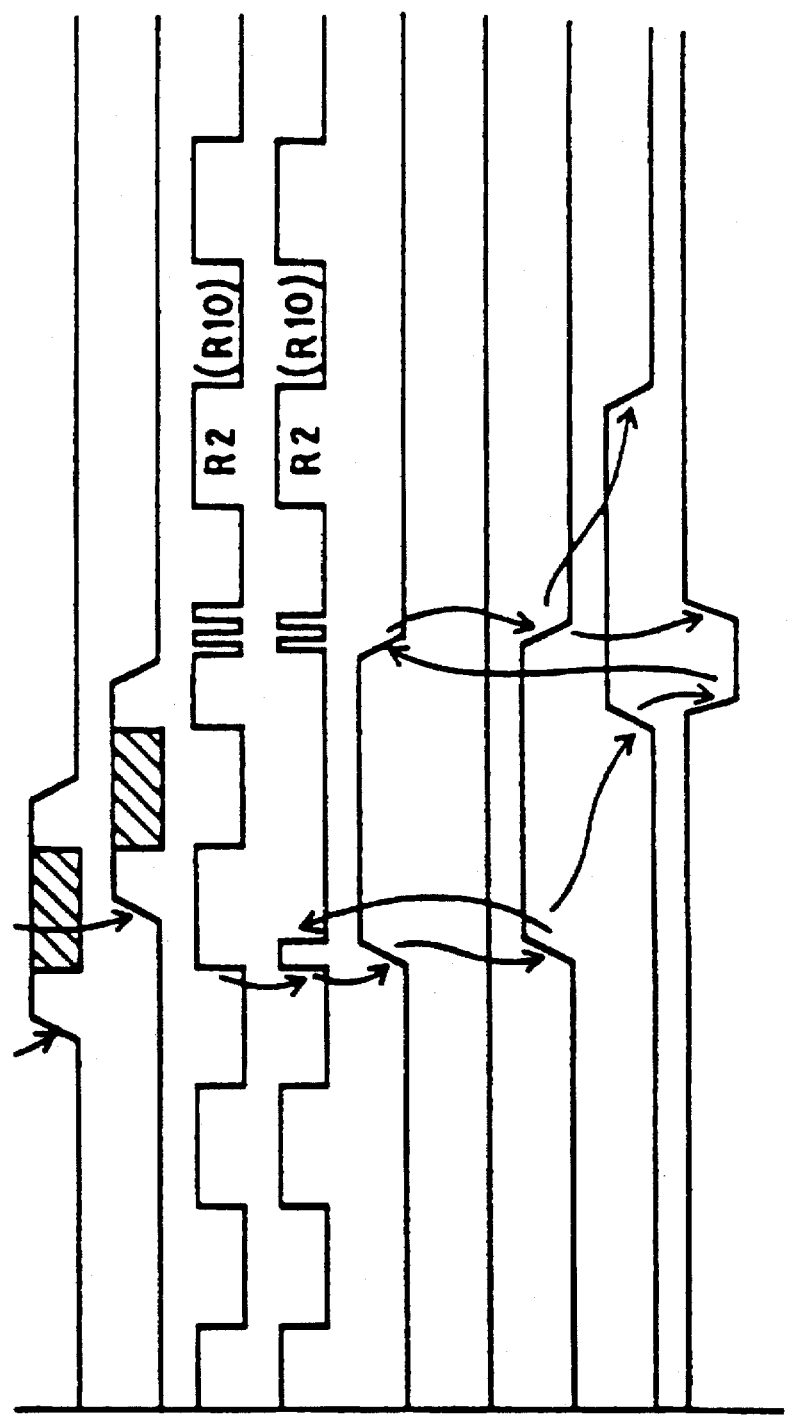

FREQUENCY MULTIPLYING DEVICE AND DIGITALLY-CONTROLLED OSCILLATOR

This is a continuation of application Ser. No. 08/621,607, filed Mar. 22, 1996.

CROSS-REFERENCE TO RELATED APPLICATION

The present application is related to and claims priority from Japanese Patent Application No. Hei. 7-64252, incorporated herein by reference.

BACKGROUND OF THE INVENTION

1. Field of the Invention

The present invention relates to a frequency multiplying device which produces an oscillation signal having a frequency that is the frequency of an externally-supplied reference signal multiplied by a prescribed number, and to a digitally-controlled oscillator which is used suitably in the frequency multiplying device.

2. Description of the Related Art

As pulse phase difference encoding devices for encoding a phase difference in a pulse signal into digital data, one known conventional pulse phase difference encoding devices is, for example, the device disclosed in Japanese Patent Laid Open Publication No. Hei-3-220814 wherein a delay circuit including a plurality of interconnected delay elements is provided, the first pulse signal is provided to the delay element at the first stage of the delay circuit, the delay element in the delay circuit at which the input pulse has arrived at the point in time at which the next pulse is provided is detected, and the number of the delay elements connected up to this element from that element at the first stage is encoded to obtain digital data corresponding to the phase difference between those pulse signals.

Further, as conventional oscillators whose oscillation frequencies can be digitally controlled over wide ranges from several hundred KHz to several tens of MHz, digitally controlled oscillators such as the one disclosed in Japanese Patent Laid Open Publication No. Hei-5-102801 have been proposed, wherein a delay circuit consisting of multiple interconnected delay elements is provided as in the pulse phase difference encoding devices described above, and the delaying operation of the delay circuit is started by providing a pulse signal to the delay element at the first stage of the delay circuit and, thereafter, an oscillation signal is generated at a cycle corresponding to digital data by repeating the execution of operations such as generating an oscillation signal when pulse signals are generated from the delay elements at connecting positions which correspond to digital data in the delay circuit and initializing the delay circuit concurrently.

With these devices, detection of pulse phase differences and control over an oscillation frequency can be performed at a time resolution which is determined by the delay time of the delay elements in the delay circuits. It is therefore possible to achieve a significant improvement over the conventional devices with respect to the accuracy of the detection of pulse phase differences and the accuracy of the control over an oscillation frequency.

Further, since these devices can accurately perform the detection of pulse phase differences and the control over an oscillation frequency, it is possible to provide a PLL (phase locked loop) for communicators, motor controllers, etc. which can be digitally controlled and which is highly accurate by combining a pulse phase difference encoding device and a digitally controlled oscillation device as disclosed in, for example, Japanese Patent Laid Open Publication No. Hei-5-102801.

Meanwhile, when using the devices described above concurrently, it would be best if all the delay circuits incorporated in those devices operate at completely the same time resolution. However, variations in the time resolution among the delay circuits in those devices caused by variations in the delay elements of the delay circuits will result in variations in time resolution among the oscillation signals of the devices which correspond to the encoded data of pulse phase differences and digital data. This causes problems such as the problem of not being able to digitally control the operation of a PLL at a high degree of accuracy if the PLL is formed from a pulse phase difference encoding device and a digitally controlled oscillator as described above.

On the other hand, such a problem can be avoided by sharing a single delay circuit among those devices instead of providing each of those devices with a delay circuit. However, in conventional devices, since a delay circuit is initialized and activated for a delaying operation when the first pulse signal to be phase-difference-encoded is provided from the outside or when an oscillation signal is generated, it is not possible to share a single delay circuit among such devices.

Also, when two pulse signals whose phase differences need to be encoded are provided from the outside, the pulse phase difference encoding circuit disclosed in the above-described Japanese Patent Laid Open Publication Hei-3-220814 needs an operation of resetting the counter which counts the number of circulations executed by the input pulse in the delay circuit. It must be noted here that conventionally, there was a need to provide an external reset signal for resetting. Therefore, when the digital control oscillator disclosed in Japanese Patent Laid-Open Publication Hei-5-102801 is combined with such a pulse phase difference encoding circuit, there is a need to provide a reset signal for every group of two pulse signals whose phase differences need to be encoded, and thus, even if the plurality of pulse signals is provided sequentially, there was the problem of not being able to multiply there frequencies (or phase differences) sequentially by a predetermined number before generating them.

SUMMARY OF THE INVENTION

The present invention is intended to avoid the foregoing prior art deficiencies, and its prime object is to provide a frequency multiplying device which is capable of multiplying the frequency of an externally-supplied reference signal and which is simple in structure, and to provide a digitally-controlled oscillator which is used suitably in the frequency multiplying device.

It is a further object of the present invention to provide a device which executes pulse phase difference encoding or oscillating frequency control based on the delay signal sequentially generated from the delay circuit which is formed by connecting multiple delay elements, and which can execute such pulse phase difference encoding and oscillating functions through the sharing of one delay circuit.

It is still another object of the present invention to provide a frequency multiplier and a digitally controlled oscillator which, while not providing a special external control signal for controlling the count operations of the clock count unit, can generate the frequencies (or the phase differences) of multiple pulse signals after sequentially multiplying them by a predetermined value even though the multiple pulse signals are sequentially provided.

In order to achieve the above objects, a first aspect of the present invention provides a frequency multiplying device which produces an output signal having a frequency that is the frequency of an externally-supplied reference signal multiplied by a prescribed number, where the device includes a digitally-controlled oscillator which includes a multi-phase clock generator for generating multiple clock signals having a prescribed period and a prescribed phase interval, produces an oscillation signal which corresponds to externally-supplied frequency control data at a resolution based on the phase difference time of the multi-phase clock signals, and generates the oscillation signal as the output signal, a clock counting unit which counts a prescribed clock signal generated by the multi-phase clock generator for a duration of a prescribed number of periods of the reference signal, a data output unit which delivers digital data indicative of the count value of the clock counting unit as the frequency control data to the digitally-controlled oscillator and an operation control unit which controls the clock counting unit to operate at a prescribed timing that is based on the reference signal.

The frequency multiplying device according to the first aspect of the invention has a digital oscillator which includes a multi-phase clock generator for generating multiple clock signals having a prescribed period and a prescribed phase interval, and the oscillator produces an oscillation signal which corresponds to externally-supplied frequency control data at a resolution based on the phase difference time of the multi-phase clock signals and generates the oscillation signal as the output signal of the frequency multiplying device.

The clock counting unit counts a clock signal generated by the multi-phase clock generator of the digital oscillator for a duration of a prescribed number of periods of the externally-supplied reference signal, and the data output unit delivers digital data indicative of the count value of the clock counting unit as the frequency control data to the digital oscillator. The operation control unit controls the clock counting unit to operate at a timing that is based on the reference signal.

For the externally-supplied reference signal having a period of TREF, the multi-phase clock generator having an output period (the period of clock signal) of TC, the multi-phase clock signals having a phase difference time of TP, and the reference signal for the clock counting unit having a frequency of N1, the count value C of the clock counting unit and the frequency control data D generated by the data output unit have their values related to be C=D=(N1·TREF)/TC, and the oscillation signal generated by the digital oscillator has its period TOUT given to be TOUT=D·TP=N1·TREF·(TP/TC).

Accordingly, when N1=1, i.e., when the clock counting unit counts the clock signal generated by the multi-phase clock generator within one period of the reference signal, the digital oscillator generates an oscillation signal having a period that is the reference signal period TREF divided by the total number of clock signals (TC/TP) generated by the multi-phase clock generator. In other words, an oscillation signal having a frequency that is the reference signal frequency F!REF! multiplied by the total number of multi-phase clock signals (TC/TP) is produced as the output signal of the frequency multiplying device.

In another case of N1=2, i.e., when the clock counting unit counts the clock signal generated by the multi-phase clock generator within two periods of the reference signal, an oscillation signal having a frequency that is the reference signal frequency F!REF! multiplied by a half of the total number of multi-phase clock signals (TC/2TP) is produced.

Namely, the frequency multiplying device according to this aspect of the invention operates on the clock count unit to code the time of a prescribed number of periods of the reference signal at a resolution determined from the period of the clock signals generated by the multi-phase clock generator, and delivers the resulting frequency control data to the digital oscillator having a control resolution determined from the phase difference time of the multi-phase clocks. Accordingly, by configuring the clock counting unit to count the number of clock signals generated by the multi-phase clock generator within one period of the reference signal, an oscillation signal having a frequency that is the frequency of the reference signal multiplied by the total number of clock signals (TC/TP) generated by the multi-phase clock generator can be obtained. By increasing the number of periods N1 of the reference signal used to count the clock signal, the output frequency can be lowered in inverse proportion to the value N1.

Also according to this aspect of the invention, it is possible to produce an oscillation signal having the frequency of a reference signal multiplied by a prescribed number based on such a very simple circuit arrangement as for counting the clock signal generated by a multi-phase clock generator for a duration of a prescribed number of periods of the reference signal. The frequency multiplying device uses a common multi-phase clock generator for coding the period of the reference signal and for controlling the output frequency, and accordingly it operates stably for frequency multiplication even if operational conditions such as the ambient temperature and power voltage vary. By dividing by a prescribed number N2 the value of frequency control data generated by the data output unit before it is fed to the digital oscillator, an output signal having much higher frequency resulting from the frequency multiplication of the reference signal can be produced.

Further according to this aspect of the invention, because the operation control unit generates a signal for controlling the count operations of the clock count unit with the entry of a particular pulse of the pulse train of the reference signal, there is no need to provide an external special control signal for controlling the count operations of the clock count unit. Therefore, the count operations of the clock count unit can be executed smoothly and pulse signals can be generated after multiplying their frequencies (or their phase differences) by a predetermined value even if multiple pulse signals are sequentially provided.

A second aspect of the present invention preferably includes, in addition to the above components, a data switching unit which delivers one of first data made up of high-order bits of the frequency control data provided by the data output unit, with low-order n bits being removed, and second data having the value of the first data incremented by 1 to the digitally-controlled oscillator in every period of the output signal, and a switching control unit which controls the data switching unit to generate the second data in a proportion that depends on the ratio of the value of the low-order n bits to value 2n.

According to this aspect of the invention, the data switching unit delivers one of first data made up of high-order bits of the frequency control data provided by the data output unit, with low-order n bits being removed, and second data having the value of the first data incremented by 1 to the digital oscillator in every period of the output signal, and the switching control unit controls the data switching unit to generate the second data in a proportion that depends on the ratio of the value of the low-order n bits to value 2n.

Namely, the frequency multiplying device according to this aspect of the invention is designed to supply data which indicates the value above the decimal point of the value of frequency control data divided by 2n to the digital oscillator, and data supplied to the digital oscillator is incremented by 1 at a frequency depending on the ratio of the value of the low-order n bits of frequency control data to value 2n, i.e., at a frequency depending on the value below the decimal point of the value of frequency control data divided by 2n.

Accordingly, in case the value of frequency control data provided by the data output unit is not a multiple of 2n (the value of low-order n bits is not zero), the value above the decimal point incremented by 1 (second data) is used at a frequency depending on the value below the decimal point of the result of division and supplied as the frequency control data to the digital oscillator. It is consequently possible to make the mean value of the period of oscillation signal correspond accurately to the value of frequency control data divided by 2n. Consequently, an oscillation signal having a frequency that is 2n times the output frequency of the frequency multiplying device of the above device can be produced accurately.

Accordingly, the frequency multiplying device according to this aspect of the invention is capable of multiplying the frequency of the reference signal accurately based on the arrangement of the clock counting unit which counts the clock signal generated by the multi-phase clock generator within 2n periods of the reference signal in the case of producing an oscillation signal having the frequency of the reference signal multiplied by the total number of multi-phase clock signals (TC/TP), for example.

In consideration of the error of count value by the amount of one clock period of the clock counting unit, it is designed to count the clock signal for a duration of 2n periods of the reference signal So as to increase the number of bits of frequency control data by n bits, and frequency control data, with its value being divided by 2n, is supplied to the digital oscillator, whereby the influence of the count error of the clock counting unit can be alleviated.

Consequently, an oscillation signal which corresponds accurately to the value of frequency control data divided by 2n (i.e., the count value equivalent to one period of the reference signal in this case) can be obtained, and it becomes possible for the digital oscillator to produce an oscillation signal having the frequency of the reference signal multiplied accurately by TC/TP. Although the oscillation signal has its period varied depending on whether or not the value of frequency control data is added by 1, the amount of variation, which is the phase difference time of the multi-phase clocks, is extremely small. Accordingly, the frequency multiplying device according to this aspect of the invention, which is devised to reduce the count error of the clock counting unit, is capable of producing an output signal having the more accurately multiplied frequency of the reference signal.

Although in the frequency multiplying devices according to the two above aspects of the invention, the multi-phase clock generator in the digital oscillator may employ multiple fixed-frequency oscillators (e.g., crystal oscillators) of the same oscillation frequency and control the oscillation start timing of each oscillator so that the oscillators generate clock signals at a prescribed phase interval, the frequency multiplying device can be made more compact when a digital oscillator such as a delay-type ring oscillator is used.

In this case, the resulting compact frequency multiplying device can be used for the clock generator of an LSI device. Specifically, an oscillation circuit is formed of inverting circuits in the LSI and resistors and capacitors in the LSI or attached externally to the LSI, and the oscillation signal of this oscillation circuit is used in conjunction with frequency multiplication techniques to produce the clock signal for the LSI device.

Based on this arrangement for clock signal generation for an LSI device, the oscillation frequency can be set lower by using resistors of low resistance and capacitors of large capacitance so that the frequency is stable against the variation of the ambient temperature and power voltage, and yet a clock signal of a highly multiplied frequency can be supplied to the LSI device, whereby an oscillation circuit which is inexpensive and reliable against the operational environment can be offered.

The above objects are achieved in a third aspect of the invention which includes a pulse circulation circuit formed of multiple inverting circuits in a ring configuration, in which a pulse signal is circulated by being inverted by each inverting circuit, and generates pulse signals with a prescribed phase interval from predetermined multiple inverting circuits, a counting unit which counts the pulse signal generated by a prescribed inverting circuit in the pulse circulating circuit and detects the arrival of the count value at the value of externally-supplied digital data indicative of the number of times of circulation of the pulse signal, a pulse detection unit which receives input digital data indicative of the order of phase with respect to a specific pulse signal provided by the pulse circulating circuit and detects the generation from the pulse circulating circuit of the pulse signal relevant to the input data following the detection of the arrival of the count value of the counting unit at the value of the digital data of the number of times of circulation, an output unit which produces a prescribed output signal in response to the detection by the pulse detection unit of the generation of the pulse signal relevant to the input data, a data revision unit which produces digital data as new input data for the pulse detection unit by summing the external digital data indicative of the phase order with respect to the specific pulse signal and the present input data of the pulse detection unit on completion of each detecting operation of the pulse detection unit, and a count number altering unit which, in case the value of the digital data produced by the data revision unit has exceeded the number of pulse signals generated by the pulse circulating circuit, increments by one the count number of the pulse signal to be counted before the detecting operation of the counting unit takes place.

In the above device, the multiple pulse signals generated by the pulse circulating circuit are grouped in advance in terms of the phase order with respect to the specific pulse signal, and the counting unit counts the pulse signal of a group other than the group of the earliest phase, the pulse detection unit includes a detected signal output unit which, in response to the detection of the arrival of the count value of the counting unit at the value of digital data indicative of the number of times of circulation and in correspondence to each group of pulse signals, generates multiple detected signals that are active until at least all pulse signals of the relevant group are generated continuously by the pulse circulating circuit, with the detected signal relevant to the group of the pulse signal counted by the counting unit and groups later in phase than that group being made active after the specific pulse signal has been generated, multiple latch circuits provided in correspondence to the detected signals and receiving respective detected signals on their data terminals to latch and generate signal levels on the data terminals in response to the reception of pulse signals on their clock terminals, and a selection unit which selects one of the pulse signals generated by the pulse circulating circuit and delivers the selected pulse signal to the clock terminal of the latch circuit that has received the detected signal relevant to the group of the selected pulse signal, so that the output unit generates the output signal in response to an active-level output of any of the latch circuits.

The digital oscillator according to this aspect of the invention has the pulse circulating circuit formed of multiple inverting circuits in a ring configuration, in which a pulse signal is circulated by being inverted by each inverting circuit, and pulse signals with a prescribed phase interval are output from predetermined multiple inverting circuits.

The counting unit counts the pulse signal generated by a prescribed inverting circuit in the pulse circulating circuit and detects the arrival of the count value at the value of externally-supplied digital data indicative of the number of times of circulation of the pulse signal, and the pulse detection unit receives input digital data indicative of the order of phase with respect to a specific pulse signal provided by the pulse circulating circuit and detects the generation from the pulse circulating circuit of the pulse signal relevant to the input data following the detection of the arrival of the count value of the counting unit at the value of digital data of the number of times of circulation. The output unit produces the output signal in response to the detection by the pulse detection unit of the generation of the pulse signal relevant to the input data.

During the operation of the oscillator, in case digital data indicative of the K-th phase order with respect to the specific pulse signal is supplied to the pulse detection unit, if the generation of the pulse signal having the K-th phase order by the pulse circulating circuit is detected by the pulse detection unit following the detection of the arrival of the count value of the counting unit at the number of times of circulation indicated by the digital data, then the output unit generates an output signal for the first circulation of the pulse.

On completion of each detecting operation by the pulse detection unit, the data revision unit sums the external digital data indicative of the phase order with respect to the specific pulse signal provided by the pulse circulating circuit and the present input data of the pulse detection unit, and delivers the resulting new input data to the pulse detection unit. Accordingly, in case the external digital data of phase order has a value of Dp, the pulse detection unit detects pulse signals of the (K+Dp)th, (K+2·Dp)th, (K+3·Dp)th phase orders and so on for the second and successive circulations. Namely, pulse signals detected by the pulse detection unit have a phase shift of Dp relative to the pulse signals detected previously.

Consequently, the output unit generates output signals at a constant time interval (y·Td·M+Tp·Dp) that is the sum of a constant duration (y·Td·M) determined by the number of stages y of inverting circuits of the pulse circulating circuit, the inversion time Td of each inverting circuit and the number of times of pulse signal circulation M counted by the counting unit, and another constant time (Tp·Dp) determined by the phase difference time Tp of pulse signals generated by the pulse circulating circuit and the value of phase order Dp with respect to the specific pulse signal indicated by the external digital data. For the initial value Dp of the data supplied to the data detection unit, the output unit generates output signals at the constant time interval (y·Td·M+Tp·Dp).

If the value of digital data provided by the data revision unit exceeds the number of pulse signals generated by the pulse circulating circuit, the time until the generation of the next output signal will decrease by the pulse signal circulation time y·Td, and therefore the count number altering unit adds 1 to the number of pulse signals to be counted before the detecting operation of the counting unit takes place.

Namely, the digital oscillator according to this aspect of the invention is designed to sum the value of the externally-supplied digital data of phase order in every period of the output signal and use the summed data for the input data of the pulse detection unit, so that the number of times of pulse signal circulation to be counted is added by 1 if a pulse signal detected by the pulse detection unit precedes the specific pulse signal. Based on this scheme, the output signal retains a constant period without the need of halting the pulse circulating circuit.

The digital oscillator according to this aspect of the invention is capable of altering the oscillation period of the frequency multiplying device arbitrarily based on the alteration of the number of times of pulse signal circulation counted by the counting unit and the pulse signal to be detected by the pulse detection unit specified by the external digital data.

With regard to the oscillation frequency, the greater the number of times of pulse signal circulation in the pulse circulating circuit, the lower is the output signal frequency, and vice versa. On this account, by coarsely determining the output signal frequency based on the number of times of pulse signal circulation and finely adjusting the output frequency by choosing a pulse signal to be detected by the pulse detection unit, it becomes possible to control the output signal frequency in digital manner at a fine resolution in a wide range of the order from several Hz to several tens of MHz.

The digital oscillator according to this aspect of the invention can oscillate without halting the pulse circulating circuit, in contrast to the conventional device mentioned previously, and it becomes possible to set an oscillation frequency that is simply proportional to the value of external digital data. Owing to the elimination of the need of halting the pulse circulating circuit, it is possible to set a much shorter oscillation period.

In this digital oscillator, the pulse signal counted by the counting unit has the same phase as the output of a specific inverting circuit, whereas the pulse signal detected by the pulse detection unit has its phase shifted progressively. On this account, in case the pulse detection unit detects a pulse signal that is earlier in phase than the pulse signal counted by the counting unit, and subsequently detects a pulse signal that is later in phase than the pulse signal counted by the counting unit, the time interval of adjacent output signals becomes shorter by one pulse signal circulation time in the pulse circulating circuit.

A conceivable scheme of arrangement for dealing with this matter is to count a pulse signal having an intermediate phase between the latest phase among those generated by the pulse circulating circuit and the phase of the specific pulse signal as the reference phase having the earliest phase. In this case, however, the pulse detection unit is allowed of an extremely short time following the end of counting of the counting unit in detecting the pulse signal of earlier phase, resulting in a degraded stability of pulse signal generation.

Another conceivable scheme is the use of a selector circuit which selects one of the pulse signals generated by the pulse circulating circuit depending on the input data and a latch circuit which receives the pulse signal selected by the selector circuit on its clock terminal and the detected signal from the counting unit on its data terminal, so that the latch circuit latches and generates the detected signal in response to the generation of the pulse signal by the selector circuit following the generation of the detected signal by the counting unit. In this case, however, the latch circuit cannot operate stably unless it has a certain time length from the reception of the detected signal on its data terminal until the reception of the pulse signal on its clock terminal.

Therefore, the digital oscillator according to this aspect of the invention is designed to split the pulse signals generated by the pulse circulating circuit into multiple groups in advance in terms of the phase order with respect to the specific pulse signal, so that the counting unit counts the pulse signal of a group other than the group of the earliest phase, and has its pulse detection unit formed of a detected signal output unit and multiple latch circuits and selection unit.

The detected signal output unit operates, in response to the detection of the arrival of the count value of the counting unit at the value of digital data indicative of the number of times of circulation and in correspondence to each group of pulse signal, to generate multiple detected signals that are active until at least all pulse signals of the relevant group are generated continuously by the pulse circulating circuit, with the detected signal relevant to the group of the pulse signal counted by the counting unit and groups later in phase than that group being made active after the specific pulse signal has been generated.

The latch circuits, which are provided in correspondence to the detected signals generated by the detected signal output unit, receive respective detected signals on their data terminals and latch and generate signal levels on the data terminals in response to the reception of pulse signals on their clock terminals. The selection unit selects one of the pulse signals generated by the pulse circulating circuit and delivers the selected pulse signal to the clock terminal of the latch circuit that has received the detected signal relevant to the group of the selected pulse signal.

Accordingly, in the digital oscillator according to this aspect of the invention, the detected signals generated by the detected signal output unit and the latch circuits which receive the respective detected signals on their data terminals are in correspondence to the groups of pulse signals split in terms of the phase order with respect to the specific pulse signal, and the selection unit selects one of the pulse signals generated by the pulse circulating circuit depending on the input data indicative of the phase order and delivers the selected pulse signal to the clock-terminal of the latch circuit relevant to the group of the selected pulse signal.

Accordingly, after the detection of the arrival of the count value of the counting unit at the value of digital data of the number of times of circulation and the generation by the detected signal output unit of the detected signal relevant to the group of pulse signal to be detected at this time, when that pulse signal is generated by the pulse circulation circuit, an active-level signal is generated only from the latch circuit relevant to the group of that pulse signal. The output unit responds to an active-level output from any of the latch circuits, indicative of the generation by the pulse circulating circuit of the pulse signal relevant to the input data of phase order, to produce a prescribed output signal.

In the digital oscillator according to this aspect of the invention, the counting unit counts the pulse signal of a group other than the group of the earliest phase, and detected signals relevant to the group of the pulse signal and groups later in phase than that group are generated after the specific pulse signal has been generated. Accordingly, for at least the pulse signal counted by the counting unit and pulse signals later in phase than this pulse signal, a pulse signal generated by the pulse circulating circuit immediately after the detection of the number of times of circulation by the counting unit is ignored and the pulse signal of the same phase generated in the next circulation will be detected.

Consequently, the digital oscillator according to this aspect of the invention is capable of producing an output signal of accurate period even in case the pulse detection unit first detects a pulse signal earlier in phase than the pulse signal counted by the counting unit and next detects a pulse signal later in phase than it.

In addition, the digital oscillator according to this aspect of the invention, in which a pulse signal having an early phase can be selected for the pulse signal to be counted by the counting unit, operates to generate detected signals for groups of much earlier phases than the group of the pulse signal counted by the counting unit immediately after the detection by the counting unit to have a sufficient time from the reception of the detected signal on the data terminal of the latch circuit until the reception of the pulse signal on the clock terminal. Consequently, each latch circuit can latch and generate the detected signal reliably in response to the generation of the pulse signal of the relevant group by the selection unit, thereby permitting reliable frequency control.

According to a fourth aspect of the present invention, the above objects are achieved by providing a digitally-controlled oscillator similar to the one described above which, instead of using the above-described selection unit, uses a first selection unit which selects pulse signals as candidates of the groups depending on one of two divided input data, and delivers the selected pulse signals to the clock terminals of the latch circuits that receive detected signals relevant to the groups of the pulse signals, and a second selection unit which selects and generates the output of one latch circuit depending on other data than the data supplied to the first selection unit among the input data, so that the output unit generates the output signal in response to an active-level output of the second selection unit.

The first selection unit selects pulse signals as candidates of the groups depending on one of two divided input data, and delivers the selected pulse signals to the clock terminals of the latch circuits that receive detected signals relevant to the groups of the pulse signals. The second selection unit selects and generates the output of one latch circuit depending on other data than the data supplied to the first selection unit among the input data indicative of the phase order.

Namely, in contrast to the digital oscillator of the previously-described aspect of the invention which is designed to select one of pulse signals generated by the pulse circulating circuit depending on the input data and deliver the selected pulse signal to the clock terminal of the relevant latch circuit, the digital oscillator according to this aspect of the invention is designed to select a pulse signal of each group of pulse signals, deliver the selected pulse signals to the clock terminals of the respective latch circuits, and finally select the output of one latch circuit by using the second selection unit.

The second selection unit generates an active-level signal at exactly the same timing as the latching and delivery of the detected signal by one latch circuit in the digital oscillator according to the previous aspect of the invention. The output unit responds to an active-level output from the second selection unit, indicative of the generation by the pulse circulating circuit of the pulse signal relevant to the input data of phase order, to produce the output signal.

Consequently, the digital oscillator according to this aspect of the invention is capable of producing an oscillation signal, which is as accurate in its period, in compliance with the digital data indicative of the number of times of circulation of the pulse signal and the digital data indicative of the phase order of the pulse signal to be detected.

According to a fifth aspect of the present invention, the above objects are achieved by providing a digitally-controlled oscillator similar to the one described above which uses a selection unit which selects and generates the output of one latch circuit among the latch circuits that receives on its clock terminal the pulse signal relevant to the input data, so that the output unit generates the output signal in response to an active-level output of the selection unit.

The digital oscillator according to this aspect of the invention has latch circuits corresponding to the multiple pulse signals generated by the pulse circulating circuit, with their clock terminals receiving the respective pulse signals directly and their data terminals receiving the detected signals, among the signals provided by the detected signal output unit, relevant to the groups of the pulse signals received by the clock terminals.

The selection unit selects and generates the output of one latch circuit, among the multiple latch circuits, that receives on its clock terminal the pulse signal relevant to the input data of phase order. Also, the detected signal output unit generates detected signals relevant to the groups of pulse signals in response to the detection of the arrival of the count value of the counting unit at the value of digital data indicative of the number of times of pulse signal circulation. Each latch circuit latches and generates the detected signal when the relevant pulse signal is generated by the pulse circulating circuit during the reception of the detected signal from the detected signal output unit on its data terminal, and only the output of one latch circuit that receives on the clock terminal the pulse signal relevant to the input data of phase order is selected and generated by the selection unit.

Accordingly, the output unit responds to an active-level output from the selection unit, indicative of the generation by the pulse circulating circuit of the pulse signal relevant to the input data of phase order, to produce an output signal. Consequently, the digital oscillator according to this aspect of the invention is capable of producing an oscillation signal in compliance with the digital data indicative of the number of times of circulation of the pulse signal and the digital data indicative of the phase order of the pulse signal to be detected.

In the digital oscillators according to the above-described aspects of the invention, the data revision unit sums the external digital data indicative of the phase order with respect to the specific pulse signal and the present input data of the pulse detection unit at the completion of each detecting operation of the pulse detection unit, and delivers the resulting new input data to the pulse detection unit so that the phase of the pulse signal detected by the pulse detection unit is shifted progressively.

Preferably, the data revision unit revises the input data for the pulse detection unit in response to the generation of the detected signal having the latest phase by the detected signal output unit.

The timing of revision of input data for the pulse detection unit by the data revision unit, i.e., the timing of detection of the completion of each detecting operation by the pulse detection unit, may be set to be the timing of generation of the output signal by the output unit, or may be set to be the timing of generation of the detected signal having the latest phase order by the detected signal output unit.

According to a sixth aspect of the present invention, the above objects are achieved by providing a frequency multiplying device for producing an output signal having a frequency that is a frequency of an externally-supplied reference signal which includes a pulse train that includes at least first, second and third pulses, repeated a predetermined number of times, where the device includes a digitally controlled oscillator, which includes a multi-phase clock generator for generating multi-phase clock signals having a predetermined phase difference at a predetermined interval, for producing an oscillation signal which corresponds to externally-supplied frequency control data at a resolution based on a phase time difference of the multi-phase clock signals generated by the multi-phase clock generator and for generating the oscillation signal as the output signal, a clock count unit, which is provided with the multi-phase clock signals generated by the multi-phase clock generator and the reference signal, for starting a count of a number of clocks of the clock signal to go with the first pulse of the reference signal, finishing the count and generating a count value to go with the second pulse, and resetting the count value to go with the third pulse, and a data output unit, provided with the count value generated by the clock count unit, for providing the count value as the frequency control data to the digitally controlled oscillator.

In this way, the clock count unit) starts to count the number of clocks in the clock signal to go with the first pulse of the reference signal, and ends the count and generates the count value thereafter to go with the second pulse. The data output unit receives the count value and generates the count value to the digitally controlled oscillator as the frequency control data. The clock count unit resets the count value to go with the third pulse. The digitally controlled oscillator generates an oscillating signal that corresponds to the frequency control data with the phase time difference in the multiple clock signals generated from the multi-phase clock generator serving as the unit and provides the oscillating signal to the outside.

In this way, the operation of the clock count unit is controlled by the pulse of the reference signal itself. In other words, because the clock count unit detects the frequency of the reference signal based on the first and second pulses and the count value is reset to go with the third pulse of the reference signal itself, there is no need to provide a special control signal for especially controlling the count operations of the clock count unit. Therefore, the count operations of the clock count unit can be executed smoothly and pulse signals can be generated after multiplying their frequencies by a predetermined value even if multiple pulse signals is sequentially provided.

The above objects are achieved in a seventh aspect of the present invention by providing a frequency multiplying device similar to the one described above which additionally includes an operation control unit, provided with the reference signal, for generating a signal to the clock count unit to start the count of the number of clocks of the clock signal to go with the first pulse of the reference signal, generating a signal to the clock count unit to finish the count to go with the second pulse, and, furthermore, generating a signal to the clock count unit to reset the count value to go with the third pulse.

According to the frequency multiplying device according to this aspect of the present invention, the operation control unit generates a signal to the clock count unit to start the count of the number of clocks of the clock signal to go with the first pulse of the reference signal, and generates a signal to the clock count unit to finish the count to go with the second pulse. Thereafter, the clock count unit generates the count value. The data output unit receives the count value and provides the count value as the frequency control data to the digitally controlled oscillator. Then, the operation control unit generates a signal to the clock count unit to reset the count value to go with the third pulse. The digital control oscillator generates an oscillating signal that corresponds to the frequency control data with the phase time difference in the multiple clock signals generated from the multi-phase clock generator serving as the unit and provides the oscillating signal as an external output.

In this way, the operation of the clock count unit is controlled by the pulse of the reference signal itself. In other words, because the clock count unit detects the frequency of the reference signal based on the first and second pulses and the count value is reset to go with the third pulse of the reference signal itself, there is no need to provide a special control signal for controlling the count operations of the clock count unit. Therefore, the count operations of the clock count unit can be executed smoothly and pulse signals can be generated after multiplying their frequencies by a predetermined value even if multiple pulse signals are sequentially provided.

The above objects are achieved in an eighth aspect of the present invention by providing a frequency multiplying device, similar to the one described above, which includes an operation control unit that has a control counter circuit for generating a count value after counting the number of pulses in the pulse train of the reference signal, and a determination circuit, connected to the control counter circuit, for providing a signal that starts the counting of the number of clocks in the clock signal to the clock count unit when unit count value generated by the control counter circuit reaches a first value, generating a signal that finishes the count to the clock count unit when the count value reaches a second value, and, further, generates a signal that resets the counted value to unit clock count unit when the count value reaches a third value.

In this way, the operation control unit counts the pulses of the reference signal. The operation control unit sends a signal to the clock count unit when the count value reaches a first value to make the clock count unit begin counting the number of clocks in the clock signal and sends a signal to the clock count unit to stop the count when the count value reaches a second value. Thereafter, the clock count unit generates the count value. The data output unit receives the count value and provides the count value as the frequency control data to the digitally controlled oscillator. Then, when the count value reaches a third value, the operation control unit sends a signal to the clock count unit to reset the count value. The digitally controlled oscillator generates an oscillating signal that corresponds to the frequency control data with the phase time difference in the multiple clock signals generated from the multi-phase clock generator serving as the unit and provides the oscillating signal to the outside.

In this way, because the operations of the clock count unit are controlled by the pulse of the reference signal itself, there is no need to provide a special external control signal for controlling the count operations of the clock count unit. Therefore, the count operations of the clock count unit can be executed smoothly and pulse signals can be generated after multiplying their frequencies by a predetermined value even if multiple pulse signals are sequentially provided.

Preferably, the frequency multiplying device according to the eighth aspect of the invention includes a frequency switching circuit for, alternatively, providing the count value generated by the clock count unit as is to the data output unit, and dividing the count value by a predetermined number before providing the divided count value to the data output unit.

Also, it is possible that in the frequency multiplying device according to the eighth aspect of the present invention, the clock count unit includes multiple flip-flops connected in series and the frequency switching circuit includes multiple selectors, where each selector is connected to a different group of flip-flops among the multiple flip-flops, and converts the counted value by multiplying by a predetermined number or dividing by a predetermined number by switching a flip-flop selected by the selector circuit in accordance with an externally-supplied frequency switching signal.

With the two above features, because the frequency switching circuit generates the count value generated by the clock count unit as is to the data output unit or divides the count value by a predetermined number before providing the divided value to the data output unit, the frequencies can be easily generated after sequentially multiplying them by a predetermined number.

It is also possible that in the frequency multiplying device incorporating the above feature, the frequency switching circuit converts count data by multiplying by 2n or dividing by 2n. Because the frequency switching circuit converts count data by multiplying it by 2n or dividing it by 2n before providing it to the data output unit, the frequencies can be easily generated after sequentially multiplying them by a predetermined number in the 2n order.

The above objects are achieved in a ninth aspect according to the present invention by providing a frequency multiplying device, which is provided with an externally-supplied reference signal which includes a pulse train that includes at least first, second and third pulses, for detecting a frequency of the reference signal from a phase time difference between the first pulse and the second pulse, forming an output signal by multiplying the frequency of the reference signal by a predetermined number and generating the output signal to go with an input of the third pulse.

According to the frequency multiplying device according to this aspect of the present invention, the frequency of the reference signal is detected from the first and second pulses and the output signal is generated by multiplying a predetermined number to the frequency of the reference signal. Then, the output signal is generated to go with the third pulse of this reference signal. Therefore, there is no need for a special external signal for controlling the device. Thus, the multiplication of the frequencies can be executed smoothly and the frequencies can be generated after multiplying them by a predetermined value even if multiple pulse signals are sequentially provided.

Other objects and features of the invention will appear in the course of the description thereof, which follows.

BRIEF DESCRIPTION OF THE DRAWINGS

Additional objects and advantages of the present invention will be more readily apparent from the following detailed description of preferred embodiments thereof when taken together with the accompanying drawings in which:

FIGS. 4(a)(1)–4(l)(1) and 4(a)(2)–4(l)(2) are timing charts showing the operation of the control circuit and counter/data-latch circuit;

FIGS. 7(a) and 7(b) are a timing chart showing the operation of the ring oscillator shown in FIG. 6;

FIGS. 9(a)(1)–9(t)(2) are timing charts showing the operation of the digital oscillation circuit shown in FIG. 5;

FIGS. 15(a)(1)–15(t)(2) are timing charts showing the operation of the digital oscillation circuit shown in FIG. 13;

FIGS. 17(a) and 17(b) are a schematic diagram of the latch circuits shown in FIG. 16;

FIGS. 18(a)(1)–18(m)(2) are timing charts showing the operation of the digital oscillation circuit shown in FIG. 16;

FIGS. 21(a)(1)–21(r)(2) are timing charts showing the operation of the digital oscillation circuit shown in FIG. 19.

DETAILED DESCRIPTION OF THE PRESENTLY PREFERRED EXEMPLARY EMBODIMENTS

Embodiments of this invention will be explained with reference to the drawings.

Figure 1:
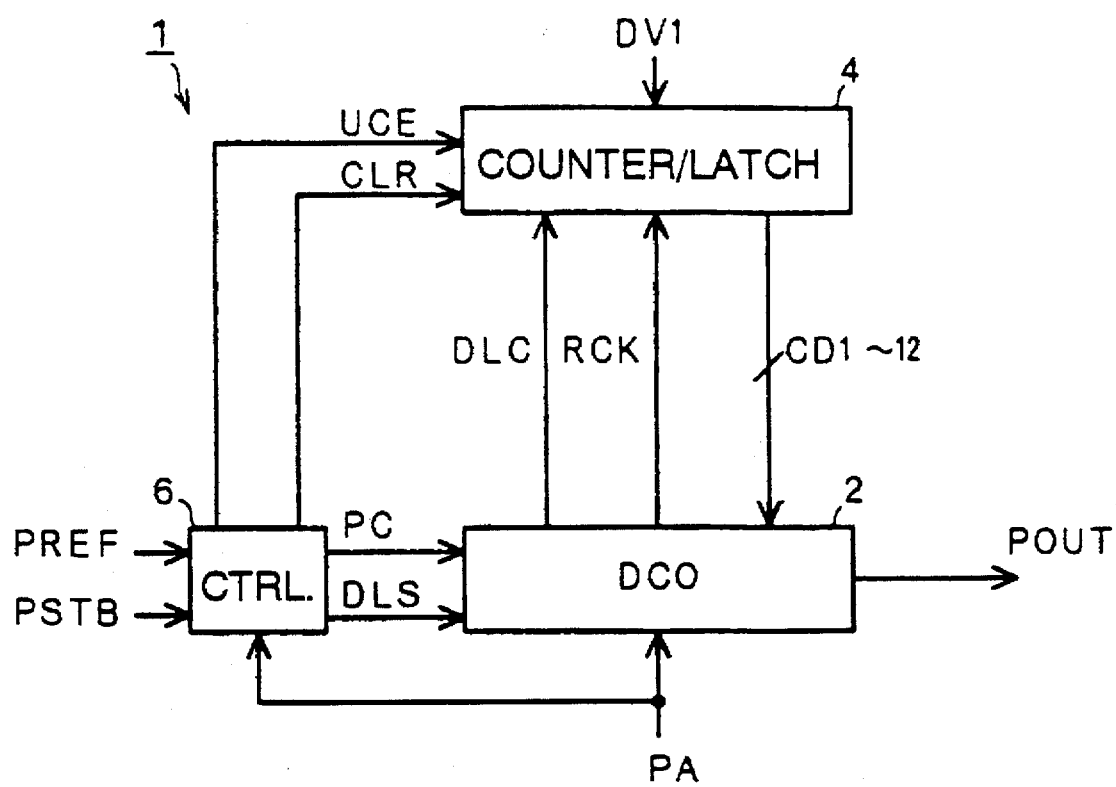
FIG. 1 is a block diagram showing the arrangement of a clock multiplying device based on a first embodiment of this invention.

FIG. 1 is a block diagram of a clock multiplying device based on the first embodiment of this invention. The clock multiplying device 1 receives an external reference signal PREF and produces an output signal POUT having the frequency of the PREF signal multiplied by 16 or 32 depending on a 1-bit multiplier switching signal DV1, and it commences the generation of the output signal POUT by receiving an external operation start signal PSTB.

The clock multiplying device 1 consists of a digitally-controlled oscillation circuit (DCO) 2 which includes a ring oscillator for producing sequentially 16 pulse signals (clock signals) R1–R16 having a prescribed phase interval Tg during the reception of an external high-level control signal PA and produces from the clock signals R1–R16 an output signal POUT having a period specified by 12-bit frequency control data CD (CD1–CD12), a counter/data-latch circuit 4 which codes one period of the reference signal PREF by using a certain clock signal (hereinafter "output clock") RCK among the clock signals R1–R16 produced by the ring oscillator of the digital oscillation circuit 2 and delivers the frequency control data CD1–CD12 that depends on the value of the result of this coding to the digital oscillation circuit 2, and a control circuit 6 which controls the operational timing of the circuits 2 and 4.

The sixteen clock signals R1–R16 produced by the ring oscillator of the digital oscillation circuit 2 will be called multi-phase clocks in the following explanation.

Figure 2:
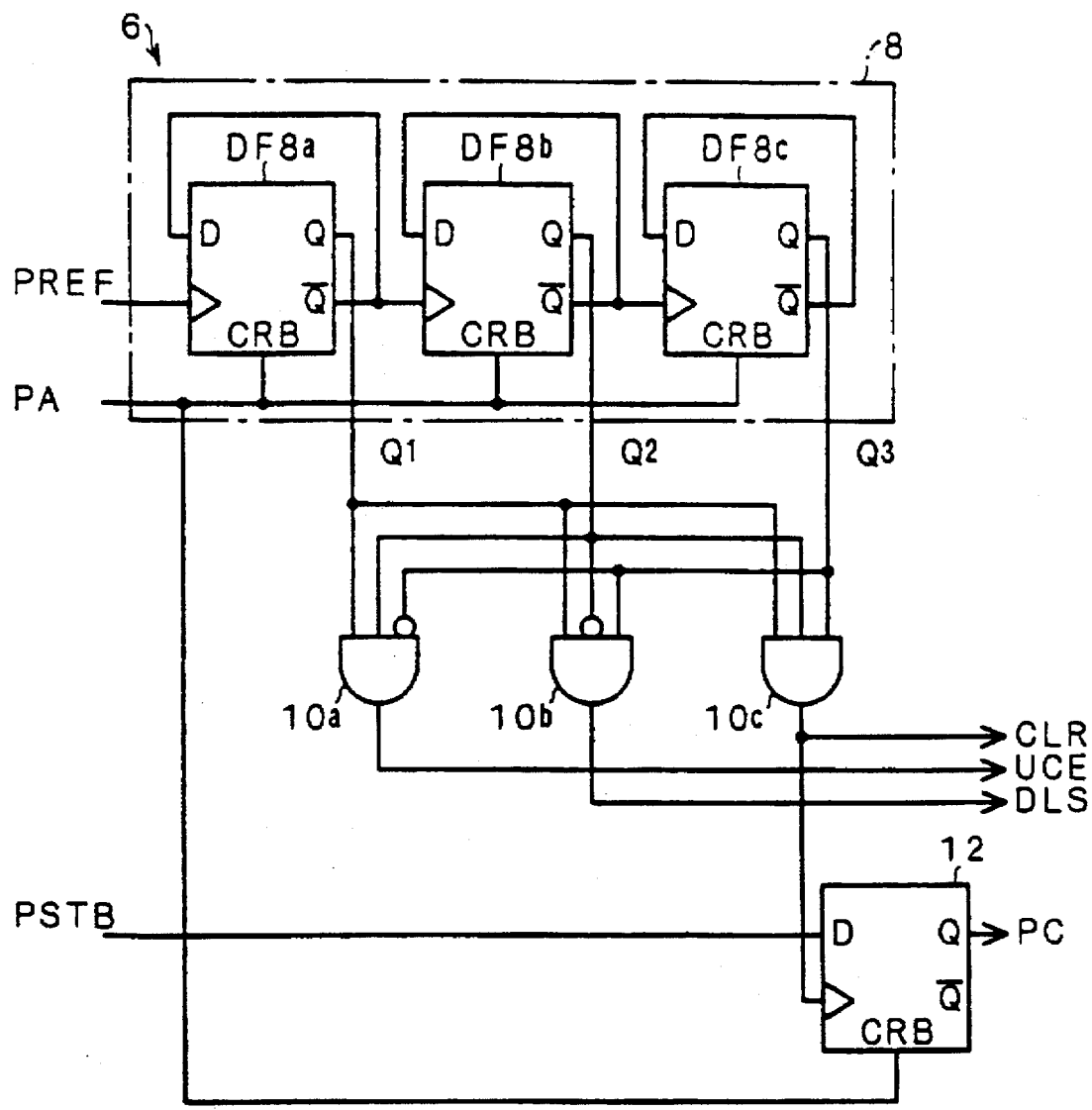
FIG. 2 is a schematic diagram of the control circuit shown in FIG. 1.

In FIG. 2, the control circuit 6 consists of a 3-bit counter 8 formed from three D-type flip-flops (hereinafter "latch circuits") DF8a–DF8c which are adapted to count the reference signal PREF, art AND gate 10a which receives data Q1 and Q2 of the first and second bits of the counter 8 and inverted Q3 data of the third bit of the counter 8, an AND gate 10b which receives data Q1 and Q3 of the first and third bits of the counter 8 and inverted Q2 data of the second bit of the counter 8, an AND gate 10c which receives data Q1, Q2 and Q3 of all bits of the counter 8, and a latch circuit 12 which receives the external operation start signal PSTB on its data terminal D and the output signal CLR of the AND gate 10c on its clock terminal Q. The 3-bit counter 8 and latch circuit 12 are cleared when the external control signal PA is low.

The 3-bit counter 8 is configured to form a frequency divider by having the inverted Q outputs of the latch circuits DF8a–DF8c connected to their own data terminals and the inverted Q output of each preceding latch circuit connected to the clock terminal of the following latch circuit, with the reference signal PREF being fed to the clock terminal of the first-stage latch circuit DF8a.

In the control circuit 6 arranged as explained above, the 3-bit counter 8 counts the reference signal PREF when the control signal PA is high, as shown in FIGS. 4(a)–4(d). The AND gate 10a delivers a high-level count enable signal UCE (see FIG. 4(e)) to the counter/data-latch circuit 4 when the count value is "3", the AND gate 10b delivers a high-level data latch signal DLS (see FIG. 4(f)) to the digital oscillation circuit 2 when the count value is "5", and the AND gate 10c delivers a high-level counter clear signal CLR (see FIG. 4(g)) to the counter/data-latch circuit 4 when the count value is "7". The external high-level operation start signal PSTB (see FIG. 4(h)) received by the clock multiplying device 1 is latched at the timing of the counter clear signal CLR by the latch circuit 12, which delivers the signal as a control signal PC (see FIG. 4(i)) for initiating oscillation of the digital oscillation circuit 2.

Figure 3A:
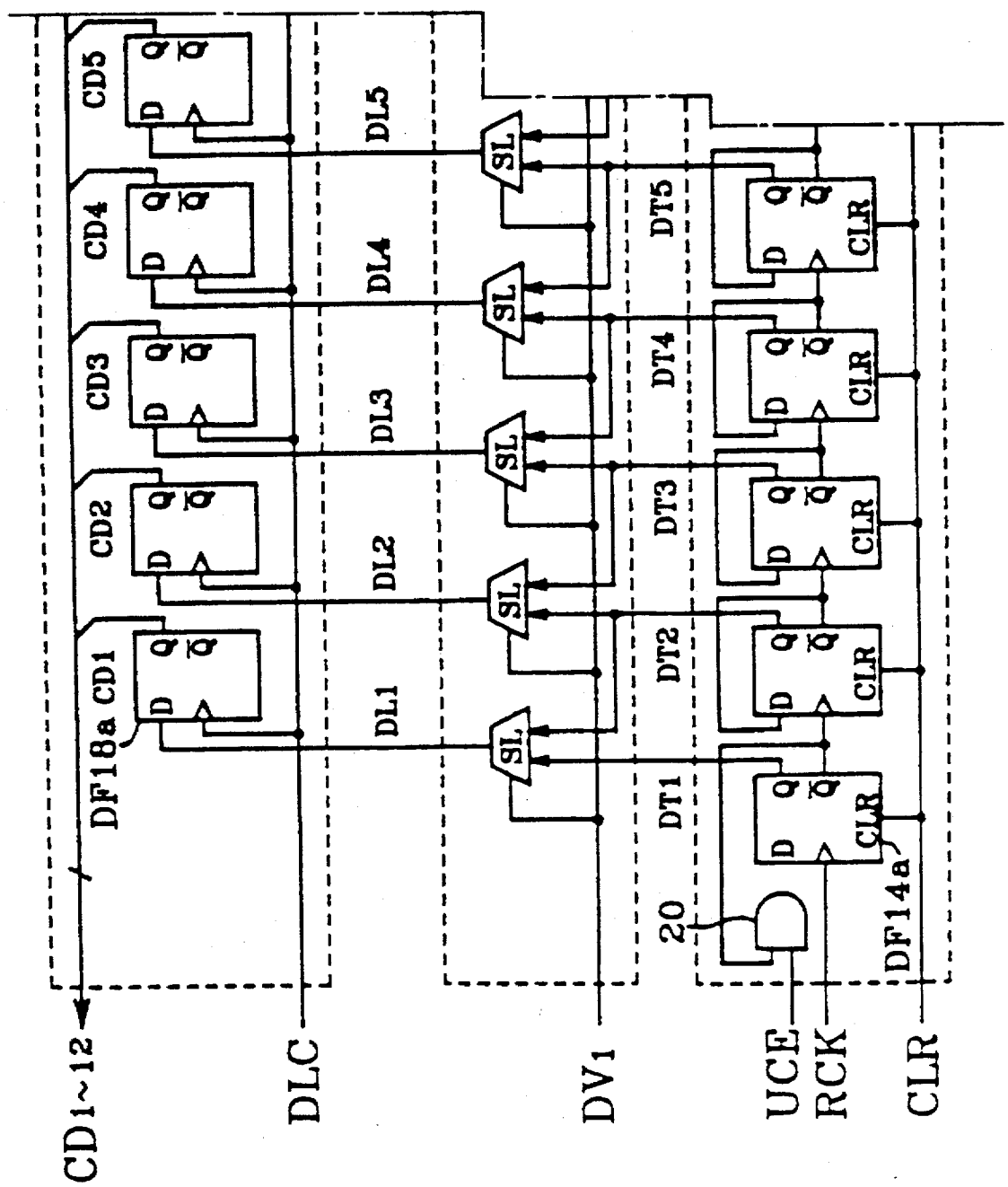
FIGS. 3(a) and 3(b) are a schematic diagram of the counter/data-latch circuit shown in FIG. 1.
Figure 3B:
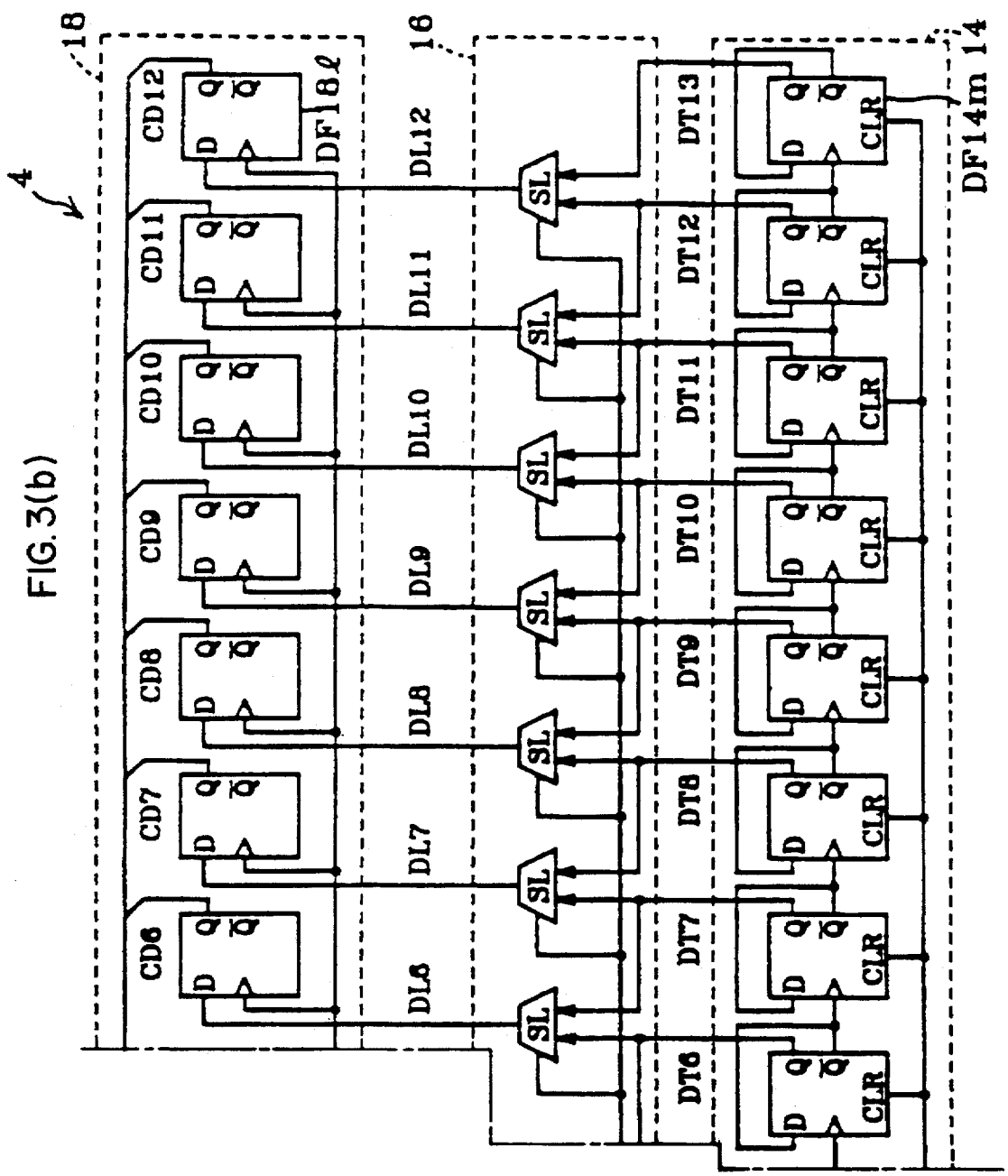

In FIG. 3, the counter/data-latch circuit 4 consists of a 13-bit counter 14 which is formed from thirteen latch circuits DF14a–DF14m (only DF14a and DF14m are labeled in the figure) and adapted to count the output clock RCK of the ring oscillator when it is supplied with the count enable signal UCE from the control circuit 6, a shift circuit 16 which is formed of twelve selectors SL which are adapted to receive pairs of bits out of 13-bit data DT1–DT13 (see FIG. 4(j)) output by the 13-bit counter 14 and select one of each bit pair depending on the external multiplier switching signal DV1, and a data latch circuit 18, as the data output means recited in the appended claims, which is formed from twelve latch circuits DF18a–DF18l (only DF18a and DF18l are labeled in the figure) which are adapted to latch 12-bit data DL1–DL12 generated by the selectors SL of the shift circuit 16 at the timing of the rising edge of the latch timing signal DLC (see FIG. 4(k)) provided by the digital oscillation circuit 2 and deliver 12-bit data as the frequency control data CD1–CD12 (see FIG. 4(l)) to the digital oscillation circuit 2. The latch timing signal DLC is synchronous with the output timing of the data latch signal DES from the control circuit 6.

The 13-bit counter 14 has the same connection for its thirteen latch circuits DF14a–DF14m as the 3-bit counter 8 in the control circuit 6, except that the first-stage latch circuit DF14a receives on its data terminal D its own inverted Q output by way of an AND gate 20 which has another input terminal supplied with the count enable signal UCE from the control circuit 6. The latch circuits DF14a–DF14m receive on their clear terminals the counter clear signal CLR from the control circuit 6.

Each of the twelve selectors SL which constitute the shift circuit 16 generates an output by selecting the left-hand input in FIG. 3, i.e., the low-order bit of a bit pair among the data DT1–DT13, if the multiplier switching signal DV1 is "1", or selecting the right-hand input, i.e., the high-order bit, if the multiplier switching signal DV1 is "0". Accordingly, if the multiplier switching signal DV1 is "1", the low-order 12-bit data DT1–DT12 is delivered to the data latch circuit 18, or if the DV1 signal is "0", the high-order 12-bit data DT2–DT13 is delivered to the data latch circuit 18.

Based on this configuration of the counter/data-latch circuit 4, the 13-bit counter 14 counts the output clock RCK generated by the ring oscillator only during the active period of the count enable signal UCE from the control circuit 6, and the data DT1–DT12 indicative of the count value or the data DT2–DT13 indicative of the count value divided by 2 is delivered by the shift circuit 16 to the data latch circuit 18.

The control circuit 6 generates the data latch signal DLS, and when the digital oscillation circuit 2 generates the latch timing signal DLC by being timed to the signal DLS, the data latch circuit 18 latches the data DL1–DL12 (DT1–DT12 or DT2–DT13) from the shift circuit 16 and delivers the latched 12-bit data CD1–CD12 as the frequency control data to the digital oscillation circuit 2. Thereafter, the control circuit 6 generates the counter clear signal CLR to clear the 13-bit counter 14.

Namely, the counter/data-latch circuit 4 operates in response to the signals from the control circuit 6 and has an operation cycle derived from eight periods of the reference signal PREF. In each cycle, it counts the output clock RCK of the ring oscillator when UCE is high during the third period of the reference signal PREF, thereby measuring the time of one period of the reference signal PREF; it latches 12-bit data of the count value or the count value divided by 2 when the DLC is high during the fifth period of the signal PREF, and it clears the count value when the CLR is high during the seventh period of the signal PREF.

Next, the digitally-controlled oscillation circuit 2 which produces an output signal POUT having a period specified by the frequency control data CD1–CD12 generated by the counter/data-latch circuit 4 (data latch circuit 18) will be explained with reference to FIG. 5. The digital oscillation circuit 2 of this embodiment includes a ring oscillator 22, as the pulse circulating circuit recited in the appended claims, which is formed from thirty-two inverting circuits in a ring configuration (explained in greater detail below) and generating sixteen multi-phase clocks R1–R16 having a prescribed phase interval Tg in response to an external high-level control signal PA and delivering the specific clock R13 as the output clock RCK to the counter/data-latch circuit 4 (13-bit counter 14); a pulse selector 24, as the selection means recited in the appended claims, which receives the multi-phase clocks R1–R16 from the ring oscillator 22, selects a clock signal based on 4-bit selection data D1–D4 (explained later), and presents the selected clock signal on the output terminal P1 if it is one of R1–R8 or on the output terminal P2 if it is one of R9–R16; and a down-counter 26, as the counting means recited in the appended claims, which has a presetting of high-order 8 bits CDH (CD5–CD12) of the frequency control data CD provided by the counter/data-latch circuit 4 and operates to down-count at the timing of the rising edge of the clock signal R13 provided by the ring oscillator 22.

The down-counter 26 is a known counter having a reset terminal, and it is preset to the high-order 8 bits (CDH) of the frequency control data CD at the rising edge of the clock signal (R13 from the ring oscillator 22) when the set signal SET on its set terminal is high. With the set signal being low, it down-counts the contents at every rising edge of the clock signal R13, and produces a high-level output signal CN2 when the count value is "2" or a high-level output signal CN1 when the count value is "1".

The digital oscillation circuit 2 further includes a 5-bit register 28 which holds 5-bit input data at the timing of the falling edge of a second detection signal AD2 (explained in greater detail below) and provides the data as selection data D1–D5; an adder 30 which sums the low-order four bits D1–D4 of the selection data from the register 28 and the low-order four bits (CDL) CD1–CD4 of the frequency control data CD provided by the counter/data-latch circuit 4 and presents 4-bit sum data D1–D4 and a 1-bit carry signal D5 to the register 28; a selector 32 which selects the output signal CN2 of the down-counter 26 if the carry signal D5 is "0" or the output signal CN1 if the signal D5 is "1" and provides the selected signal as an output signal SLO; a latch circuit 34 which latches the output signal SLO of the selector 32 at the timing of the rising edge of the clock signal R13 provided by the ring oscillator 22 and provides the signal as a first detection signal AD1; a latch circuit 36 which latches the first detection signal AD1 from the latch circuit 34 at the timing of the rising edge of the clock signal R5 provided by the ring oscillator 22; an inverter 38 which inverts the second detection signal AD2 from the latch circuit 36 and delivers the inverted AD2 signal to the clock terminal of the register 28; a latch circuit 40 which is cleared by an external low-level control signal PA and latches the control signal PC from the control circuit 6 at the timing of the rising edge of the clock signal R13 from the ring oscillator 22; and an OR gate 42 which takes the logical sum of the inverted signal of PCA of the latch circuit 40 and the first detection signal AD1 from the latch circuit 34 and provides the resulting OR-ed signal as the set signal SET of the down-counter 26.

The digital oscillation circuit 2 further includes a latch circuit 44 which latches the first detection signal AD1 from the latch circuit 34 at the timing of output of the clock signal from the output terminal P1 of the pulse selector 24; a latch circuit 46 which latches the second detection signal AD2 from the latch circuit 36 at the timing of output of the clock signal from the output terminal P2 of the pulse selector 24; an OR gate 48 which takes the logical sum of the output signals PQ1 and PQ2 of the latch circuits 44 and 46; a buffer 50 which delays the output signal AQ of the OR gate 48 by a prescribed time and generates a delayed output signal POUT; a NAND gate 52 which takes the negated logical product of the output signal AQ of the OR gate 48 and the output signal POUT of the buffer 50; an AND gate 54 which takes the logical product of the output signal of the NAND gate 52 and the output signal PCA of the latch circuit 40; a buffer 56 which amplifies the output signal of the AND gate 54 to produce a clear signal ACR for the latch circuits 44 and 46; an OR gate 58 which takes the logical sum of the first and second detection signals AD1 and AD2 from the latch circuits 34 and 36; a latch circuit 60 which latches the output signal AD3 of the OR gate 58 at the timing of the rising edge of the output signal POUT1; a NOR gate 62 which receives the inverted version of the clock signal from the output terminal P1 of the pulse selector 24, the output signal AQ of the OR gate 48 and the output signal PQ3 of the latch circuit 60 and delivers the resulting negated-logical-sum signal PS1 to the clock terminal of the latch circuit 44; and a NOR gate 64 which receives the inverted version of the clock signal from the output terminal P2 of the pulse selector 24, the output signal AQ of the OR gate 48 and the output signal PQ3 of the latch circuit 60 and delivers the resulting negated-logical-sum signal PS2 to the clock terminal of the latch circuit 46.

In the digital oscillation circuit 2 of this embodiment, the register 28 and adder 30 correspond to the data revision means in the appended claims; the selector 32 corresponds to the count number altering means in the appended claims; and the latch circuits 34 and 36 correspond to the detected signal output means in the appended claims. The latch circuits 44 and 46 are comparable with the latch circuit mentioned in the summary, and the OR gate 48 and buffer 50 are comparable with the output means recited in the claims.

The digital oscillation circuit 2 further includes a circuit for delivering the latch timing signal DLC to the counter/data-latch circuit 4 (data latch circuit 18), and it consists of an AND gate 66 which takes the logical product of the data latch signal DLS from the control circuit 6 and the inverted signal of PCA from the latch circuit 40; a latch circuit 68 which is cleared by a low-level output signal PCA from the latch circuit 40 and latches the data latch signal DLS from the control circuit 6 at the timing of the falling edge of the second detection signal AD2; and an OR gate 70 which takes the logical sum of the output signal CK3 of the AND gate 66 and the output signal DLB of the latch circuit 68 and presents the resulting OR-ed signal as the latch timing signal DLC.

Figure 6:
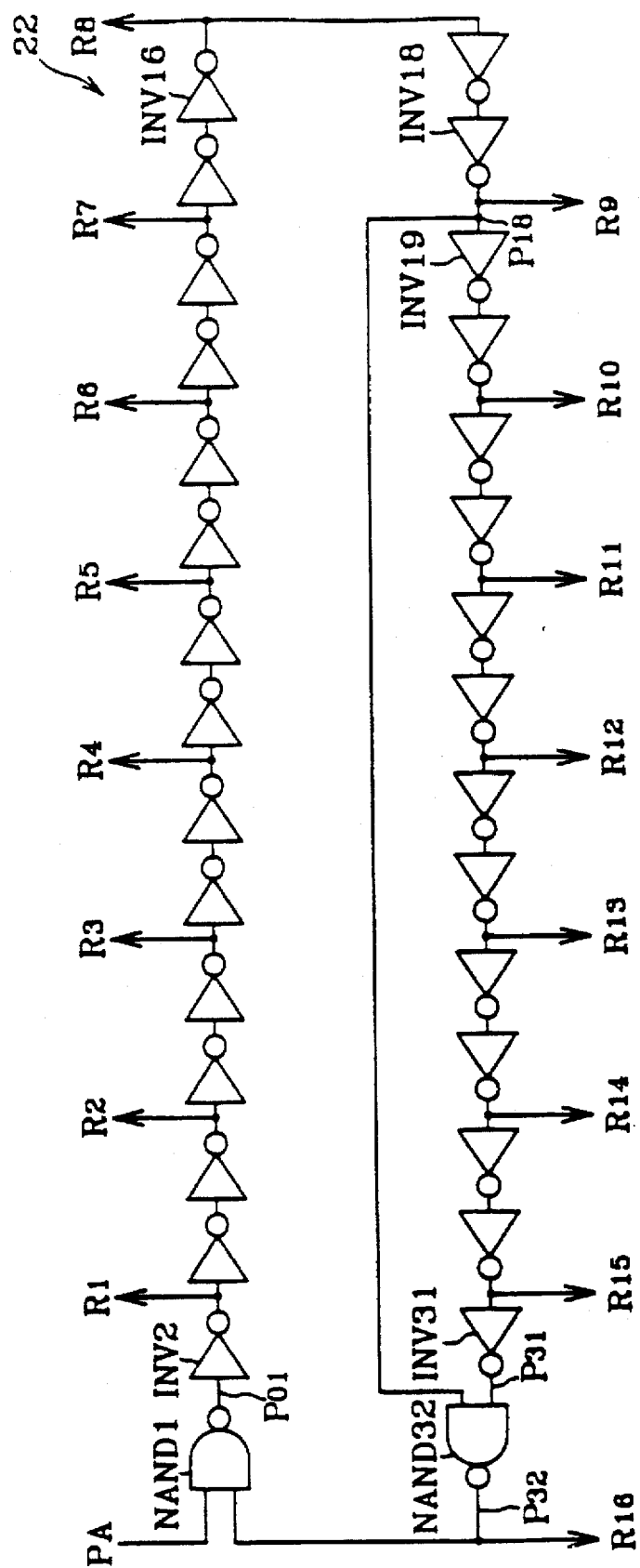
FIG. 6 is a schematic diagram of the ring oscillator shown in FIG. 5.

In FIG. 6, the ring oscillator 22 consists of two 2-input NAND gates NAND1 and NAND32 and thirty inverters INV2–INV31 as inverting circuits. These inverting circuits are in a ring configuration and have the output terminal of each preceding stage connected to the input terminal of the following stage. The NAND32 has one input terminal connected to the output terminal of the inverter INV31 and another input terminal (which will be called the control terminal) supplied with the output signal of the inverter INV18, and has its output terminal connected to an input terminal of the gate NAND1, which has another input terminal supplied with the external control signal PA.

Among the series-connected NAND gates and inverters, the inverting circuits of the even-numbered positions counted from NAND1 have output terminals for providing the multi-phase clocks R1–R16, and these output terminals are all connected to the pulse selector 24. The output terminal for the clock signal R13 is connected to the clock terminals of the down-counter 26 and latch circuit 34, and the output terminal for the clock signal R5 is connected to the clock terminal of the latch circuit 36.

The operation of the ring oscillator 22 arranged as explained above is described in detail in Japanese Patent Laid-Open No. 6-216721, incorporated herein by reference, and is summarized below in connection with FIGS. 7(a)–7(e). Initially, when the control signal PA is low (see FIG. 7(a)), the NAND gate NAND1 produces a high P01 output (see FIG. 7(b)), causing the even-numbered inverters and odd-numbered inverters counted from the NAND1 to produce low-level outputs and high-level outputs, respectively, and the whole circuit settles. In this initial state, however, the NAND gate NAND32 which receives a low-level output P18 of the inverter INV18 (see FIG. 7(c)) on its control terminal produces a high-level output even though it has the even-numbered position.

When the control signal PA goes from low to high, the output of NAND gate NAND1 transitions and is propagated as the main edge of the falling outputs of the odd-numbered inverters and rising outputs of the even-numbered inverters (indicated by the marks "·" in FIGS. 7(a)–7(e)). The NAND gate NAND32 which receives the main edge from the inverter INV18 on its control terminal makes a transition of output prior to the output transition of the inverter INV31 (see FIG. 7(d)), and the output transition is propagated as the reset edge of the rising outputs of the odd-numbered inverters and falling outputs of the even-numbered inverters (indicated by the marks "x" in FIGS. 7(a)–7(e)).

As a result, two pulse signals (a main edge and a reset edge) of separate timings of occurrence circulate on the same ring path of the ring oscillator 22. The gate NAND1 makes an output transition in response to the reset edge before its own main edge returns, the gate NAND32 makes an output transition in response to the main edge before its own reset edge returns, and the ring oscillator 22 circulates the pulse signal continuously instead of having a stable state. The ring oscillator 22 generates from its output terminals the multi-phase clocks R1–R16 having a period that is the inversion time Td of each inverter multiplied by 32, with clocks of adjacent terminals having a phase difference Tg that is twice the inversion time Td.

Figure 8A:
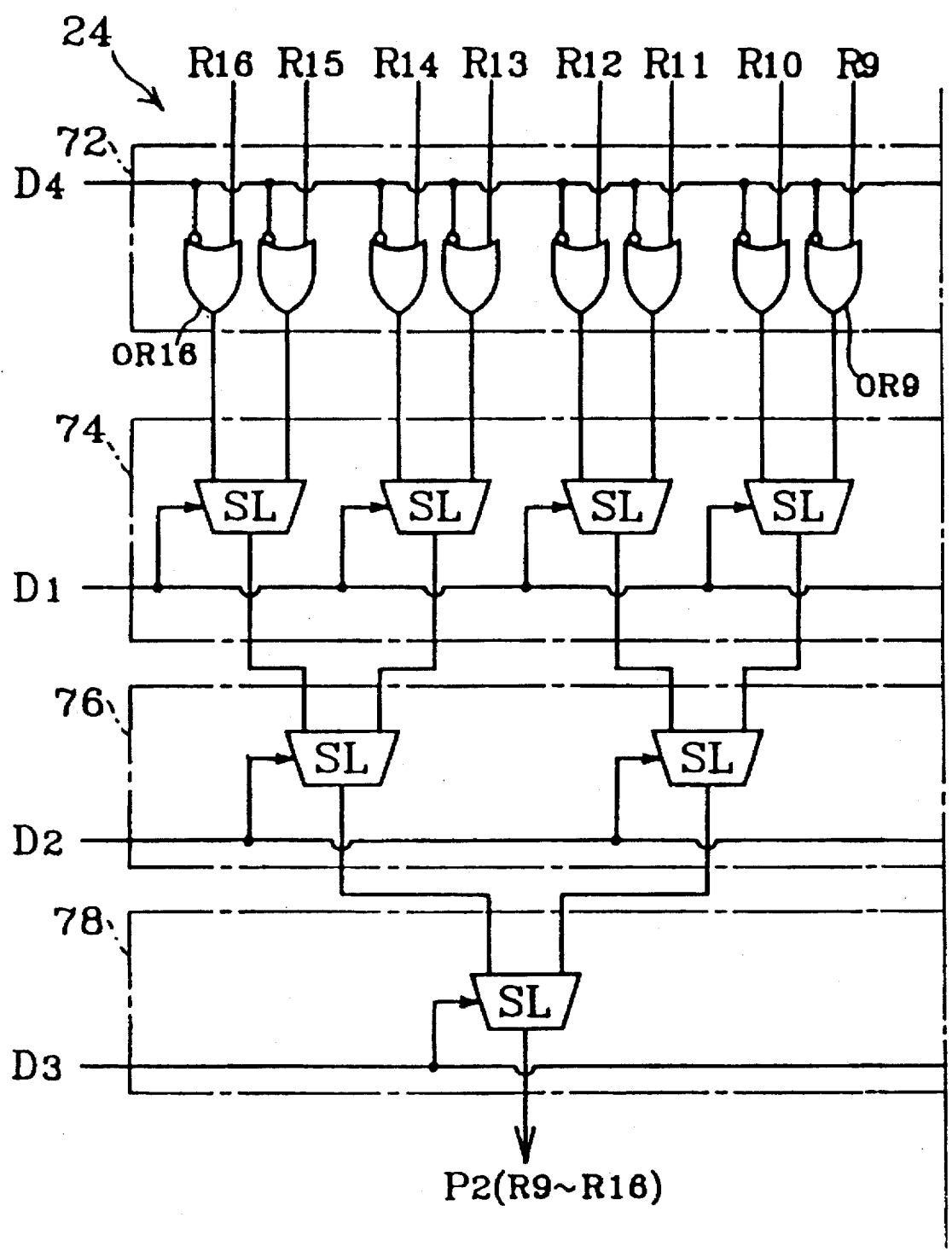
FIGS. 8(a) and 8(b) together represent a schematic diagram of the pulse selector shown in FIG. 5.
Figure 8B:
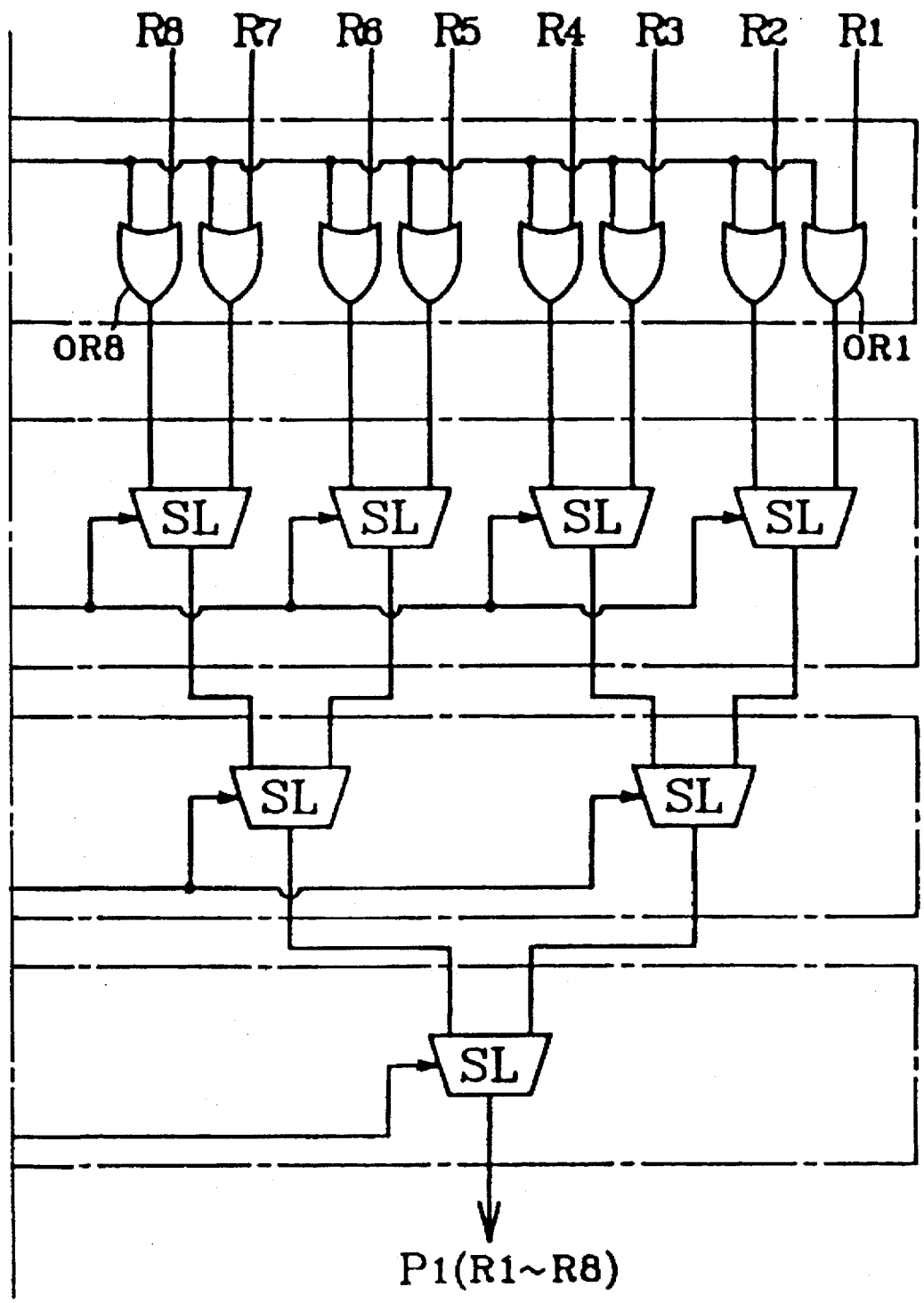

In FIG. 8, the pulse selector 24 consists of an OR gate circuit 72 including eight OR gates OR1–OR8 (only OR1 and OR8 are labeled) which receive the multi-phase clocks R1–R8 from the ring oscillator 22 correspondingly on first ones of their input terminals and the bit-4 signal D4 of the selection data D1–D5 provided by the register 28 on second ones of their input terminals; eight OR gates OR9–OR16 (only OR9 and OR16 are labeled) which receive the remaining multi-phase clocks R9–R16 correspondingly on first ones of their input terminals and the inverted signal of D4 on second ones of their input terminals; a first selector circuit 74 including eight selectors SL each of which receives a pair of output signals of a corresponding pair of OR gates among the gates OR1–OR16 and selects one signal depending on the bit-1 signal D1 of the selection data D1–D5; a second selector circuit 76 including four selectors SL, each of which receives a pair of output signals of a corresponding pair of selectors SL of the first selector circuit 74 and selects one signal depending on the bit-2 signal D2 of the selection data D1–D5; a third selector circuit 78 including two selectors SL, each of which receives a pair of output signals of a corresponding pair of selectors SL of the second selector circuit 76 and selects one signal depending on the bit-3 signal D3 of the selection data D1–D5.

Each of the selectors SL of the first, second and third selector circuits 74, 76 and 78 selects the right-hand input in FIG. 8 if the respective selection bit signal (D1–D3) is "0", or selects the left-hand input if the respective bit signal is "1". Among the two selectors SL of the third selection circuit 78, the selector SL corresponding to the OR gates OR1–OR8

Figure 5A:
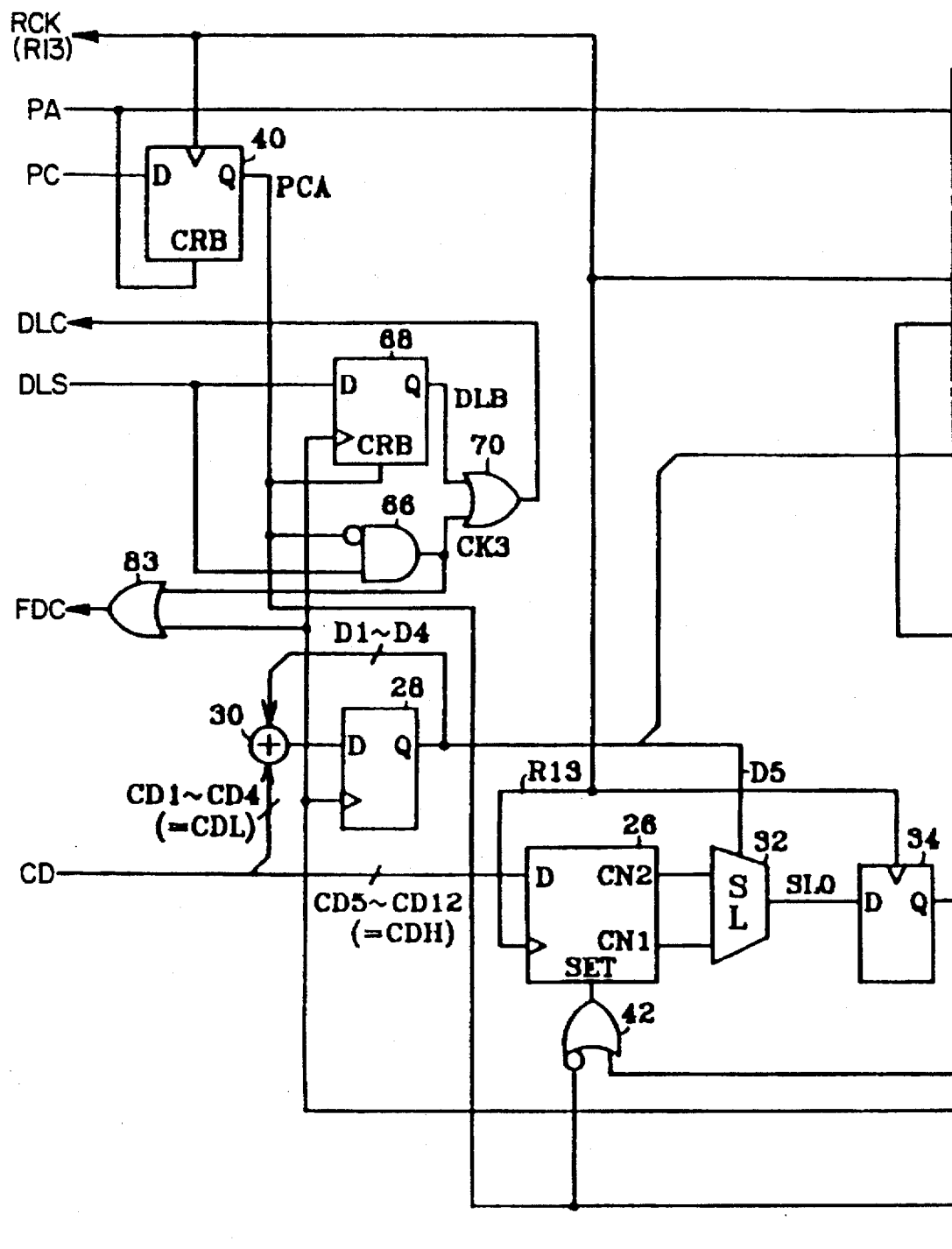
FIGS. 5(a) and 5(b) are a schematic diagram of the digital oscillation circuit shown in FIG. 1.
Figure 5B:
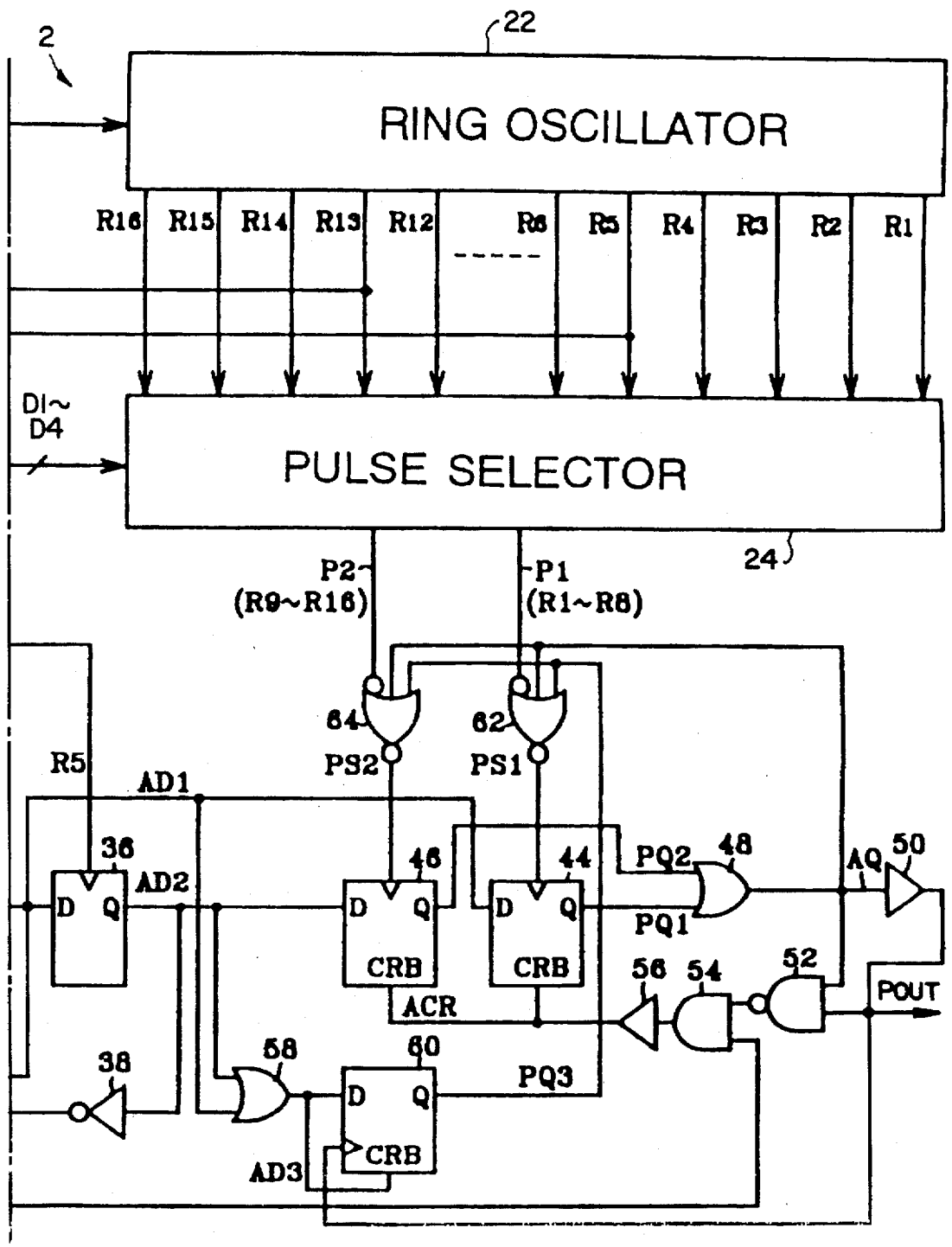

(or clock signals R1–R8) has its output terminal P1 connected to the NOR gate 62 of FIG. 5, and another selector SL corresponding to the OR gates OR9–OR16 (or clock signals R9–R16) has its output terminal P2 connected to the NOR gate 64.

Based on this arrangement of the pulse selector 24, if the selection data D1–D4 has a value in the range of "0" to "7" (i.e., if D4 is "0") a clock signal out of R1–R8 numbered by the value of data D1–D4 increased by 1 is generated at the output terminal P1 and the output terminal P2 is kept at a high level. Similarly, if the selection data D1–D4 has a value in the range of "8" to "15" (i.e., if D4 is "1") a clock signal out of R9–R16 numbered by the value of data D1–D4 increased by 1 is generated at the output terminal P2 and the output terminal P1 is kept at a high level.

For example, if the input selection data D1–D4 is "0101" having a value of "5", the first selector circuit 74 responds to D1 of "1" to select the outputs of the OR gates OR2, OR4, OR6, OR8, OR10, OR12, OR14 and OR16, the second selector circuit 76 responds to D2 of "0" to select the outputs of the OR gates OR2, OR6, OR10 and OR14, and the third selector circuit 78 responds to D3 of "1" to select the outputs of the OR gates OR6 and OR14. Since D4 is "0", the OR gates OR9–OR16 produce high-level outputs, and the ring oscillator 22 provides the clock signal R6 at the output terminal P1, with another output terminal P2 being kept at a high level. In another example, if the input selection data D1–D4 is "1101" having a value of "13", the OR gates OR1–OR8 produce high-level outputs, and the ring oscillator 22 generates the clock signal R14 from the output terminal P2, with another output terminal P1 being kept at a high level.

Next, the operation of the digital oscillation circuit 2 arranged as described above will be explained in connection with FIGS. 9(a)–9(t) by using as an example frequency control data CD having low-order 4 bits CDL (CD1–CD4) which are "0001". These Figures show the operation after the digital oscillation circuit 2 has started until the operation proceeds to the second cycle. The signal named "CNT VAL." used in FIG. 9(f) signifies the count value of the down-counter 26.

When the ring oscillator 22 starts the pulse signal circulating operation by receiving a high-level control signal PA, the multi-phase clocks R1–R16 having a period that is the circulation time of the main edge of the pulse signal in the ring oscillator 22 (i.e., 32Td) and a phase interval Tg of 2Td are fed to the pulse selector 24. The down-counter 26 and latch circuits 34 and 40 receive the clock signal R13 of the thirteenth phase order with respect to R1, and the latch circuit 36 receives the clock signal R5 of the fifth phase order that lags in phase from R13 by a half circulation time (16Td). The counter/data-latch circuit 4 (13-bit counter 14) is supplied with the clock signal R13 as the output clock RCK (see FIG. 9(a)).

At the time when the operation start signal PSTB is not yet supplied to the control circuit 6 from the outside of the clock multiplying device 1, the circuit 6 generates a low-level control signal PC as shown in FIG. 9(c), and the latch circuit 40 latches the low PC signal in response to the clock signal R13 and generates a low-level output signal PCA. Consequently, the OR gate 42 generates a high-level set signal SET (see FIG. 9(e)), causing the down-counter 26 to be preset to the high-order 8 bits CDH (CD5–CD12) of the frequency control data CD (see FIG. 9(d)) from the counter/data-latch circuit 4 at the rising edge of the clock signal R13. The latch circuits 44 and 46 are cleared by a low-level clear signal ACR (see FIG. 9(p)) produced by the AND gate 54 and buffer 56.

Accordingly, when the control signal PC is low, the output signals CN1, CN2, SLO, AD1, AD2, PQ1 and PQ2 of the down-counter 26, selector 32 and latch circuits 34, 36, 44 and 46 (see FIGS. 9(h), 9(g), 9(i), 9(j), 9(k)) are all low, and the output signal POUT (see FIG. 9(o)) is also kept low. The latch circuits 34 and 36 have their respective first and second detection signals AD1 and AD2 kept low, and the latch circuit 60 is cleared to generate a low output signal PQ3.

During the low period of the output signal PCA of the latch circuit 40, the data latch signal DLS (see FIG. 9(q)) generated by the control circuit 6 is delivered intact as the latch timing signal DLC (see FIG. 9(r)) to the counter/data-latch circuit 4 (data latch circuit 18) by way of the AND gate 66 and OR gate 70, and therefore the counter/data-latch circuit 4 delivers to the digital oscillation circuit 2 the frequency control data CD1–CD12 indicative of the count value of the output clock RCK (R13) generated by the ring oscillator 22 within one period of the reference signal PREF (i.e., the coded value of one period of PREF at a resolution of the output clock RCK) or a half of the count value.

When the latch circuit 40 generates a low-level output signal PCA, the register 28 is in a cleared state, and the selection data D1–D4 fed to the pulse selector 24 and the carry signal D5 fed to the selector 32 have initial values "0000" and "0", respectively. Accordingly, the latch circuit 44 receives on its clock terminal the clock signal R1 with the earliest phase order among the multi-phase clocks R1–R16 from the output terminal P1 of the pulse selector 24 by way of the NOR gate 62, as shown by signal PS1 in FIG. 9(l). The output terminal P2 is kept at a high level, and the latch circuit 46 has its clock terminal kept at a high level as shown by signal PS2 in FIG. 9(m).

Thereafter, when the control signal PC goes high, the latch circuit 40 produces a high-level output signal PCA in response to the next clock signal R13, causing the set signal SET of the down-counter 26 and the clear signal ACR of the latch circuits 44 and 46 to become low and high, respectively.

Subsequently, the down-counter 26, which has received for the initial value the high-order 8 bits (CD5–CD12) of the frequency control data CD from the counter/data-latch circuit 4 down-counts in response to every clock signal R13, and produces a high-level output signal CN2 when the count value becomes "2" and a high-level output signal CN1 when the count value becomes "1".

Since the register 28 generates a "0" carry signal D5 immediately after the control signal PC has risen, the selector 32 selects and generates the output signal CN2 of the down-counter 26. The output signal SLO from the selector 32 is latched by the latch circuit 34 at the timing of the rising edge of the clock signal R13, and accordingly it signifies that the latch circuit 34 generates as the first detection signal AD1 the signal SLO delayed by one circulation time (16Tg or 32Td) of the ring oscillator 22.

At the time when the output signal PCA of the latch circuit 40 rises and the down-counter 26 starts counting, the selector 32 generates a high-level output CLO when the count value of the down-counter 26 is "2", and thereafter on expiration of one circulation time of the ring oscillator 22 (i.e., at the time when the down-counter 26 has a count value of "1"), the first detection signal AD1 from the latch circuit 34 goes high. During the high-level period of the first detection signal AD1, which is equal to one period of the clock signal R13, if the pulse selector 24 generates the clock signal R1 of the ring oscillator 22 from the output terminal P1, the output signal PQ1 of the latch circuit 44 goes high.

Consequently, the OR gate 48 generates a high-level output signal AQ, causing the outputs PS1 and PS2 of the NOR gates 62 and 64 to be kept at a low level, thereby preventing the rising edge from being delivered to the clock terminal of the latch circuits 44 and 46, and the buffer 50 generates a high-level output signal POUT on expiration of its delay time. The delivery of the output signal POUT causes the latch circuit 60 to generate a high-level output PQ3, thereby preventing the rising edge from being delivered by the NOR gates 62 and 64 to the clock terminal of the latch circuits 44 and 46.

After the output signal POUT has been generated, the NAND gate 52 produces a low-level output, which becomes a low-level clear signal ACR by way of the AND gate 54 and buffer 56, by which the latch circuits 44 and 46 are cleared. Then, the OR gate 48 produces a low-level output signal AQ, which causes the clear signal ACR to return to a high level and causes the output signal POUT to return to a low level on expiration of the delay time of the buffer 50.

Since the first detection signal AD1 from the latch circuit 34 is latched by the latch circuit 36 at the timing of the rising edge of the next clock signal R5 from the ring oscillator 22, a signal derived from the first detection signal AD1 and delayed by a half circulation time (8Tg or 16Td) of the ring oscillator 22 is delivered as the second detection signal AD2 by the latch circuit 36 to the data terminal of the latch circuit 46. In this case, however, the selection data D1–D4 fed to the pulse selector 24 has a value within the range of "0"–"7" and the latch circuit 46 has its clock terminal kept at a high level, the output signal PQ2 of the latch circuit 46 stays at a low level.

When the second detection signal AD2 from the latch circuit 36 turns from high to low, the latch circuit 68 latches the data latch signal DLS from the control circuit 6 and delivers the signal as the latch timing signal DLC to the counter/data-latch circuit 4. Accordingly, once the digital oscillation circuit 2 starts the oscillating operation in response to the rise of the control signal PC to a high level, the data latch signal DLS from the control circuit 6 is delivered to the counter/data-latch circuit 4 by being timed to the fall of the second detection signal AD2.

The above description is the operation of the digital oscillation circuit 2 of the first cycle after the control signal PC has risen until the output signal POUT makes a first transition to a high level.

Next, the operation of the second cycle of the digital oscillation circuit 2 will be explained. As shown in FIG. 9(j), when the first detection signal AD1 from the latch circuit 34 goes high, the down-counter 26 has a high-level set signal SET (FIG. 9(e), and it has a new setting of the high-order 8 bits CDH (CD5–CD12) of the frequency control data CD (FIG. 9(d)) in response to the generation of the next clock signal R13 by the ring oscillator 22.

The adder 30 sums the present selection data D1–D4 to the pulse selector 24 and the low-order 4 bits CDL (CD1–CD4) of the frequency control data CD from the counter/data-latch circuit 4 to produce and deliver 5-bit data D1–D5 made up of 4-bit summed data D1–D4 and a carry signal D5 to the register 28, and the register 28 latches and generates the 5-bit data in response to the transition from high to low of the second detection signal AD2 (FIG. 9(k)) from the latch circuit 36.

Accordingly, when the second detection signal AD2 from the latch circuit 36 goes low, the pulse selector 24 receives new selection data D1–D4 resulting from the summation of the previous selection data D1–D4 and the low-order 4-bits CDL (CD1–CD4) of the frequency control data CD, and in the operation of the second cycle with the input of "0001" for the low-order 4 bits CDL of the frequency control data CD, the pulse selector 24 newly receives selection data D1–D4 of "0001" and the ring oscillator 22 generates from its output terminal P1 the clock signal R2 having the second phase order with respect to R1 among the multi-phase clocks R1–R16.

Thereafter, the down-counter 26 down-counts at the timing of the rising edge of the clock signal R13 in the same manner as the first cycle explained previously, and when the ring oscillator 22 generates the clock signal R2 after the count value has become "2" and the output signal SLO (FIG. 9(i)) of the selector 32 has gone high and the first detection signal AD1 of the latch circuit 34 has gone high, the output signal PQ1 of the latch circuit 44 goes high and the buffer 50 generates a high-level output signal POUT (FIG. 9(o)).

During the operation of the third to eighth cycles, the selection data D1–D4 fed to the pulse selector 24 is incremented by one, such as "0010" to "0011", . . . to "0111", at every fall of the second detection signal AD2 of the latch circuit 36 (at every rise of the output signal POUT), and the pulse selector 24 selects and delivers the clock signals R3, R4, . . . R8 of the ring oscillator 22 sequentially to the clock terminal of the latch circuit 44 in the same manner as the second cycle.

The selection data D1–D4 to the pulse selector 24 is revised successively and when the value exceeds "7" into the range of "8"–"15", then the pulse selector 24 has its output P1 fixed to a high level and another output terminal P2 releasing clock signals that correspond to the selection data D1–D4.

Accordingly, in the operation of the ninth to sixteenth cycles, i.e., the selection data D1–D4 has values of "8"–"15", with the input of "0001" for the low-order 4 bits CDL of the frequency control data CD, the latch circuit 44 has its output signal PQ1 staying low and the latch circuit 46 has its output signal PQ2 going high in response to the generation of any of the clock signals R9–R16 from the output terminal P2 of the pulse selector 24 during the high-level output of the second detection signal AD2 from the latch circuit 36, and the buffer 50 generates high-level output signals POUT accordingly.

In the digital oscillation circuit 2 of this embodiment, the multi-phase clocks R1–R16 produced by the ring oscillator 22 are divided in terms of the phase order into two groups of R1–R8 and R9–R16, the down-counter 26 is adapted to count the clock signal R13 in the latter phase order group, the latch circuits 44 and 46 are used for these clock signal groups correspondingly, of which when the selection data D1–D4 has a value of the range "8"–"15" for the pulse selector 24 to select any of clock signals R9–R16, the latch circuit 46 latches at the output timing of the clocks R9–R16 the second detection signal AD12 generated by the latch circuit 36 by being delayed by a half circulation time of the ring oscillator 22 with respect to the first detection signal AD1 from the latch circuit 34, and the output signal POUT is generated when the output signal PQ2 of the latch circuit 46 goes high. The above-mentioned scheme is based on the following reason.

In this digital oscillation circuit 2, the down-counter 26 always counts the clock signal R13, while the clock signal selected by the pulse selector 24 is shifted progressively. On this account, if the latch circuits 36 and 46 are absent and the pulse selector 24 delivers the clock signal selected depending on the selection data D1–D4 only to the clock terminal of the latch circuit 44, and in case the pulse selector 24 selects at first a clock signal among R1–R12 with a phase order earlier than the clock signal R13 and next selects a clock signal with a phase order later than the R13, the interval of output from one output signal POUT to the next POUT becomes shorter by one circulation time of the ring oscillator 22.

A conceivable scheme is to design the down-counter 26 to count a clock signal having an intermediate phase between the earliest phase of the clock signal R1 and the latest phase of the clock signal R16 (e.g., an inverted signal of the output P01 of the NAND gate NAND1 in FIG. 6). In this case, however, when the pulse selector 24 selects the clock signal with the earliest phase, the latch circuit 44 has its clock signal rising immediately after the transition of the signal level on the data terminal, resulting in degraded stability of the latching operation.

In this case of the arrangement, with the latch circuits 44 and 46 being removed, when the pulse selector 24 selects a clock signal later in phase than the clock signaller R13 counted by the down-counter 26, the latch circuit 44 has its clock signal rising immediately after the transition of the signal level on the data terminal, resulting in a degraded stability of the latching operation.

Therefore, the digital oscillation circuit 2 of this embodiment is designed such that the first and second detection signals AD1 and AD2 generated by the latch circuits 34 and 36 and the latch circuits 44 and 46 which receive these signals on their data terminals are made correspondent to the clock signal groups R1–R8 and R9–R16, so that the pulse selector 24 delivers the clock signal selected depending on the selection data D1–D4 only to the clock terminal of the latch circuit that is relevant to the group of that clock signal. The second detection signal AD2 which is delivered to the data terminal of the latch circuit 46 in correspondence to the clock signals R9–R16 has its phase delayed by a half circulation time (16Td or 8Tg) relative to the first detection signal AD1 to the latch circuit 44 corresponding to the clock signals R1–R8, so that it goes high after the generation of the clock signal R1 of the earliest phase.

Consequently, in the digital oscillation circuit 2 of this embodiment, for at least the clock signal R13 counted by the down-counter 26 and the clock signals R14–R16 later in phase than R13, a clock signal generated by the ring oscillator 22 immediately after the latch circuit 34 has generated the first detection signal AD1 is ignored, and when the pulse signal of the same phase is generated in the next circulation, the second detection signal AD2 is latched by the latch circuit 46 and the output signal POUT is generated.

Accordingly, the digital oscillation circuit 2 is capable of producing an output signal POUT of accurate period even in case the pulse selector 24 first selects a clock signal R1–R12 earlier in phase than the clock signal R13 and next selects a clock signal R14–R16 later in phase than R13.

Moreover, in the digital oscillation circuit 2 of this embodiment, the time since the input of the first or second detection signal AD1 or AD2 to the data terminal of the latch circuits 44 and 46 until the input of the clock signal to their clock terminal can be at least a quarter circulation time (8Td or 4Tg) of the ring oscillator 22, and therefore the latch circuits 44 and 46 can surely latch and generate the first and second detection signals AD1 and AD2 in response to the generation of clock signals of the relevant groups, resulting in reliable frequency control.

During the operation, with the selection data D1–D4 to the pulse selector 24 being revised progressively, when the data value exceeds "1111" which corresponds to the clock signal R16 and the carry signal D5 becomes "1", the selector 32 selects and generates CN1 that goes high when the count value becomes "1" among the output signals CN2 and CN1 of the down-counter 26. The latch circuit 34 generates a high-level signal thereafter on expiration of one circulation time of the ring oscillator 22 (i.e., when the down-counter 26 has a count value of "0").

The reason for this operation is as follows. The down-counter 26 operates to down-count at a constant period (16Tg) in response to the clock signal R13, and therefore if the clock signal selected this time by the pulse selector 24 is of a more prior stage of the ring oscillator 22 than the clock signal selected previously, i.e., if the selection data D1–D4 fed to the pulse selector 24 has a smaller value than the previous one, the period of the output signal POUT becomes shorter by one circulation time of the ring oscillator 22.

Therefore, the selector 32 is adapted to select the output signal CN1 of the down-counter 26 only when the carry signal D5 from the register 28 is "1", so that the number of counts of the down-counter 26 counted until the detection signals AD1 and AD2 are generated by the latch circuits 34 and 36 is practically increased by one.

In this manner, in the digital oscillation circuit 2 of this embodiment, the down-counter 26 counts the clock signal R13 to detect the arrival of the number of times of circulation of the pulse signal in the ring oscillator 22 at the value of the high-order 8 bits CDH of the frequency control data CD and the output signal POUT is brought to a high level if a clock signal selected by the pulse selector 24 is generated after the above-mentioned detection, and the clock signal selection data D1–D4 for the pulse selector 24 is revised by incrementing the low-order 4 bits CDL of the frequency control data CD in every period of the output signal POUT. In case the selection data D1–D4 becomes smaller than the previous value, the value to be counted by the down-counter 26 is increased by one so as to prevent the oscillation period from becoming shorter by one circulation time of the ring oscillator 22.

In the operation of the second and following cycles, the phase order of the clock signal selected by the pulse selector 24 is shifted by the value of CDL progressively, and a high-level output signal POUT is generated at a time interval that is the sum of the time length in which the pulse signal from the oscillator 2 circulates in the ring oscillator 22 a number of times indicated by the high-order 8 bits CDH of the frequency control data (32Td·CDH) and the delay time of two inverting circuits (phase difference time Tg of multi-phase clocks) multiplied by the value of low-order 4 bits CDL of the frequency control data CD.

According to the digital oscillation circuit 2 of this embodiment, it is possible to adjust the output period of the output signal POUT (oscillation period of the clock multiplying device) by altering the externally-supplied frequency control data CD. Moreover, the oscillation period can be coarsely determined in terms of the number of count of the down-counter 26, i.e., the high-order 8 bits CDH of the frequency control data CD and it can be finely adjusted based on the low-order 4 bits CDL of the frequency control data CD at a resolution of the inversion time of two inverting circuits (2Td), whereby it is possible to control the oscillation period in digital manner in a wide range and at a fine resolution. The digital oscillation circuit 2 can operate to oscillate without halting the ring oscillator 22, and it is possible to set an oscillation frequency that is proportional to the value of the digital data. Owing to the elimination of the need of halting the ring oscillator 22, it is possible to set a much shorter oscillation period.

In the clock multiplying device 1 having the foregoing digitally-controlled oscillation circuit 2, the ring oscillator 22 starts the pulse signal circulating operation in response to the application of the external control signal PA to deliver the output clock RCK (clock signal R13) to the counter/ data-latch circuit 4, and the 13-bit counter 14 in the counter/ data-latch circuit 4 counts the output clock RCK from the ring oscillator during the third period of the external reference signal PREF to produce 13-bit data DT1–DT13 which represents one period of the reference signal PREF coded in units of one period (32Td) of the output clock RCK.

With a high-level ("1") multiplier switching signal DV1 being applied, the data latch circuit 18 in the counter/data-latch circuit 4 latches the low-order 12 bits DT1–DT12 output of the 13-bit data DT1–DT13 during the fifth period of the reference signal PREF, and the latched 12-bit data is fed as the frequency control data CD to the digital oscillation circuit 2. With a low-level ("0") multiplier switching signal DV1 being applied, the data latch circuit 18 latches the high-order 12 bits DT2–DT13 output of the 13-bit data DT1–DT13 during the fifth period of the reference signal PREF, and the latched 12-bit data is fed as the frequency control data CD.

During the seventh period of the reference signal PREF, the external operation start signal PSTB is latched by the control circuit 6 and delivered as the control signal PC to the digital oscillation circuit 2. Accordingly, for initiating the clock multiplying device 1, the control signal PA is raised, and the operation start signal PSTB is raised after at least five periods of the reference signal PREF have been fed to the control circuit 6. Then, the control signal PC goes high in the seventh period of the reference signal PREF, and the digital oscillation circuit 2 generates the output signal POUT having a period that corresponds to the frequency control data CD (CD1–CD12) from the counter/data-latch circuit 4.

The counter/data-latch circuit 4 produces and generates frequency control data CD for every eighth period of the reference signal PREF, and the digital oscillation circuit 2 bases the oscillating operation always on the newest frequency control data CD.

The 13-bit data DT1–DT13 from the 13-bit counter 14 is the result of coding for one period of the reference signal PREF at a resolution of one period (32Td) of the output clock RCK from the ring oscillator 22, while the digital oscillation circuit 2 controls the oscillation period at a resolution of the phase difference time Tg (2Td) of the multi-phase clocks R1–R16, and therefore when the multiplier switching signal DV1 is set to "1", the digital oscillation circuit 2 produces an oscillation signal having a frequency that is the frequency of the reference signal PREF multiplied by the total number of clock signals (16) generated by the ring oscillator 22. When the multiplier switching signal DV1 is set to "0", the digital oscillation circuit 2 produces an oscillation signal having a frequency that is the frequency of the PREF signal multiplied by 32.

According to the clock multiplying device 1 of this embodiment, it is possible to produce an oscillation signal having the frequency of the reference signal multiplied by a prescribed number based on such a very simple circuit arrangement as for counting the output clock RCK produced by the ring oscillator 22 during one period of the reference signal PREF. The inventive clock multiplying device 1 uses a common ring oscillator 22 for coding the period of the reference signal PREF and for controlling the output frequency, and accordingly it operates stably for frequency multiplication even if operational conditions such as the ambient temperature and power voltage vary.

Although the multi-phase clock generator for generating the multi-phase clocks R1–R16 in the digital oscillation circuit 2 may include a plurality of fixed frequency oscillators (e.g., crystal oscillators) of the same oscillation frequency, with the oscillation start timing of each oscillator being controlled so that the oscillators generate clock signals at a prescribed phase interval, this embodiment employs a ring oscillator 22 formed from inverting circuits in a ring configuration, and the clock multiplying device can be made more compact.

The resulting compact clock multiplying device 1 can be used for the clock generator of an LSI device. Specifically, an oscillation circuit is formed from inverting circuits in the LSI circuit and resistors and capacitors in the LSI circuit or attached externally to the LSI circuit, and the oscillation signal of this oscillation circuit is used for frequency multiplication to produce the clock signal for the LSI device.

Based on this arrangement for clock signal generation for an LSI device, the oscillation frequency can be set lower by using resistors of low resistance and capacitors of large capacitance so that the frequency is stable against the variation of the ambient temperature and power voltage, and yet a clock signal having a highly multiplied frequency can be supplied to the LSI device, whereby an oscillation circuit which is inexpensive and reliable with respect to variations in operating environments can be offered.

Next, a clock multiplying device based on a second embodiment of this invention capable of accurately producing an oscillation signal having a frequency that is 2n times (n is 3 in this embodiment) as high as the output frequency of the clock multiplying device 1 of the first embodiment will be explained.

Figure 10:
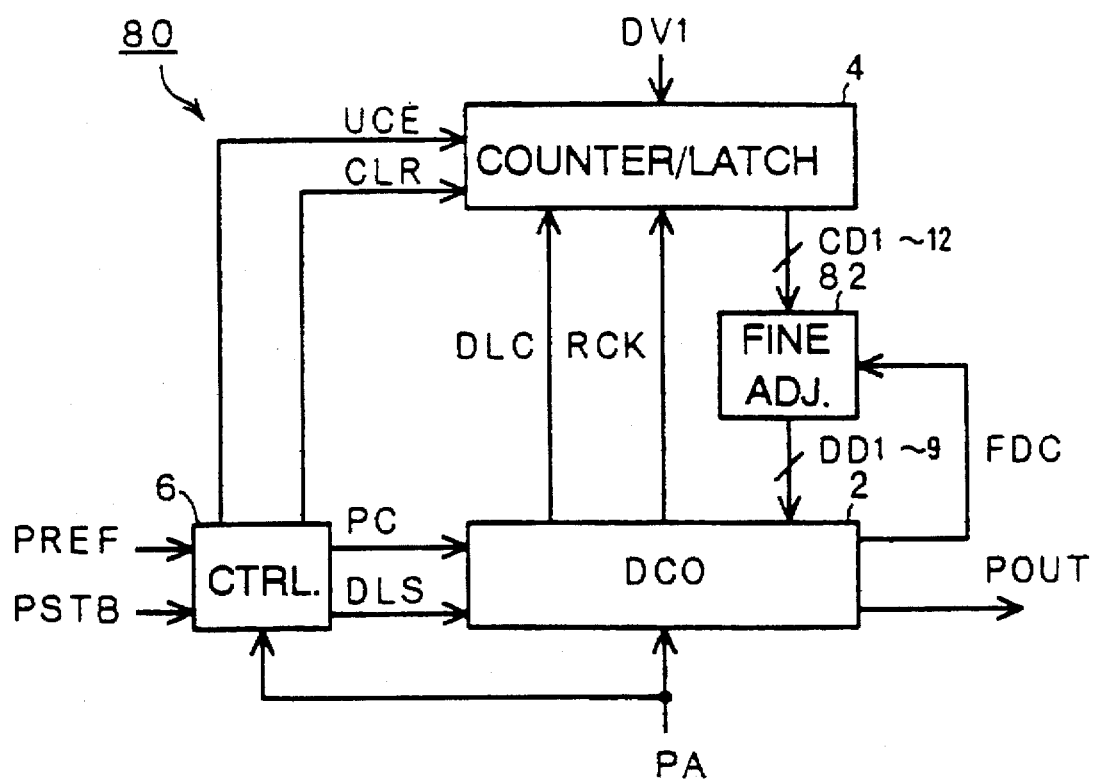
FIG. 10 is a block diagram showing the arrangement of a clock multiplying device based on a second embodiment of this invention.

FIG. 10 is a block diagram of the clock multiplying device based on the second embodiment of this invention. The clock multiplying device 80 of this embodiment differs from the clock multiplying device 1 of the first embodiment in the additional provision of a frequency fine adjustment circuit 82 which receives the 12-bit frequency control data CD (CD1–CD12) from the counter/data-latch circuit 4 and delivers 9-bit frequency control data DD (DD1–DD9) to the digital oscillation circuit 2.

In the digital oscillation circuit 2 shown in FIG. 5, the adder 30 receives the low-order 4 bits DD1–DD4 of the frequency control data DD from the frequency fine adjustment circuit 82 in place of the low-order 4 bits CDL of the frequency control data CD, and the down-counter 26 receives high-order 5 bits DD5–DD9 of the frequency control data DD in place of the high-order 8 bits CDH of the CD. Accordingly, the digital oscillation circuit 2 of this embodiment produces an output signal POUT having a period that corresponds to the 9-bit frequency control data DD from the frequency fine adjustment circuit 82.

Figure 11:
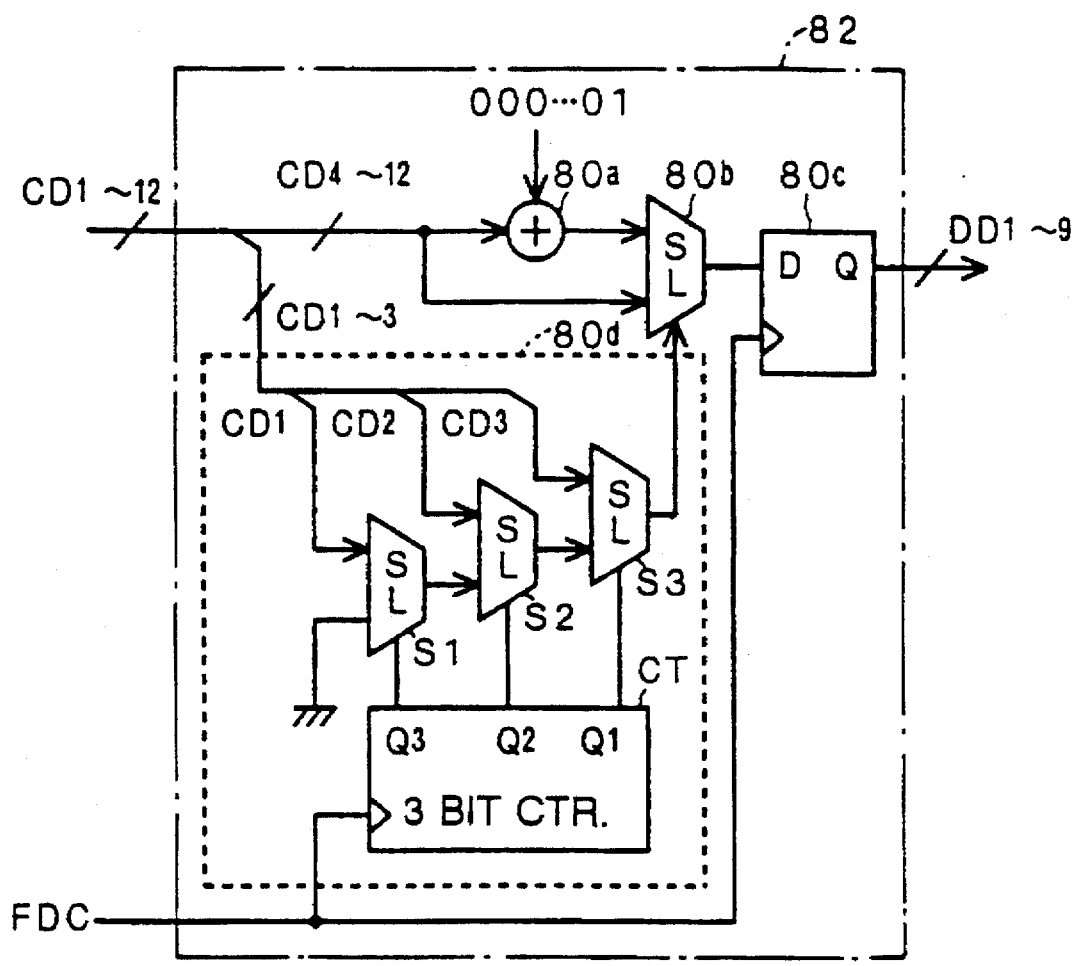
FIG. 11 is a schematic diagram of the frequency fine adjustment circuit shown in FIG. 10.

In FIG. 11, the frequency fine adjustment circuit 82 consists of a constant adder 80a which adds "1" to the value of the high-order 9 bits CD4–CD12 of the frequency control data CD generated by the counter/data-latch circuit 4, a selector 80b which selects one of the high-order 9 bits CD4–CD12 (which will be called "first data") and the output of the constant adder 80a (which will be called "second data"), a 9-bit register 80c which holds the 9-bit data generated by the selector 80b at the timing of the rising edge the clock signal FDC generated by the digital oscillation circuit 2 in response to the output signal POUT and delivers the held data as the frequency control data DD1–DD9 to the digital oscillation circuit 2, and a pulse generation circuit 80d which receives the low-order 3 bits CD1–CD3 of the frequency control data CD from the counter/data-latch circuit 4, produces a selection signal in synchronism with the clock signal FDC (output signal POUT) generated by the digital oscillation circuit 2 and at a frequency specified by the low-order 3 bits CD1–CD3 and delivers the resulting signal to the selector 80b so that it selects and generates the second data.

The clock signal FDC is the output signal of the OR gate 83 which takes the logical sum of the inverted second detection signal AD2 or output signal POUT and the output signal CK3 of the AND gate 66 as shown in FIG. 5. Accordingly, the clock signal FDC rises at every generation of the data latch signal DLS by the control circuit 6 when the output signal PCA of the latch circuit 40 is low (i.e., in the initializing operation of the clock multiplying device 80), or it rises at every generation of the POUT after the PCA has gone high. The reason for the use of the output signal of the OR gate 83 for the clock signal FDC of the frequency fine adjustment circuit 82 is that it is intended to use the output signal CK3 of the AND gate 66 as a dummy clock for setting the frequency control data DD to the digital oscillation circuit 2 at the initialization of the clock multiplying device 80 and to supply new frequency control data DD to the circuit 2 at every generation of the output signal POUT after the digital oscillation circuit 2 has started.

The selector 80b selects the second data from the constant adder 80a when the pulse generation circuit 80d is releasing the selection signal (i.e., when the output of the circuit 80d is high), or selects the first data coming directly from the counter/data-latch circuit 4 when the pulse generation circuit 80d is not releasing the selection signal (i.e., when the output of the circuit 80d is low). The selector 80b and register 80c correspond to the data switching means, and the pulse generation circuit 80d corresponds to the switching control means recited in the appended claims.

The pulse generation circuit 80d consists of three selectors S1, S2 and S3 provided in correspondence with the low-order 3 bits CD1–CD3 of the frequency control data CD generated by the counter/data-latch circuit 4, and a 3-bit counter CT which counts the clock signal FDC (output signal POUT) from the digital oscillation circuit 2 and delivers the respective selection signals to the selectors S1–S3. Each of the selectors S1–S3 has two input terminals and operates to select and generate one of signals on the input terminals depending on the selection signal from the 3-bit counter CT.

The selectors S1, S2 and S3 each have one input terminal receiving the lowest-order bit CD1, the mid-order bit CD2 and highest-order bit CD3, respectively, of the low-order 3 bits CD1–CD3 of the frequency control data CD generated by the counter/data-latch circuit 4. The selector S1 has another input terminal grounded to have a "0" data value, the selectors S2 and S3 have other input terminals connected to the output terminals of the immediately lower-order selectors, i.e., S1 and S2, and the selector S3 delivers its output signal as the selection signal to the selector 80b.

The selector S1 with the lowest-order input CD1, selector S2 with the mid-order input CD2 and selector S3 with the highest-order input CD3 have their select input terminals connected to the output terminals for the highest-order bit (Q3 or MSB), mid-order bit (Q2) and lowest-order bit (Q1 or LSB), respectively, among the three output terminals of the 3-bit counter CT.

Each of the selectors S1–S3 selects and generates the direct input data from the counter/data-latch circuit 4 (i.e., the upper input in FIG. 11) by receiving a "1" (high) output of the 3-bit counter CT on the select input terminal, or selects and generates the data on another input terminal (i.e., the lower input) by receiving a "0" (low) output of the 3-bit counter CT on the select input terminal.

In the frequency fine adjustment circuit 82, the selectors S1–S3 have their select input terminals supplied with the bit values of the 3-bit counter CT so that the higher the bit order of frequency control data CD a selector receives, the greater is the period of its direct input data from the counter/data-latch circuit 4. Accordingly, with the selectors S1–S3 receiving bit "1", the pulse generation circuit 80d generates pulse signals at frequencies of the reciprocal of the Xth power of 2 (X=1, 2 and 3) in correspondence to CD3, CD2 and CD1. For example, when the frequency control data CD has low-order 3 bits CD1–CD3 of "101", the pulse generation circuit 80d generates pulse signals at every second POUT plus every eighth POUT, and the selector 80b receives five selection signals during a period when eight output signals POUT are generated.

The selector 80b selects the second data from the constant adder 80a on receiving a pulse signal as the selection signal from the pulse generation circuit 80d, or selects the first data which is the high-order 9 bits CD4–CD12 of the frequency control data CD when the selection signal is absent. For example, when the frequency control data CD provided by the counter/data-latch circuit 4 is "110000000101", the digital oscillation circuit 2 receives high-order 9 bits "110000000" plus "1", i.e., "110000001", at every second plus every eighth generation of the output signal POUT, or otherwise it receives the crude high-order 9 bits "110000000". The digital oscillation circuit 2 produces the output signal POUT having a period that corresponds to this input data.

Namely, in the clock multiplying device 80 of the second embodiment, the digital oscillation circuit 2 basically receives data (first data) indicative of the value above the decimal point of the result of division by 8 (2n, n=3) of the frequency control data CD generated by the counter/data-latch circuit 4, and the data is added by 1 at a frequency that depends on the ratio of the value of the low-order 3 bits CD1–CD3 of the frequency control data CD to 8, i.e., depends on the value below the decimal point of the result of division by 8 of the frequency control data CD.

Accordingly, in case the frequency control data CD from the counter/data-latch circuit 4 is not a multiple of 8 (i.e., low-order 3 bits CD1–CD3 are not "000", data (second data) of the data value above the decimal point of the division result plus one is delivered as the frequency control data to the digital oscillation circuit 2, and consequently the mean value of the generation period of the output signal POUT is made accurately correspondent to the value of frequency control data CD divided by 8. Consequently, an oscillation signal having a period that is eight times as large as that of the clock multiplying device 1 of the first embodiment can be produced accurately.

According to the clock multiplying device 80 of the second embodiment, when it is intended to produce an oscillation signal having a frequency that is the frequency of the reference signal PREF multiplied by the total number (16) of the multi-phase clocks R1–R16, for example, it is designed such that the control circuit 6 operates in units of 16 periods of the signal PREF to generate the count enable signal UCE for a duration of 8 periods of PREF and the 13-bit counter 14 of the counter/data-latch circuit 4 counts the output clock RCK generated by the ring oscillator 22 for a duration of 8 periods of PREF, and the reference signal PREF can be multiplied accurately.

In consideration of the error of count value, which amounts to one period (32Td) of the output clock RCK at maximum, of the 13-bit counter 14, it is designed to count the output clock RCK for a duration of 8 periods of the reference signal PREF to increase the number of bits of frequency control data CD by 3 bits, and the frequency control data CD, with its value being divided by 8, is fed to the digital oscillation circuit 2, whereby the influence of the count error of the 13-bit counter can be alleviated.

In the clock multiplying device 80 of this embodiment, which can produce the oscillation signal corresponding accurately to the frequency control data CD divided by 8 (i.e., the count value for one period of the reference signal PREF in this case), it is possible for the digital oscillation circuit 2 to generate accurately the oscillation output having a frequency that is the frequency of reference signal PREF multiplied by 16. Although the oscillation signal has its period varied depending on whether or not the frequency control data CD is added by 1, the amount of variation is the phase difference time Tg of the multi-phase clocks R1–R16 and is extremely small.

Consequently,. the clock multiplying device 80 of the second embodiment is capable of producing the output signal POUT by multiplying the reference signal PREF accurately.

Next, the clock multiplying device based on a third embodiment of this invention will be explained. This clock multiplying device differs from the clock multiplying device 1 of the first embodiment only in the arrangement of the digitally-controlled oscillation circuit.

Figure 12A:
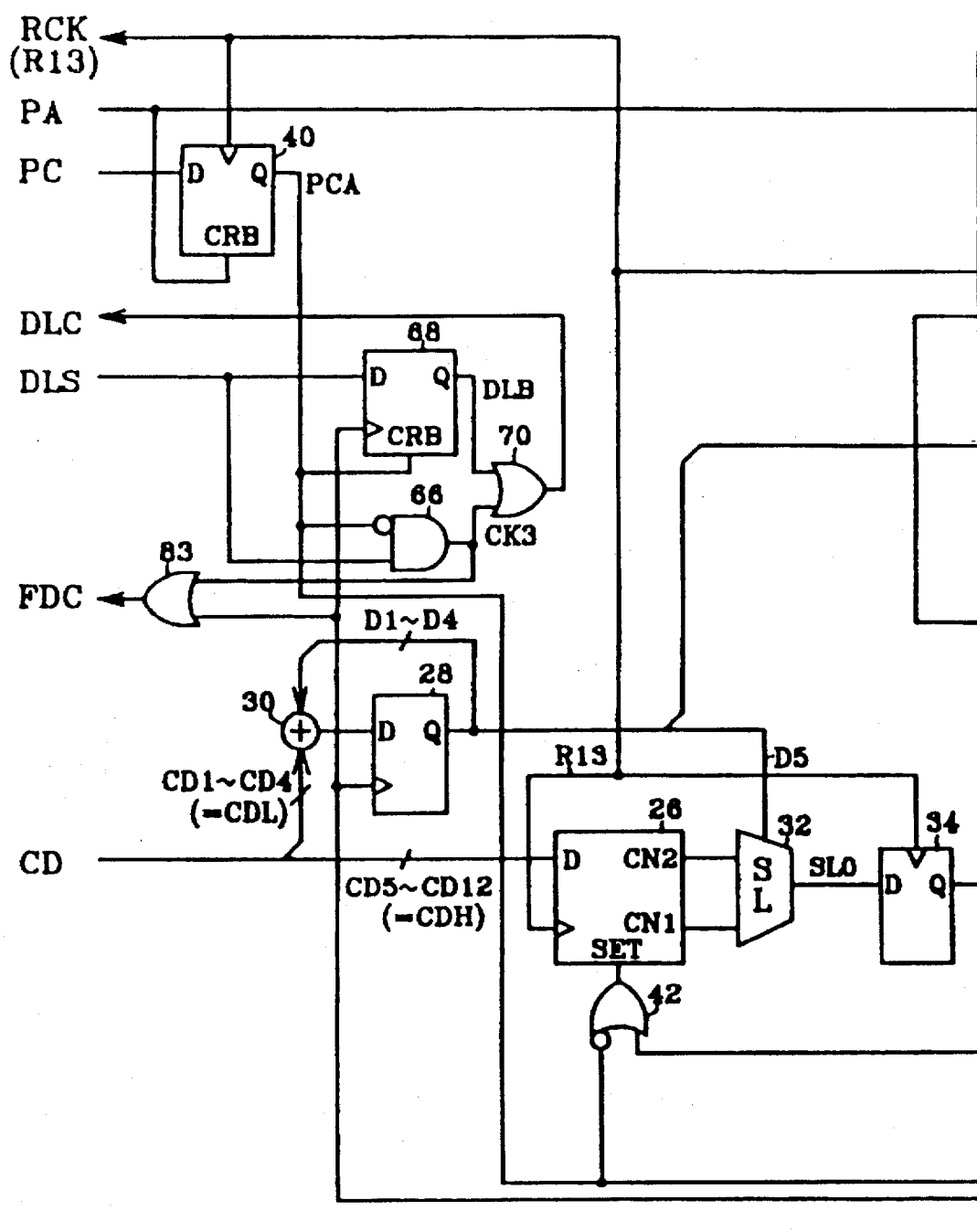
FIGS. 12(a) and 12(b) are a schematic diagram of a digital oscillation circuit based on a third embodiment of this invention.
Figure 12B:
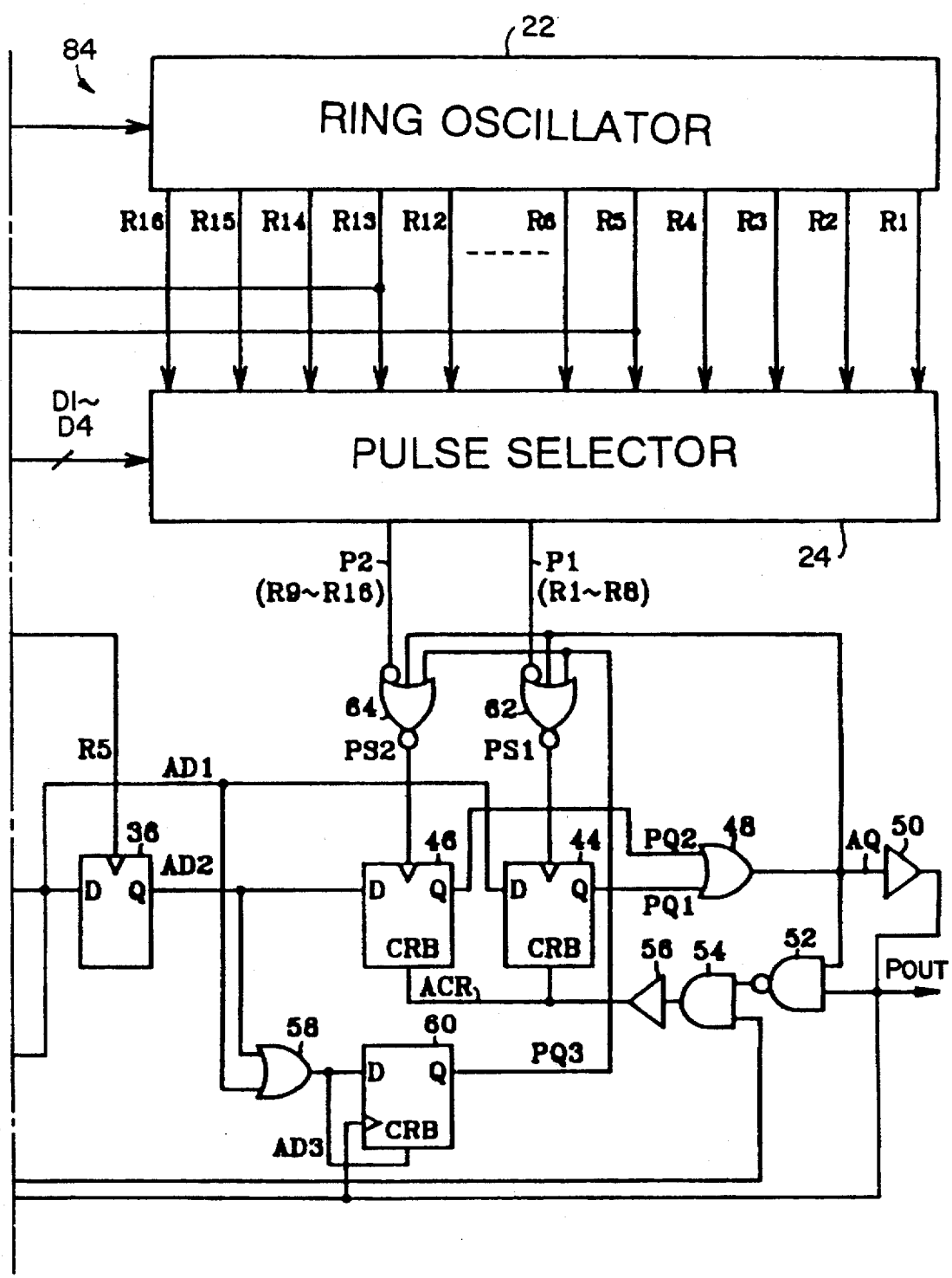

In FIG. 12, the digital oscillation circuit 84 of the clock multiplying device of this embodiment does not include the inverter 38 of the first embodiment shown in FIG. 5, and the register 28 and latch circuit 68 are adapted to receive on their clock terminals the output signal POUT from the buffer 50.

The operation of the digital oscillation circuit 84 is identical to the digital oscillation circuit 2 of the first embodiment except that the selection data D1–D4 to the pulse selector 24 is revised at the timing of the rising edge of the output signal POUT, instead of the falling edge of the second detection signal AD2 from the latch circuit 36, and the data latch signal DLS from the control circuit 6 is delivered to the counter/data-latch circuit 4.

Accordingly, the clock multiplying device of the third embodiment having the digital oscillation circuit 83 has completely the same effectiveness as the clock multiplying device 1 of the first embodiment.

Next, the clock multiplying device based on a fourth embodiment of this invention will be explained. This clock multiplying device differs from the clock multiplying device 1 of the first embodiment only in the arrangement of the digitally-controlled oscillation circuit, and the following mainly explains the portions which are different relative to the digital oscillation circuit 2 shown in FIG. 5.

Figure 13A:
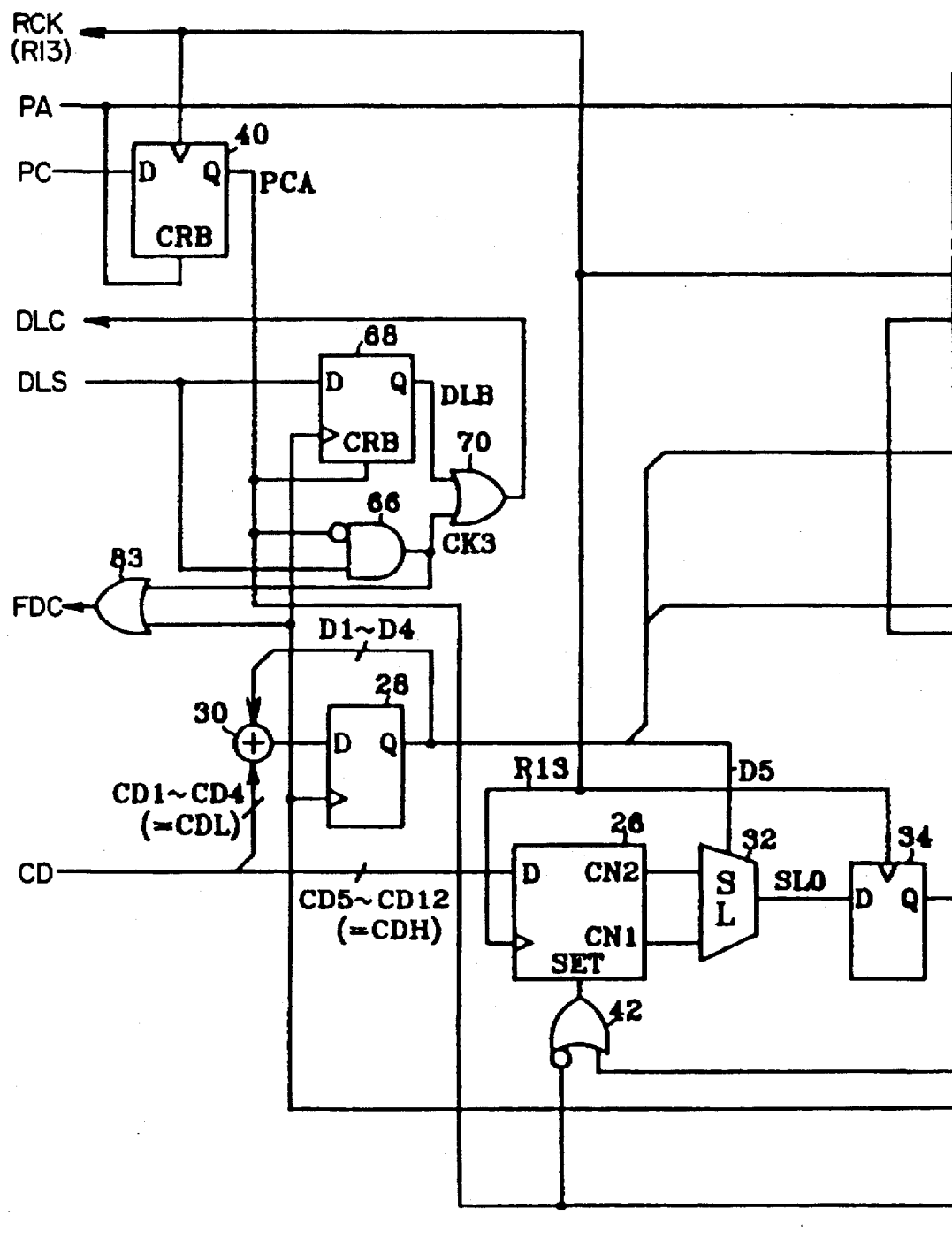
FIGS. 13(a) and 13(b) are a schematic diagram of a digital oscillation circuit based on a fourth embodiment of this invention.
Figure 13B:
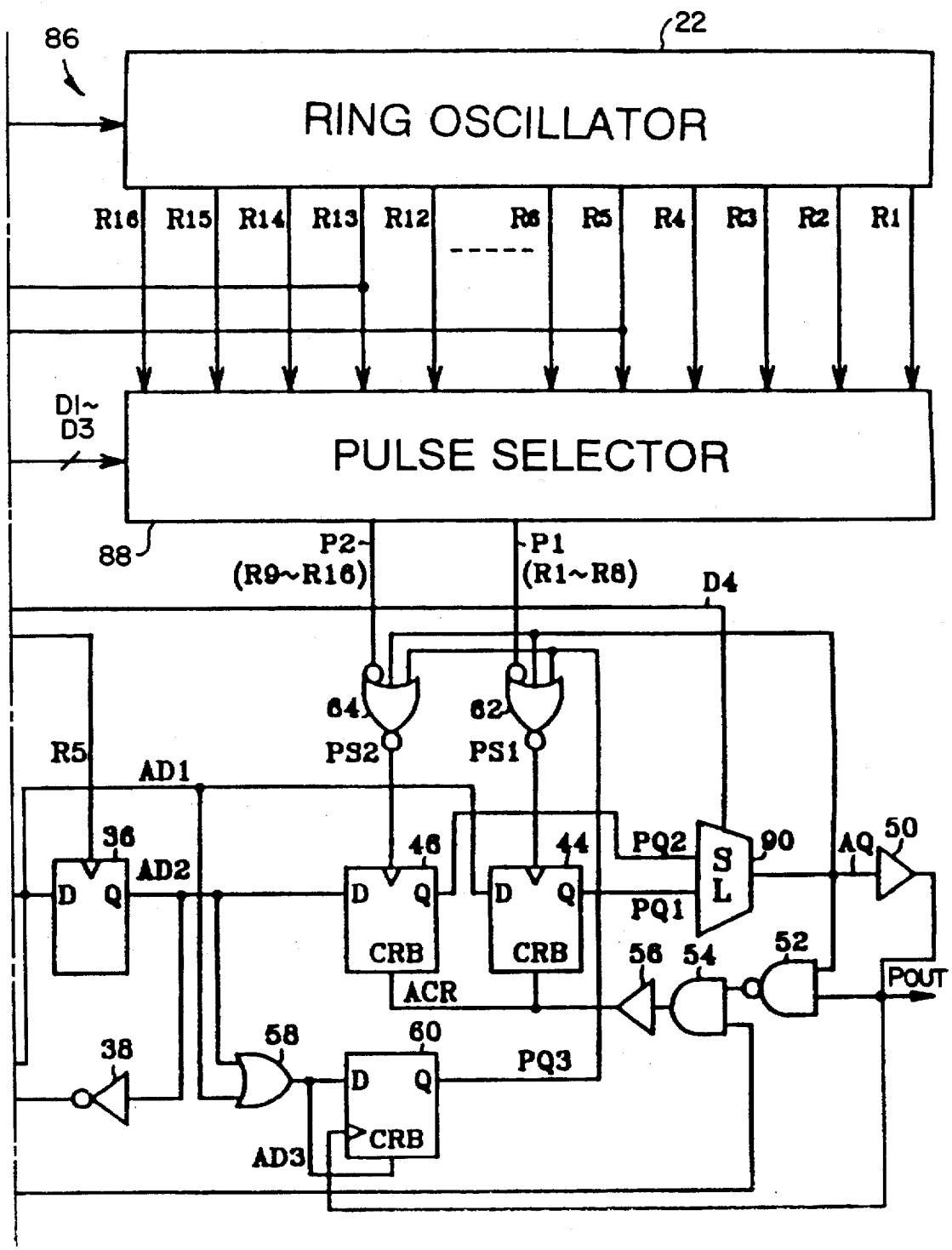

In FIG. 13, showing the digital oscillation circuit 86 of the clock multiplying device of this embodiment, the pulse selector 88 selects two clock signals out of the multi-phase clocks R1–R16 depending on the low-order 3 bits of the selection data D1–D5 generated by the register 28 and generates the selected clock signals at the two output terminals P1 and P2. The circuit includes, in place of the OR gate 48, a selector 90 which selects one of the output signals PQ1 and PQ2 of the latch circuits 44 and 46 depending on the bit-4 signal D4 of the selection data D1–D5 provided by the register 28.

In the digital oscillation circuit 86 of the fourth embodiment, the pulse selector 88 corresponds to the first selecting means and the selector 90 corresponds to the second selecting means in the appended claims. The selector 90 delivers the output signal PQ1 of the latch circuit 44 or the output signal PQ2 of the latch circuit 46 to the buffer 50 when the bit-4 signal D4 of the selection data D1–D5 is "0" or "1", respectively.

Figure 14:
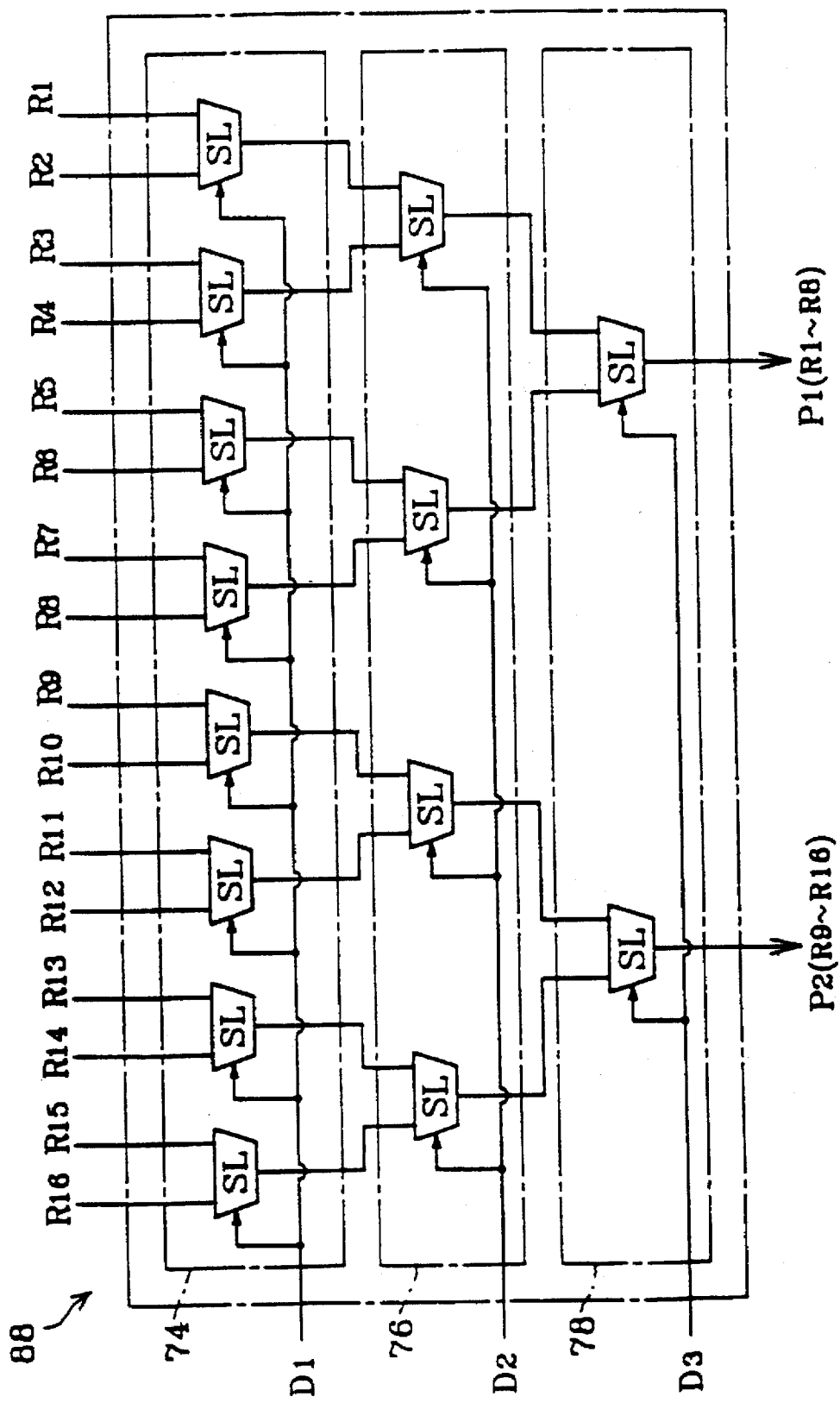
FIG. 14 is a schematic diagram of the pulse selector shown in FIG. 13.

In FIG. 14, the pulse selector 88 differs from the pulse selector 24 in the first embodiment shown in FIG. 8 in the absence of the OR gate circuit 72, and respective pairs of the multi-phase clocks R1–R16 from the ring oscillator 22 are fed directly to the selectors SL which constitute the first selector circuit 74. According to the pulse selector 88, a clock signal that is numbered by the value of input selection data D1–D3 incremented by 1 and a clock signal that is numbered by the value of D1–D3 incremented by 9 are generated from the output terminals P1 and P2, respectively. For example, when the circuit 88 receives selection data D1–D3 of "101" having a value of "5", it generates the clock signals R6 and R14 from the output terminals P1 and P2, respectively.

Namely, generated from the output terminals P1 and P2 are a clock signal relevant to the 3-bit selection data D1–D3 out of the multi-phase clocks R1–R16 provided by the ring oscillator 22 and a clock signal that is later in phase than the first-mentioned clock signal by a half period (a clock signal numbered greater by 8).

In the digital oscillation circuit 86 of this arrangement, when the register 28 generates selection data D1–D5 of "00000", the pulse selector 88 delivers the clock signals R1 and R9 from its output terminals P1 and P2 to the clock terminals of the latch circuits 44 and 46 as shown in FIGS. 15(n) and 15(o). These Figures show in the same manner as FIGS. 9(a)–9(t) the operation after the digital oscillation circuit 86 has started until the operation proceeds to the second cycle, with the low-order 4 bits CDL of "0001" of the frequency control data CD (FIG. 15(d)) being supplied.

When the count value of the down-counter 26 becomes "2", the output signal CLO of the selector 32 goes high, and thereafter when the ring oscillator 22 generates the clock signal R13 (the count value of the down-counter 26 becomes "1"), the latch circuit 34 delivers a high-level first detection signal AD1 (FIG. 15(j)). During the period when the first detection signal AD1 is high, if the clock signal R1 of the ring oscillator 22 is generated from the output terminal P1 of the pulse selector 88, the output signal PQ1 of the latch circuit 44 goes high.

In this example, the bit-4 signal D4 of the selection data is "0", causing the selector 90 to select the output of the latch circuit 44, and then the output AQ (FIG. 15(r)) of the selector 90 goes high at the timing of the output of a high-level output signal PQ1 (FIG. 15(p)) from the latch circuit 44, and the output signal POUT (FIG. 15(s)) is generated on expiration of the operational delay of the buffer 50.

In the operation of the second cycle, in which the digital oscillation circuit 86 receives the low-order 4 bits CDL of "0001" of the frequency control data CD, the selection data D1–D5 from the register 28 is revised to "00001", and the pulse selector 88 generates the clock signals R2 and R10 from its output terminals P1 and P2 as shown in FIGS. 15(l) and 15(m).

In another example of the generation of the selection data D1–D5 of "01000" having a value of "8" by the register 28, the pulse selector 88 generates the clock signals R1 and R9 from its output terminals P1 and P2. Also in this case, the latch circuit 34 generates a high-level first detection signal AD1 in response to the count operation of the down-counter 26, and if the clock signal R1 of the ring oscillator 22 is generated from the output terminal P1 of the pulse selector 88 during the high period of the first detection signal AD1, the output signal PQ1 of the latch circuit 44 goes high. However, the bit-4 signal D4 of the selection data is "1" in this case, causing the selector 90 to select the output of the latch circuit 46, and the output AQ of the selector 90 stays at a low-level even though the latch circuit 44 delivers a high-level output signal PQ1.

Thereafter, the ring oscillator 22 generates the clock signal R5, the second detection signal AD2 from the latch circuit 36 goes high, and the clock signal R9 of the ring oscillator 22 is generated from the output terminal P2 of the pulse selector 88 during the high period of the second detection signal AD2, causing the output signal PQ2 of the latch circuit 46 to go high, then at this timing the output AQ of the selector 90 goes high and thereafter the buffer 50 generates the output signal POUT.

Namely, in contrast to the digital oscillation circuit 2 of the first embodiment in which one of the multi-phase clocks R1–R16 is selected by the pulse selector 24 depending on the 4-bit selection data D1–D4 and delivered to the clock terminal of the relevant latch circuit 44 or 46, whereas in the digital oscillation circuit 86 of the fourth embodiment, the pulse selector 88 selects a clock signal from each of the multi-phase clock groups R1–R3 and R9–R16 depending on the low-order 3 bits D1–D3 of the selection data D1–D4 and delivers the selected clock signals to the clock terminals of the corresponding latch circuits 44 and 46 and the selector 90 finally selects one of outputs of the latch circuits 44 and 46 depending on the bit-4 signal D4 of the selection data D1–D4. Consequently, the selector 90 generates a high-level signal at exactly the same timing as the output of a high-level signal from one of the latch circuits 44 and 46 as in the digital oscillation circuit 2 of the first embodiment.

Accordingly, the digital oscillation circuit 86 of this embodiment is capable of producing an oscillation signal of accurate period which is proportional to the externally-supplied frequency control data as in the case of the digital oscillation circuit 2 of the first embodiment. Accordingly, the clock multiplying device having the digital oscillation circuit 86 has completely the same effectiveness as the clock multiplying device 1 of the first embodiment.

The digital oscillation circuit 86 of the fourth embodiment may be modified to eliminate the inverter 38 and feed the output signal POUT of the buffer 50 to the clock terminals of the register 28 and latch circuit 68 in completely the same manner as the digital oscillation circuit 84 of the third embodiment.

Next, the clock multiplying device based on a fifth embodiment of this invention will be explained. This clock multiplying device differs from the clock multiplying device 1 of the first embodiment only in the arrangement of the digitally-controlled oscillation circuit, and the following mainly explains the different portion.

Figure 16A:
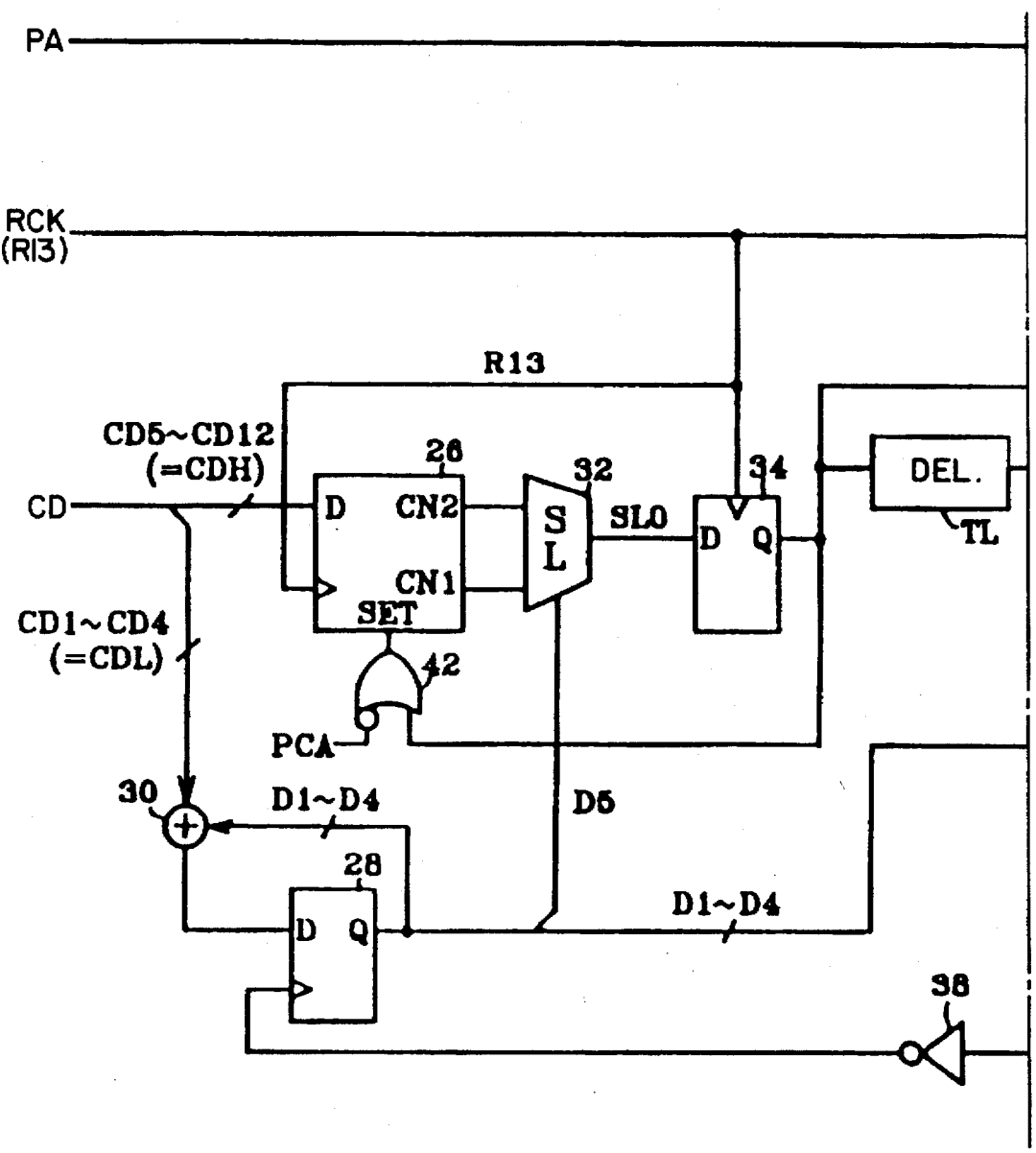
FIGS. 16(a) and 16(b) are a schematic diagram of a digital oscillation circuit based on a fifth embodiment of this invention.
Figure 16B:
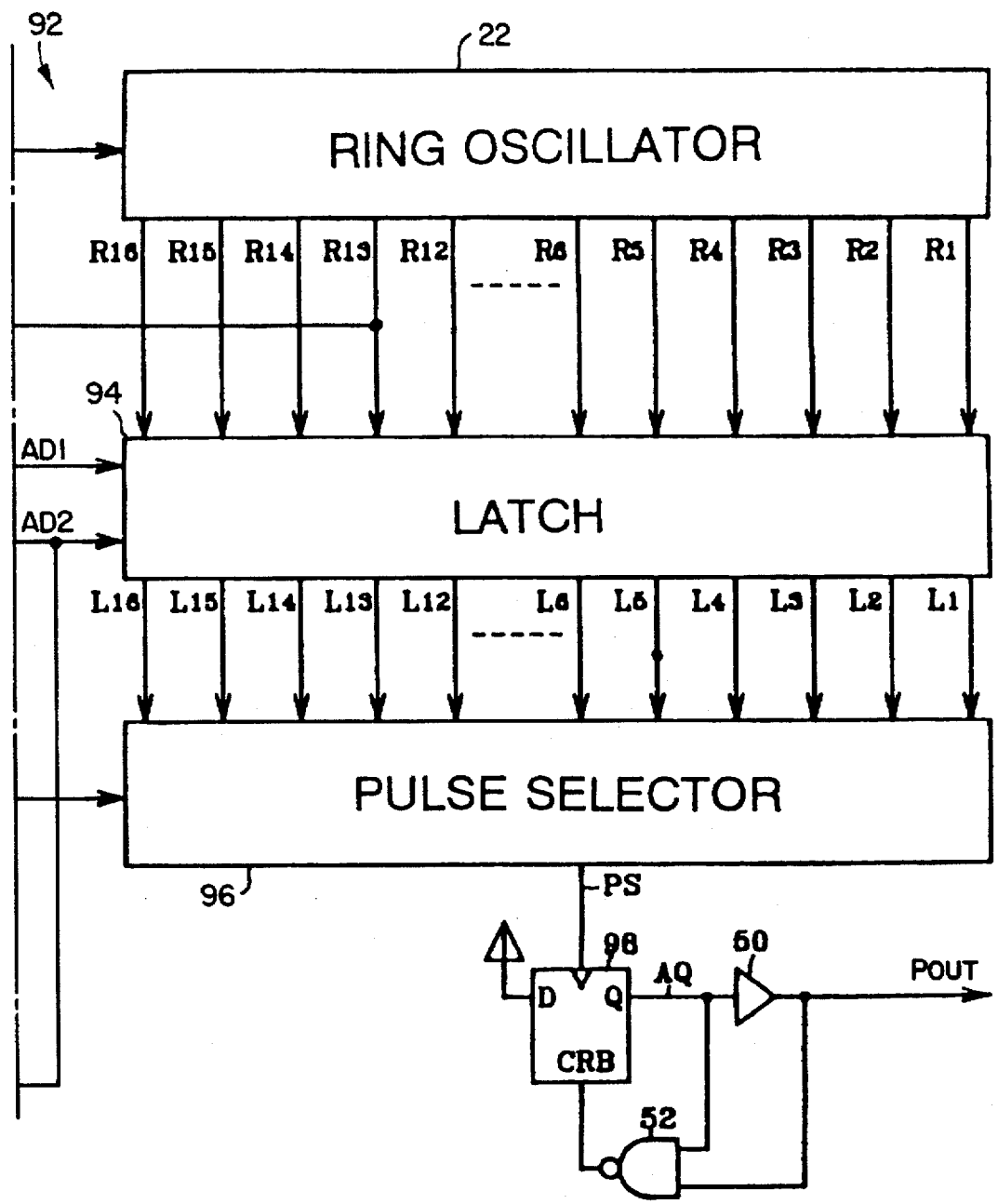

In FIG. 16, the digital oscillation circuit 92 of this clock multiplying device is different from the digital oscillation circuit 2 of the first embodiment shown in FIG. 5 mainly in the provision of the latch circuits for latching the first and second detection signals AD1 and AD2 and the pulse selector for selecting one signal depending on the selection data D1–D4. The circuit section including the latch circuits 40 and 68, AND gate 66 and OR gate 70 in FIG. 5 is not shown in FIG. 16.

The specific differences of the digital oscillation circuit 92 of the fifth embodiment from the digital oscillation circuit 2 of the first embodiment are as follows.

(1) The oscillation circuit 92 has a latch section including 16 latch circuits provided in correspondence with the multi-phase clocks R1–R16 generated by the ring oscillator 22 in place of the latch circuits 44 and 46. A pulse selector 96 selects and provides one of 16 output signals L1–L16 of the latch section 94 depending on the selection data D1–D4 from the register 28.

(2) It has a latch circuit 98 which latches a high-level input signal in response to the rise of the output signal PS of the pulse selector 96 and delivers the selected signal to the buffer 50, in place of the provision of the OR gates 48 and 58, AND gate 54, buffer 56, latch circuit 60 and NOR gates 62 and 64. As shown in FIGS. 18(a)–18(m), when the output AQ of the latch circuit 98 goes high, the buffer 50 generates a high-level output signal POUT on expiration of its delay time and, at the same time, a NAND gate 52 generates a low-level clear signal to the clear terminal of the latch circuit 98 thereby clearing it. Accordingly, when the output signal PS of the pulse selector 96 goes high, a high-level output signal POUT is generated for a duration that depends on the delay time of the buffer 50. In this embodiment, the latch circuit 98, buffer 50 and NAND gate 52 are comparable with the output means recited in the appended claims.

(3) A delay line TL is used to delay the first detection signal AD1 generated by the latch circuit 34 by half a circulation time (16Td) of the pulse signal in the ring oscillator 22, thereby producing the second detection signal AD2.

Figure 17A:
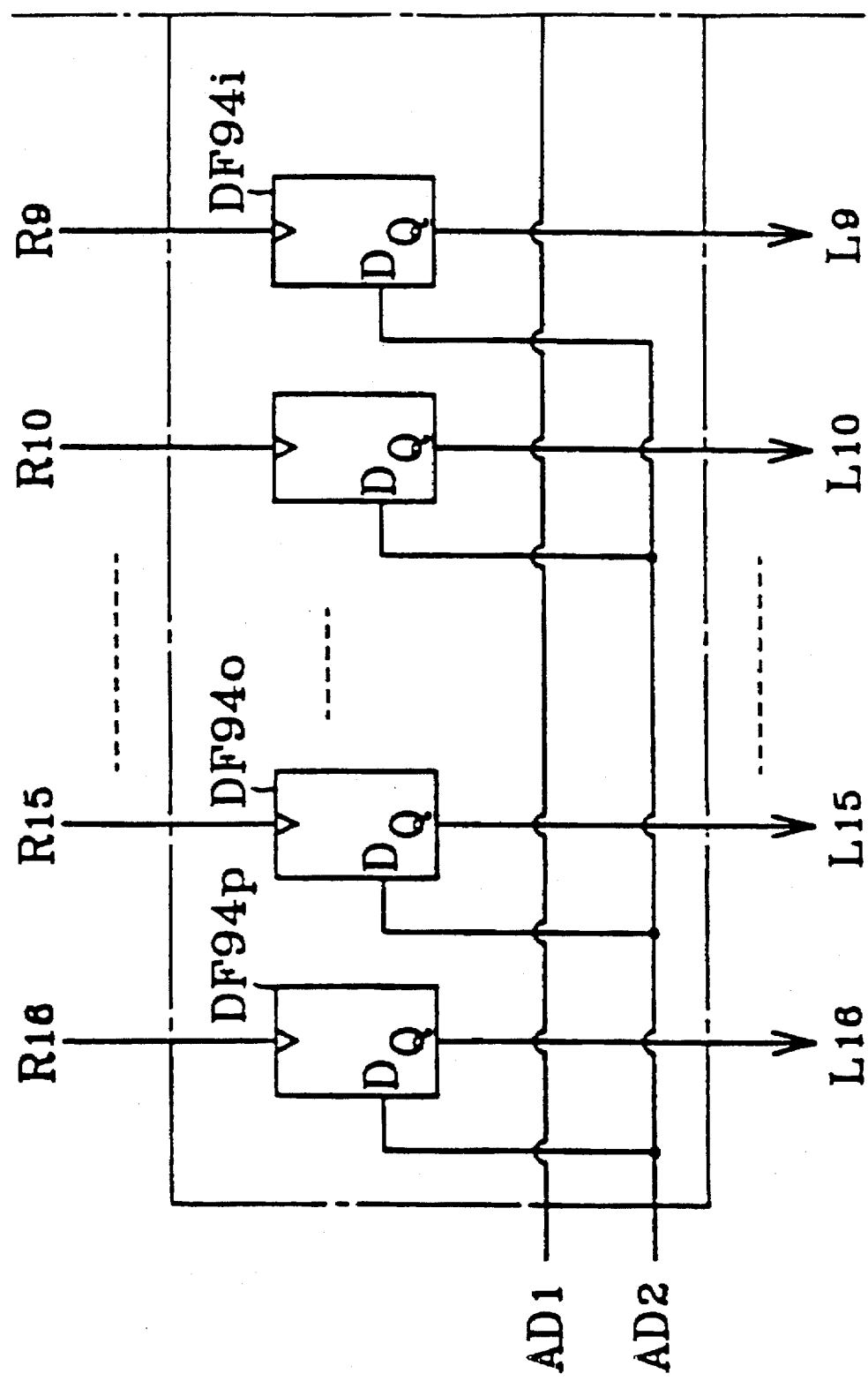

In FIG. 17, the latch section 94 consists of 16 latch circuits DF94a–DF94p which are supplied on their clock terminals with the respective multi-phase clocks R1–R16 from the ring oscillator 22. Eight latch circuits DF94a–DF94h with the clocks R1–R8 have their data terminals connected to receive the first detection signal AD1 from the latch circuit 34, while eight latch circuits DF94i–DF94p with the clocks R9–R16 have their data terminals connected to receive the second detection signal AD2 from the delay line TL. The output signals L1–L16 of the latch circuits DF94a–DF94p are delivered to the pulse selector 96.

The pulse selector 96 which receives the output signals L1–L16 of the latch section 94 selects and generates one signal numbered by the value of the 4-bit selection data D1–D4. A specific arrangement of the pulse selector 96 may be, for example, derived from the pulse selector 88 shown in FIG. 14, with an additional selector being provided to select one of two output signals of the selectors SL in the third selector group 78 depending on the bit-4 signal D4 of the selection data D1–D4.

According to the digital oscillation circuit 92 of the fifth embodiment arranged as explained above, when the carry signal D5 from the register 28 is "0", the latch circuit 34 generates a high-level first detection signal AD1 relevant to the clock signals R1–R8 at the time point when the count value of the down-counter 26 becomes "1", or when the carry signal D5 is "1", the latch circuit 34 generates a high-level first detection signal AD1 (FIG. 18(i)) at the time point when the count value of the down-counter 26 becomes "0", as shown in FIGS. 18(a)–18(m).

On expiration of a half circulation time of the ring oscillator 22 following the generation of the high-level first detection signal AD1, a high-level second detection signal AD2 (FIG. 18(j)) relevant to the clock signals R9–R16 is generated from the delay line TL. FIGS. 18(a)–18(m) show in the same manner as FIGS. 9(a)–9(t) the operation after the digital oscillation circuit 92 has started until the operation proceeds to the second cycle, with the low-order 4 bits CDL of "0001" of the frequency control data CD (FIG. 18(c)) being supplied.

Each of the latch circuits DF94a–DF94p in the latch section 94 latches and generates a high-level detection signal AD1 or AD2 in response to the reception of the clock signal relevant to it, and therefore the output signals L1–L16 of the latch section 94 go high progressively in this order, and only the output signal of one latch circuit that receives the clock signal relevant to the selection data D1–D4 from the register 28 is generated from the pulse selector 96. For example, in case the selection data D1–D4 is "1110" that corresponds to the clock signal R15, high-level output signals L1–L14 of the latch circuits DF94a–DF94n are blocked by the pulse selector 96 and a rising output signal L15 of the latch circuit DF94o is delivered by the pulse selector 96 to the clock terminal of the latch circuit 98.

Consequently, the pulse selector 96 generates a high-level signal at exactly the same timing as the output of a high-level signal from one of the latch circuits 44 and 46 in the digital oscillation circuit 2 of the first embodiment.

Accordingly, the digital oscillation circuit 92 of this embodiment is capable of producing an oscillation signal having an accurate period which is proportional to the externally-supplied frequency control data as in the case of the digital oscillation circuit 2 of the first embodiment. Accordingly, the clock multiplying device having the digital oscillation circuit 92 has completely the same effectiveness as the clock multiplying device 1 of the first embodiment.

The digital oscillation circuit 92 of the fifth embodiment may be modified to eliminate the inverter 38 and feed the output signal POUT of the buffer 50 to the clock terminal of the register 28 in completely the same manner as the digital oscillation circuit 84 of the third embodiment.

Next, the digitally-controlled oscillation circuit based on a sixth embodiment having its ring oscillator formed from an odd number of inverting circuits will be explained, in contrast to the digital oscillation circuits 2, 84, 86 and 92 of the first through fifth embodiments in which the ring oscillator 22 for generating the multi-phase clocks R1–R16 is formed from an even number of inverting circuits.

Figure 19A:
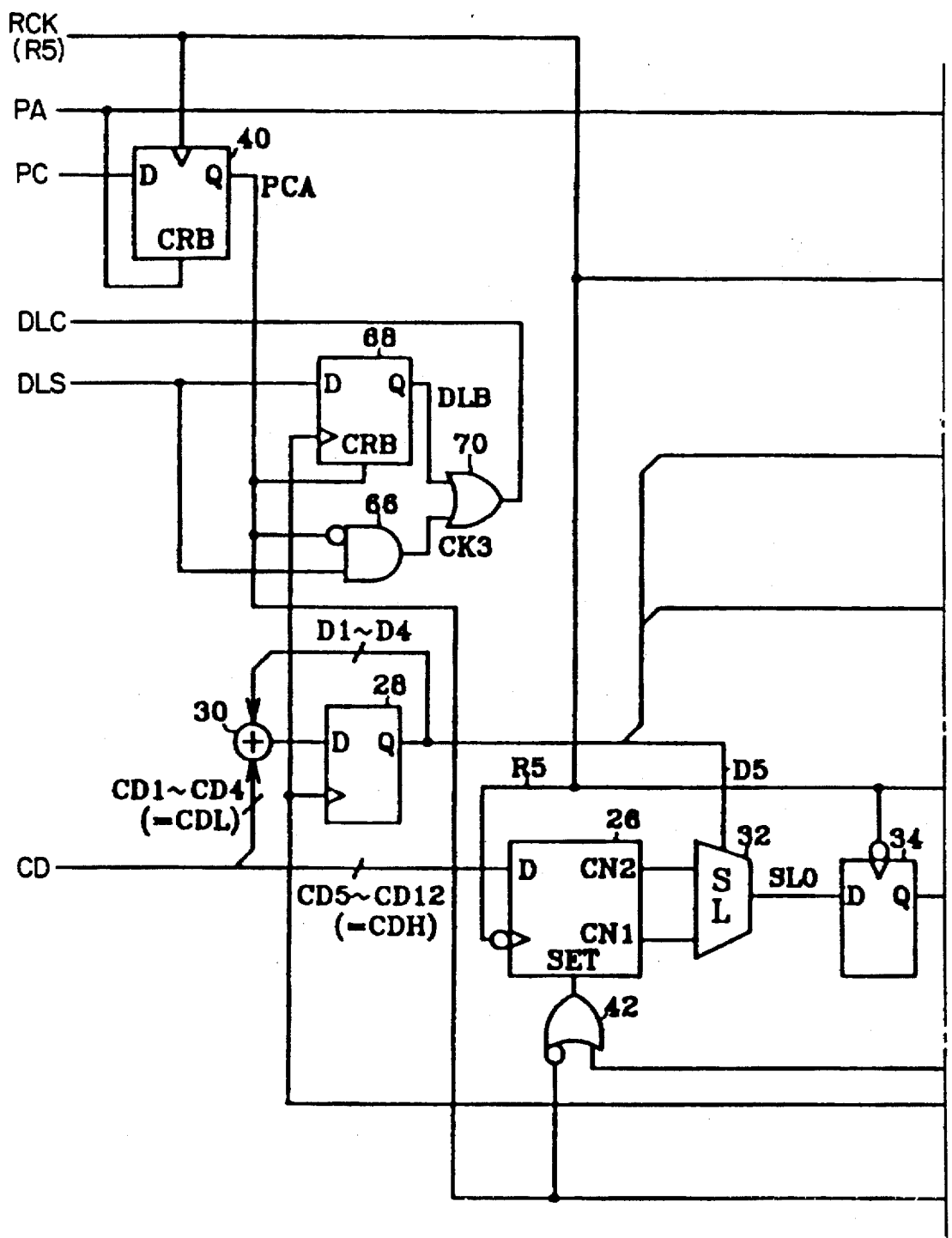
FIGS. 19(a) and 19(b) are a schematic diagram of a digital oscillation circuit based on a sixth embodiment of this invention.
Figure 19B:
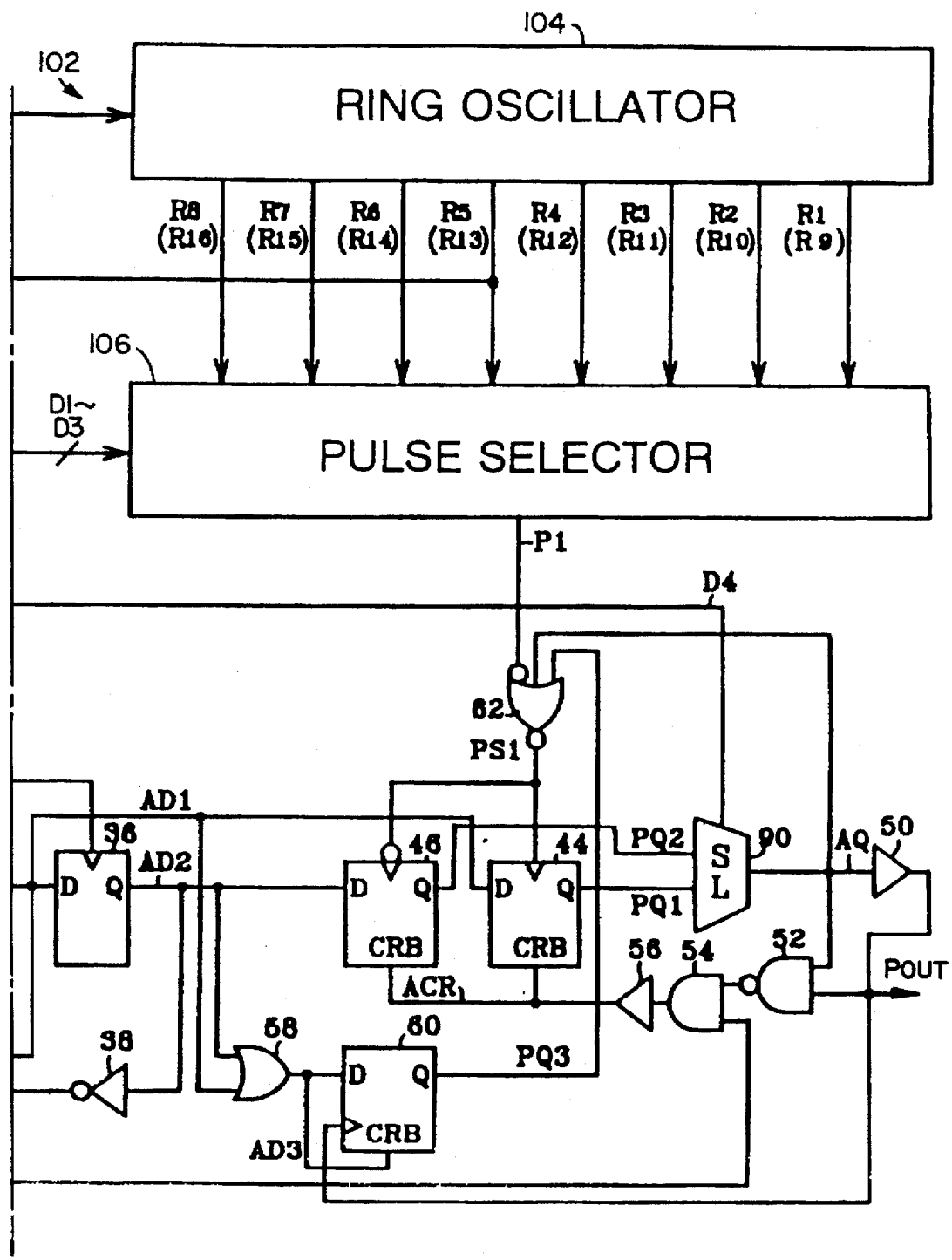

In FIG. 19, the digital oscillation circuit 102 of this embodiment is virtually identical to the digital oscillation circuit 86 of the fourth embodiment shown in FIG. 13, but is different as follows.

Figure 20:
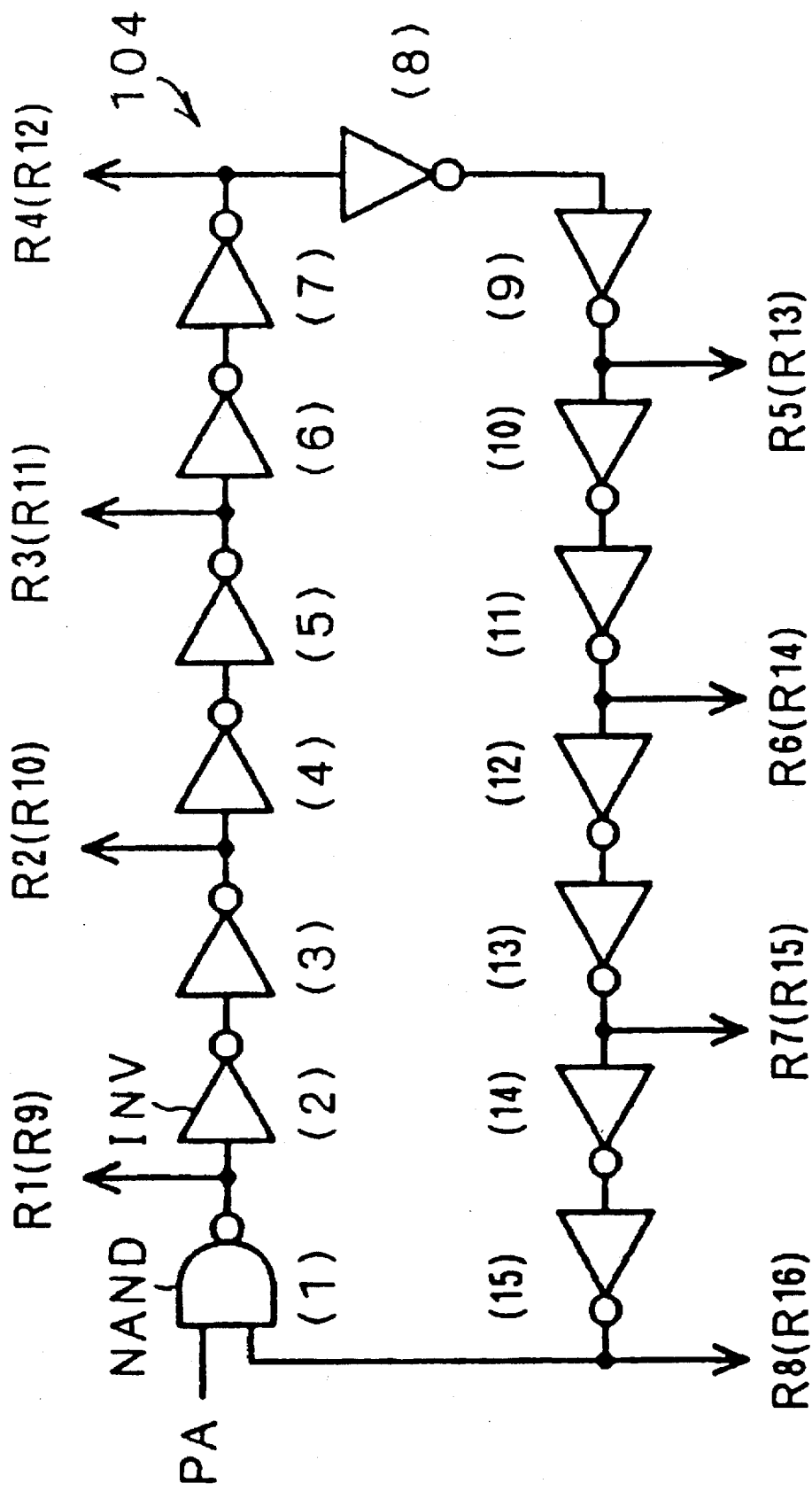
FIG. 20 is a schematic diagram of the ring oscillator shown in FIG. 19.

(1) The oscillation circuit 102 has a ring oscillator 104 formed from fifteen inverting circuits as shown in FIG. 20, and the pulse selector 106 selects one of multi-phase clocks R1–R8 generated by the ring oscillator 104 depending on the selection data D1–D3 provided by the register 28 and delivers the selected signal from the output terminal P1.

(2) The pulse selector 106 has only one output terminal P1; therefore the NOR gate 64 is eliminated. The latch circuit 46 receives on its clock terminal an inverted signal of the output signal PS1 of the NOR gate 62.

(3) The clock signal R5 of the fifth phase order among the multi-phase clocks R1–R8 from the ring oscillator 104 is fed to the counter/data-latch circuit 4, and an inverted signal of R5 is fed to the clock terminals of the down-counter 26 and the latch circuit 34 which produces the first detection signal AD1. The latch circuit 36 which produces the second detection signal AD2 is supplied on its clock terminal with the clock signal R5 as in the case of the fourth embodiment.

In FIG. 20, the ring oscillator 104 consists of fifteen inverting circuits including a NAND gate and fourteen inverters INV in a ring configuration, with the NAND gate being supplied at one input terminal with the externally-supplied control signal PA. The inverting circuits of odd-numbered positions counted from the NAND gate have output terminals for leading out the multi-phase clocks R1–R8. The NAND gate has its inversion time set to be twice the inversion time Td of the inverters INV.

In the operation of the ring oscillator 104, when the control signal PA is low, the NAND gate produces a high-level output, causing the following inverters INV to go low and high alternately. A high-level signal, as same as the initial state, returns to the NAND gate, and the ring oscillator 104 settles in this state.

When the control signal PA is brought to high, the NAND gate starts the inverting operation. A low-level signal returns to the NAND gate after the time length that is about sixteen times the inversion time Td of each inverter INV (i.e., 16Td), and the ring oscillator 104 enters the cyclic operation to produce on its above-mentioned output terminals the multi-phase clocks R1–R8 having a period that is twice the above-mentioned time length (i.e., 32Td). The phase difference of clock signals on adjacent output terminals is twice the inversion time Td (i.e., 2Td).

The pulse selector 106 is similar to the pulse selector 88 shown in FIG. 14, but due to only eight output terminals of the ring oscillator 104, the first, second and third selector circuits 74, 76 and 78 include only four, two and one selectors SL, respectively.

The ring oscillator 104 of this embodiment produces eight multi-phase clocks R1–R8 having a period that is twice the circulation time of a pulse edge (32Td) and a phase interval that is twice the inversion time Td of each inverter INV (i.e., 2Td), and by the rendition of inversion for the clock signals R1–R8 to produce clock signals R9–R16, it is possible for the ring oscillator 104 to produce sixteen multi-phase clocks R1–R16 that are completely identical to those produced by the ring oscillator 22 of the first through fifth embodiments.

Specifically, the inverted signal of a clock signal Rn (n=1 to 8) has a phase shift of a half period with respect to Rn. Accordingly, the inverted signals of Rn are used for the clock signals Rn+8, and the resulting 16 clock signals are completely identical in period and phase interval to the multi-phase clocks R1–R16 produced by the ring oscillator 22 in the first through fifth embodiments.

In the digital oscillation circuit 102 of this embodiment, the inverted signal of the clock signal R5 fed to the clock terminals of the down-counter 26 and latch circuit 34 rises at exactly the same timing as the rise of the clock signal R13 in the digital oscillation circuit 86 of the fourth embodiment, and the inverted signal of the clock signal generated from the output terminal P1 of the pulse selector 206 has the same phase as the clock signal generated from the output terminal P2 of the pulse selector 88 of the fourth embodiment. Accordingly, the latch circuit 46 of the sixth embodiment is supplied on its clock terminal with the clock signal that is numbered by the value of the selection data D1–D3 added by 9, as in the case of the fourth embodiment.

Accordingly, the digital oscillation circuit 102 of the sixth embodiment has completely the same operation as the digital oscillation circuit 86 of the fourth embodiment.

FIGS. 21(a)–21(r) show in the same manner as FIG. 15 the operation after the digital oscillation circuit 102 has started until the operation proceeds to the second cycle, with the low-order 4 bits CDL of "0001" of the frequency control data CD being supplied.

Accordingly, the digital oscillation circuit 102 of this embodiment is capable of producing an oscillation signal with an accurate period which is proportional to the externally-supplied frequency control data, as in the case of the digital oscillation circuits 2, 84, 86 and 92 of the first through fifth embodiments.

Although the present invention has been fully described in connection with the preferred embodiment thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A frequency multiplying device comprising:
   frequency detecting means for receiving a reference signal having a first pulse and a second pulse occurring after said first pulse, and for detecting a frequency of said reference signal based on a phase difference between said first and second pulses;
   frequency multiplying means for multiplying said frequency of said reference signal detected by said frequency detecting means by a predetermined number; and
   signal generating means for generating an output signal having said multiplied frequency at a predetermined timing.

2. The frequency multiplying device of claim 1, wherein:
   said reference signal includes a third pulse occurring after said second pulse; and
   said predetermined timing is a timing at which said third pulse occurs.

3. The frequency multiplying device of claim 1, further comprising:
   a multi-phase clock generator for generating a plurality of clock signals having phases shifted relative to one another;
   wherein said frequency detecting means is for detecting said frequency of said reference signal by generating a resolution indicative of a phase difference between said reference signal and one of said plurality of clock signals; and
   said frequency multiplying means is for multiplying said frequency of said reference signal using said resolution.

4. The frequency multiplying device of claim 3, wherein said multi-phase clock generator includes a ring oscillator for providing output signals of specified inverters among a plurality of inverters connected in a ring configuration as said plurality of clock signals.

5. A frequency multiplier comprising:
   multi-phase clock generating means for generating a plurality of clock signals having phases shifted relative to one another;
   encoding means for encoding a timing of a predetermined cycle portion of said reference signal with a cycle of one of said plurality of clock signals as a resolution; and
   output means for generating a pulse at a predetermined timing and at a frequency which is a multiple of a frequency of said reference signal based on said encoded timing, with a phase-differential time of one of said plurality of clock signals as a control portion resolution.

6. A digitally-controlled oscillator for generating a pulse having a clock cycle corresponding to externally-applied multi-bit digital data, said oscillator comprising:
   a multi-phase clock for generating a plurality of clock signals whose phases are shifted relative to one another;
   coarse time calculating means for calculating a coarse timing corresponding to a most significant bit portion of said data with one of said plurality of clock signals being taken as a resolution;
   fine time calculating means for calculating a phase-differential fine timing corresponding to a least significant bit portion of said data based on a phase differential time of said plurality of clock signals; and
   output means for outputting a pulse having a cycle timing which is a total of said coarse timing and said fine timing.

7. A digitally-controlled oscillator for generating a pulse having a clock cycle corresponding to externally-applied digital data, said oscillator comprising:
   a ring oscillator including a plurality of inverters;
   output means for generating an output pulse;
   coarse control means for coarsely controlling said output means so that a cycle time of said output pulse corresponds to a most significant portion of said data, an output pulse cycle from said ring oscillator being used as a time resolution; and
   fine control means for finely controlling said output means so that a cycle time of said output pulse corresponds to a least significant portion of said data, a phase differential among said inverters being used as a time resolution.

8. A digitally controlled oscillator comprising:
   a pulse circulation circuit, including a plurality of inverters connected in a ring configuration, for generating a plurality of pulse signals having a predetermined phase differential therebetween;
   counting means for counting pulse signals output from a predetermined inverter in said plurality of inverters and for determining when a count thereof is equal to an externally-applied value;
   pulse detecting means for receiving data representative of a sequence of phases on a given one of said plurality of pulse signals and, after said counting means determines that said count has reached said externally-applied value, detecting that a particular pulse signal corresponding to input data has been output from said pulse circulation circuit;
   output means for outputting a predetermined signal when said pulse detecting means detects that said pulse signal corresponding to said input data has been output;
   updating means for outputting digital data as new input data of said pulse detecting means when a detecting operation of said pulse detecting means has been terminated once, said digital data representative of an addition of said data representative of said sequence of phases and current input data of said pulse detecting means;
   modifying means for incrementing said value used by said counting means when a value of digital data output by said updating means exceeds a number of pulse signals output from said pulse circulation circuit;
   wherein said plurality of pulse signals output by said pulse circulation circuit are divided into a predetermined plurality of groups ordered starting with signals having earlier phases with said particular pulse signal being used as a reference;
   said pulse detecting means includes detection signal outputting means for outputting a plurality of detection signals respectively corresponding to said plurality of groups of pulse signals being asserted in an interval until all pulse signals of corresponding groups are continuously output from said pulse circulation circuit, a plurality of latches, respectively corresponding to said plurality of detection signals, for generating an output signal when a pulse signal is input while a corresponding detection signal is asserted, and selecting means for selecting a pulse signal from said plurality of pulse signals output by said pulse circulation circuit in correspondence with said input data and for providing said selected pulse signal to a latch in said plurality of latches which is provided with input pulse signals corresponding to a group to which said pulse signal belongs; and said output means is for outputting said predetermined signal responsive to an asserted output from any of said latches.

9. A digitally controlled oscillator comprising:

a pulse circulation circuit, including a plurality of inverters connected in a ring configuration, for generating a plurality of pulse signals having a predetermined phase differential therebetween;

counting means for counting pulse signals output from a predetermined inverter in said plurality of inverters and for determining when a count thereof is equal to an externally-applied value;

pulse detecting means for receiving data representative of a sequence of phases on a given one of said plurality of pulse signals and, after said counting means determines that said count has reached said externally-applied value, detecting that a particular pulse signal corresponding to input data has been output from said pulse circulation circuit;

output means for outputting a predetermined signal when said pulse detecting means detects that said pulse signal corresponding to said input data has been output;

updating means for outputting digital data as new input data of said pulse detecting means when a detecting operation of said pulse detecting means has been terminated once, said digital data representative of an addition of said data representative of said sequence of phases and current input data of said pulse detecting means;

modifying means for incrementing said value used by said counting means when a value of digital data output by said updating means exceeds a number of pulse signals output from said pulse circulation circuit;

wherein said plurality of pulse signals output by said pulse circulation circuit are divided into a predetermined plurality of groups ordered starting with signals having earlier phases with said particular pulse signal being used as a reference;

said pulse detecting means includes detection signal outputting means for outputting a plurality of detection signals respectively corresponding to said plurality of groups of pulse signals being asserted in an interval until all pulse signals of corresponding groups are continuously output from said pulse circulation circuit, a plurality of latches, respectively corresponding to said plurality of detection signals, for generating an output signal when a pulse signal is input while a corresponding detection signal is asserted, first selecting means for selecting a plurality of pulse signals which are candidates from said groups of pulse signals in correspondence with a first portion of said input data, and for providing said selected pulse signals to a latch in said plurality of latches which is provided with input pulse signals corresponding to a group to which said pulse signal belongs, and second selecting means for alternatively selecting an output of a latch circuit in correspondence with a second portion of said input data; and said output means is for outputting said predetermined output signal when an output of said second selecting means is asserted.

10. A digitally controlled oscillator comprising:

a pulse circulation circuit, including a plurality of inverters connected in a ring configuration, for generating a plurality of pulse signals having a predetermined phase differential therebetween;

counting means for counting pulse signals output from a predetermined inverter in said plurality of inverters and for determining when a count thereof is equal to an externally-applied value;

pulse detecting means for receiving data representative of a sequence of phases on a given one of said plurality of pulse signals and, after said counting means determines that said count has reached said externally-applied value, detecting that a particular pulse signal corresponding to input data has been output from said pulse circulation circuit;

output means for outputting a predetermined signal when said pulse detecting means detects that said pulse signal corresponding to said input data has been output;

updating means for outputting digital data as new input data of said pulse detecting means when a detecting operation of said pulse detecting means has been terminated once, said digital data representative of an addition of said data representative of said sequence of phases and current input data of said pulse detecting means;

modifying means for incrementing said value used by said counting means when a value of digital data output by said updating means exceeds a number of pulse signals output from said pulse circulation circuit;

wherein said plurality of pulse signals output by said pulse circulation circuit are divided into a predetermined plurality of groups ordered starting with signals having earlier phases with said particular pulse signal being used as a reference;

said pulse detecting means includes detection signal outputting means for outputting a plurality of detection signals respectively corresponding to said plurality of groups of pulse signals being asserted in an interval until all pulse signals of corresponding groups are continuously output from said pulse circulation circuit, and a plurality of latches, corresponding to respective ones of said plurality of pulse signals output from said pulse circulation circuit, for generating an output signal when a pulse signal is input while a corresponding pulse is asserted; and said output means is for outputting said predetermined output signal when an output of said plurality of latches is asserted.

* * * * *